(12) United States Patent
Kawagoe et al.

(10) Patent No.: US 6,895,537 B2
(45) Date of Patent: May 17, 2005

(54) SEMICONDUCTOR INTEGRATED CIRCUIT DEVICE INCLUDING SEMICONDUCTOR MEMORY WITH TESTER CIRCUIT CAPABLE OF ANALYZING REDUNDANCY REPAIR

(75) Inventors: Tomoya Kawagoe, Hyogo (JP); Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 619 days.

(21) Appl. No.: 09/793,612

(22) Filed: Feb. 27, 2001

(65) Prior Publication Data

US 2001/0056557 A1 Dec. 27, 2001

(30) Foreign Application Priority Data

Jun. 14, 2000 (JP) ........................................ 2000-178502

(51) Int. Cl.[7] ............................................. G11C 29/00
(52) U.S. Cl. ..................... 714/710; 714/723; 714/733; 714/734; 714/738; 365/200; 365/201
(58) Field of Search .............................. 365/200, 141.7, 365/196, 49, 230.03, 220, 219, 168, 189, 201, 207, 208, 189.07; 714/710, 7, 718–723, 711, 733, 734, 738

(56) References Cited

U.S. PATENT DOCUMENTS

| | | | | |
|---|---|---|---|---|
| 4,942,556 A | * | 7/1990 | Sasaki et al. | ................ 365/200 |
| 6,275,426 B1 | * | 8/2001 | Srinivasan et al. | ......... 365/200 |
| 6,625,072 B2 | * | 9/2003 | Ohtani et al. | ................ 365/200 |

FOREIGN PATENT DOCUMENTS

| | | |
|---|---|---|
| JP | 5-205497 | 8/1993 |
| JP | 8-63996 | 3/1996 |

OTHER PUBLICATIONS

Nordholz, P et al. 'A defect–tolerant word–oriented static RAM with built–in self–test and self–reconfiguration,' IEEE International Conference on Proceedings, Innovative Systems in Silicon, Oct. 9–11, 1996, On pp.: 124–132.*
"An Algorithm for Row–Column Self–Repair of RAMs and Its Implementation in the Alpha 21264," by Bhavsar, ITC International Test Conference (1999), pp. 311–318.
"Built–In Self–Test for GHz Embbedded SRAMs Using FLEXIBLE Pattern Generator and New Repair Algorithm," by Nakahara et al., ITC International Test Conference (1999), pp. 301–310.

* cited by examiner

*Primary Examiner*—Guy J. Lamarre
(74) *Attorney, Agent, or Firm*—McDermott Will & Emery LLP

(57) ABSTRACT

Following data writing into a memory cell array according to an internal address signal, the data read out from each memory cell is compared with expected value data in a readout operation. An associated memory cell array and a test block are provided corresponding to each sub memory cell array. Each test block includes a replacement determination unit for respective combinations of a sequence to replace a memory cell row and a memory cell column in order. Each replacement determination unit writes a defective address only when a defective memory cell having an address differing from the row and column addresses of a defective memory cell already stored is found.

10 Claims, 36 Drawing Sheets

SEMICONDUCTOR INTEGRATED CIRCUIT DEVICE INCLUDING SEMICONDUCTOR MEMORY WITH TESTER CIRCUIT CAPABLE OF ANALYZING REDUNDANCY REPAIR

BACKGROUND OF THE INVENTION

1. Field of the Invention

The present invention relates to semiconductor integrated circuit devices, particularly to a structure of a semiconductor integrated circuit device incorporating a tester circuit to test a semiconductor memory device.

2. Description of the Background Art

Most semiconductor memory devices have a spare memory cell. When there is a defective memory cell in the memory cells, that defective portion can be replaced with the spare memory cell to repair a defective chip.

FIG. 39 is a schematic block diagram showing a structure of a redundant circuit provided for a memory array unit 8010 of such a semiconductor memory device.

One memory cell in memory array unit 8010 is selected by externally applied row address signals RA0–13 and column address signals CA0–8. In a write operation, the data applied to a data input/output terminal DQ (not shown) is written into the selected memory cell. In a readout operation, the data read out from memory array unit 8010 is provided to data input/output terminal DQ.

A row decoder 8020 responds to the input row address to select memory cells of one row for a read or write operation. A column decoder 8030 selects one column according to the input column address and further selects one memory cell out of the one row of memory cells selected according to the row address.

Detection of a defective memory cell and analysis to replace that defective memory cell by a redundant memory cell array is generally carried out by an external memory tester of a semiconductor memory device 8000.

In these few years, a semiconductor memory device including the so-called built-in test device that has a signal generator provided in a semiconductor device with a semiconductor memory device to carry out testing without a memory tester, or a semiconductor device incorporating a semiconductor memory device with such a built-in test device are produced.

In such a semiconductor memory device or semiconductor device incorporating such a built-in test device, it is difficult to carry out testing realizing a redundancy analysis function itself even if the testing of whether there is a defective memory cell or not in the memory cell can be carried out. The failure memory to store the address of the defective memory cell requires a capacity equal to that of the semiconductor memory device to be tested or the semiconductor memory device incorporated in the semiconductor device. In practice, it is difficult to incorporate a failure memory of such a capacity in a semiconductor memory device or a semiconductor device. Therefore, redundancy analysis could not be carried out.

A trend is towards increased data bit width for the data input/output of a semiconductor memory device from the standpoint of speeding the system. Accordingly, the memory cell array is divided into sub memory cell arrays, wherein a plurality of memory cells are selected simultaneously for each sub memory cell array. Therefore, the aforementioned redundancy analysis becomes more complicated.

SUMMARY OF THE INVENTION

An object of the present invention is to provide a semiconductor memory device with a built-in tester circuit that can detect a defective memory cell when a plurality of memory cells are selected simultaneously for each sub memory cell array and that can replace this defective memory cell with a redundant memory cell, or a semiconductor integrated circuit device incorporating a semiconductor memory device with such a built-in tester circuit.

According to an aspect of the present invention, a semiconductor integrated circuit device includes a memory cell array, a memory cell select circuit, a data transmission circuit, and a plurality of tester circuits.

The memory cell array includes a plurality of memory cells arranged in a matrix, each for retaining stored data. The memory cell array is divided into a plurality of sub memory cell arrays.

Each sub memory cell array includes a normal memory cell array including a plurality of normal memory cells, and a spare memory cell array including a plurality of spare memory cells.

The memory cell select circuit selects a plurality of memory cells at one time for each sub memory cell array according to an address signal. The data transmission circuit transfers the stored data to/from a selected memory cell.

The plurality of tester circuits are provided for each sub memory cell array to detect a defective memory cell in the normal memory cell to determine which spare memory cell is to be used for replacement.

Each tester circuit includes a defective address detection circuit, an address storage circuit, and a determination circuit.

The defective address detection circuit controls the memory cell select circuit so as to write test data while sequentially selecting a memory cell in a test write operation, and detects a defective address corresponding to the defective memory cell according to a comparison result between the data read out from a memory cell and expected value data. The address storage circuit stores a defective address. The determination circuit determines which of the spare memory cell is to be used for replacement according to the defective address retained in the address storage circuit.

The address storage circuit selectively stores a defective address differing from a defective address already stored out of the sequentially detected defective addresses under control of the determination circuit.

Thus, a main advantage of the present invention is that a tester circuit capable of detection of a defective memory cell and redundancy analysis when a plurality of memory cells are selected simultaneously for every sub memory cell array can be incorporated in the semiconductor integrated circuit device itself with a relatively small circuit complexity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

[Structure of Reading Out 1-Bit Data Per Memory Cell Array]

Figure 1:
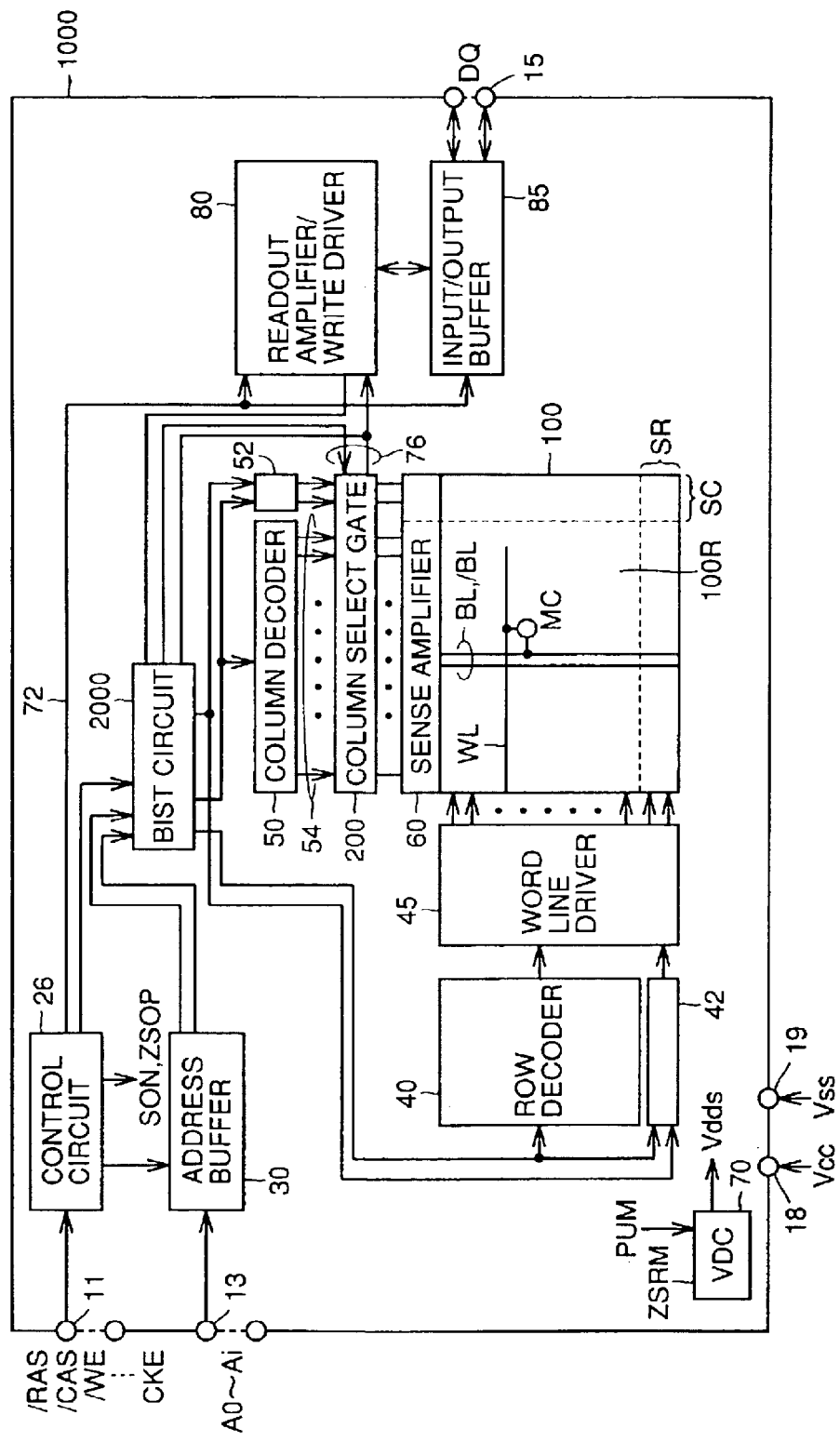
FIG. 1 is a block diagram schematically showing an entire structure of a dynamic type semiconductor memory device 1000 according to a first embodiment of the present invention.

FIG. 1 is a schematic block diagram showing an entire structure of a dynamic semiconductor memory device (referred to as DRAM hereinafter) 1000 having data of 1 bit read out per sub memory array.

As will become apparent from the following, the built-in tester circuit of the present invention is not limited to application to a DRAM 1000 shown in FIG. 1, and can be generally applied to the testing of a semiconductor memory device that is incorporated together with a logic circuit and the like in a semiconductor integrated circuit device.

Referring to FIG. 1, DRAM 1000 includes a control signal input terminal group 11 receiving control signals such as a row address strobe signal /RAS, a column address strobe signal /CAS, a write enable signal /WE, a chip enable signal /CE and a clock enable signal CKE, an address input terminal group 13 receiving address signals A0–Ai (i: natural number), a data input/output terminal group 15 to input/output data, a Vcc terminal 18 receiving an external power supply potential Vcc, and a Vss terminal 19 receiving a ground potential Vss.

A signal CKE applied to control signal input terminal group 11 is a signal to designate that input of a control signal to the chip is allowed.

DRAM 1000 further includes a control circuit 26 generating an internal control signal that controls the operation of the entire DRAM 1000 according to a control signal, an internal control signal bus 72 through which the internal control signal is transmitted, an address buffer 30 receiving an external address signal from address input terminal group 13 to generate an internal address signal, and a memory cell array 100 with a plurality of memory cells MC arranged in a matrix.

FIG. 1 shows the case where one memory cell 100 is provided. However, a plurality of memory cell arrays 100 may be provided. In this case, a structure is implemented where data of 1 bit is read out per one memory cell array.

An internal address signal implies internal row address signals RA0–13 and /RA0–13 complementary to each other and generated from external row address signals RA0–13, and internal column address signals CA0–8 and /CA0–8 complementary to each other and generated from external column signals CA0–8.

Memory cell MC is constituted by a capacitor to retain data, and an access transistor GM having a gate connected to a word line WL corresponding to each row.

In memory cell array 100, a word line WL is provided corresponding to each row of memory cells, and bit lines BL, /BL are provided corresponding to each column of memory cells.

Figure 39:
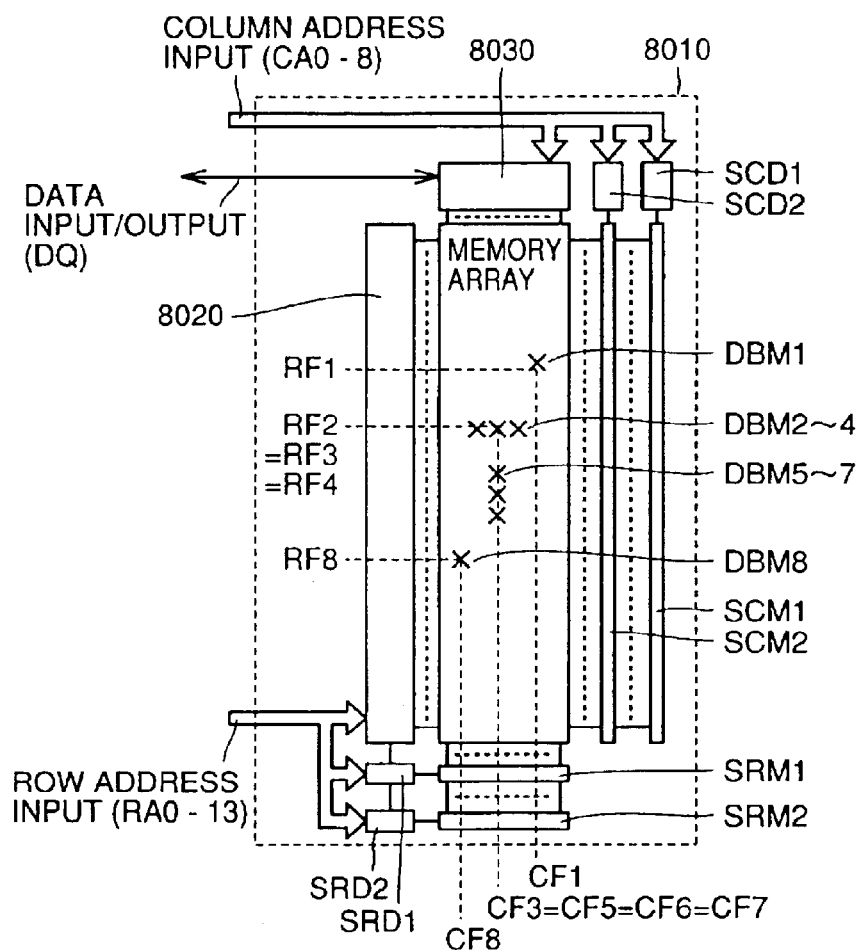
FIG. 39 is a schematic block diagram showing a structure of a redundant circuit provided corresponding to memory array unit 8010.

Memory cell array 100 of FIG. 1 includes a normal memory cell array 100, a spare row SR and a spare column SC, similar to memory cell array unit 8010 of FIG. 39.

In memory cell array 100, two spare rows SR1 and SR2 are provided as spare row SR, and two spare columns SC1 and SC2 are provided as spare column SC.

DRAM 1000 further includes a built-in self tester circuit (referred to as BIST circuit hereinafter) 2000 that detects a defective memory cell in DRAM 1000 and carries out a testing operation to effect replacement with a spare row SR or a spare column SC.

BIST circuit 2000 is under control of a control circuit 26 to provide internal row and column address signals from address buffer 30 directly to row decoder 40, spare row decoder 42, column decoder 50 and spare column decoder 52 in a normal operation mode. BIST circuit 2000 receives through data input/output terminal group 15 write data that is buffered by an input/output buffer 85 and provided from write driver circuit 80. The write data is directly output to column select gate 200 in a normal operation.

In the test mode, BIST circuit 2000 provides to row decoder 40, spare row decoder 42, column decoder 50 and spare column decoder 52 an internal address signal, generated within BIST 2000, not directly from address buffer 30. Test data is written into memory cell array 100 by applying to a column select gate 200 test write data TD generated within BIST circuit 2000, not the data applied from write driver 80.

When the write operation is completed in the test mode, BIST circuit 2000 generates an internal address signal again to read out the sequentially written data. BIST circuit 2000 sequentially detects the position of a defective memory cell in normal memory cell array 100 according to the comparison result between the read out data and expected value data ED. Then, determination is made of which combination of a spare row SR and a spare column SC the plurality of defective row addresses and defective column addresses corresponding to the plurality of defective memory cells are to be replaced with.

Upon completion of a read operation in the test mode, spare row decoder 42 and spare column decoder 52 store in a non-volatile manner respective defective row and column addresses that are to be replaced according to the determination of BIST circuit 2000. Therefore, a structure including an non-volatile storage element that can electrically write and read a replacement address designated from BIST circuit 2000 can be provided for spare row decoder 42 and spare column decoder 52. Alternatively, a structure in which the address corresponding to the memory cell to be replaced can be output to an external source at the end of the test operation. In this case, an external tester may provided an instruction to a repair device according to the output replacement address, whereby the repair device trims the fuse element of spare row decoder 42 and spare column decoder 52, as in the conventional case.

Following the above-described redundancy analysis by BIST circuit 2000, the normal read out and writing operations are to be carried out.

In the normal read and write operations, word line driver 45 selectively renders a corresponding word line WL active according to the output of row decoder 40 that decodes an internal row address signal from address buffer 30. Here, spare row decoder 42 activates word line WL of spare row SR and applies an instruction to row decoder 40 to inhibit a row select operation when the defective row address stored in a non-volatile manner matches the internal row address from address buffer 30.

According to the output of column decoder 50 that decodes an internal column address signal from address buffer 30, column decoder 50 renders a column select signal active. Spare column decoder 52 activates the column select signal corresponding to spare column SC and applies an instruction to column decoder 50 to inhibit a select operation when the internal column address signal from address buffer 30 matches the stored defective column address stored in a non-volatile manner.

The column select signal is applied to column select gate 200 through a column select line 54. Column select gate 200 selectively connects a sense amplifier 60 that amplifies the data of bit line pair BL, /BL according to the column select signal with an I/O line 76.

I/O line 76 transmits the stored data to/from data input/output terminal 15 via a read out amplifier/write driver 80 and an input/output buffer 85. Accordingly, the stored data is transferred between data input/output terminal 15 and memory cell MC in a normal operation mode.

Control circuit 26 generates an internal control signal to control the internal operation of DRAM 1000 such as signals SON and ZSOP to render sense amplifier 60 active when control of the initiation/termination of the test operation of BIST circuit 2000 is carried out or when a read out operation is specified by a combination of external control signals.

DRAM 1000 further includes an internal potential generation circuit 70 receiving external power supply potential Vcc and ground potential Vss to generate an internal power supply potential Vdds corresponding to the potential of an H level (logical high) of the bit line pair. The generated potential is supplied to sense amplifier 60.

Figure 2:
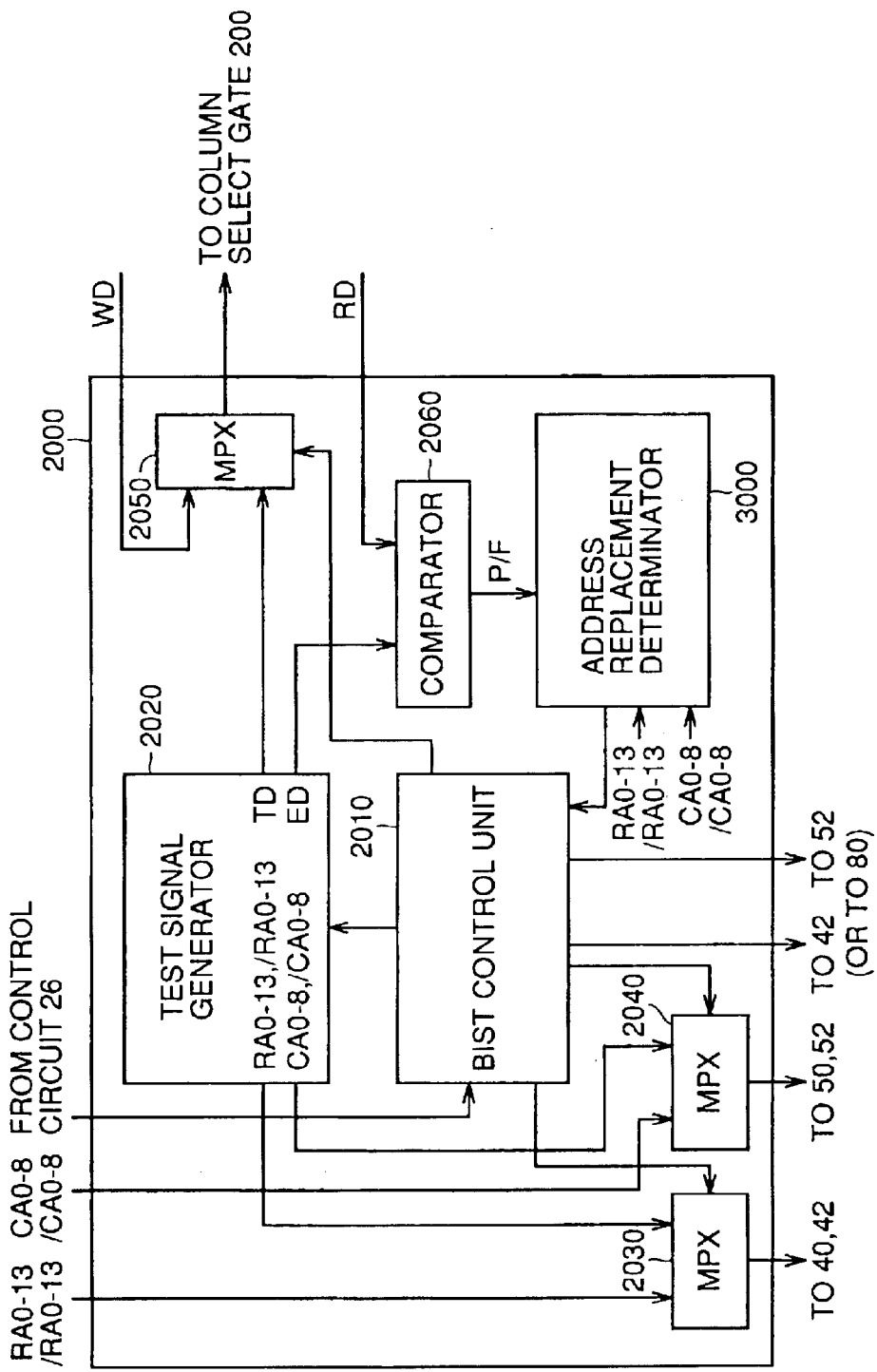
FIG. 2 is a schematic block diagram to describe a structure of a BIST circuit 2000 of FIG. 1.

Referring to FIG. 2, BIST circuit 2000 includes a BIST control unit 2010 to control a built-in test operation according to the control from control circuit 26, a test signal generator 2020 generating internal row address signals RA0–13, /RA0–13, internal column address signals CA0–8, /CA0–8, test write data TD and expected value data ED during a built-in test operation under control of BIST control unit 2010, a multiplexer 2030 under control of BIST control unit 2010, receiving internal row address signals RA0–13, /RA0–13 from address buffer 30 and the internal row address signal from test signal generator 20 to selectively apply one of the internal row address signals to row decoder 40 and spare row decoder 42 according to the operation mode, a multiplexer 2040 under control of BIST control unit 2010, receiving internal column address signals CA0–8, /CA0–8 from address buffer 30 and the internal column address signal from test signal generator 2020 to selectively provide one of the internal column address signals to column decoder 50 and spare column decoder 52 according to the operation mode, a multiplexer 2050 under control of BIST control unit 2010, receiving write data WD from write driver 80 and test write data TD from test signal generator 2020 to provide one of the write data to column select gate 200 according to the operation mode, a comparator 2060 comparing data RD read out from column select circuit 200 with expected value data ED from test signal generator 2020 to output a pass/fail signal P/F according to the match/ mismatch of the comparison result in a read out operation in the built-in test mode, and an address replacement determinator 3000 receiving an internal column address signal and an internal row address signal output from test signal generator 2020 during the built-in test mode, and responsive to activation of pass/fail signal P/F from comparator 2060 (when data ED does not match data RD) to store the defective address in normal memory cell array 100 and to determine the defective address of the defective memory cell to be replaced with spare row SR and spare column SC.

When spare row decoder 42 and spare column decoder 52 include non-volatile storage elements that can be electrically rewritten according to the comparison result of address replacement determinator 3000, BIST control unit 2010 programs in these non-volatile storage elements the defective address corresponding to the defective memory cell to be replaced. Also, BIST control unit 2010 reads out the defective address to be replaced according to the determination result of address replacement determinator 3000 and provides the read out defective address outside from input/output terminal group 15 via amplifier 80 and input/output buffer 85.

Prior to description of the structure of address replacement determinator 3000 of FIG. 2 with reference to FIG. 3, the procedure of replacing the defective address in memory cell array 100 of FIG. 1 with spare row SR and spare column SC is summarized in the following.

It is assumed that the same defective memory cells in memory cell array unit 8010 of FIG. 39 are encountered in memory cell array 100 of the present embodiment.

Referring to FIG. 39 again, eight defective memory cells DBM1–DBM8 are detected while sequentially altering the row address and also the column address. The presence of a defective memory cell is detected in the sequence of defective memory cells DBM1–DBM8.

In the case where a defective address replacement process corresponding to defective memory cells is to be carried out with two spare rows SR1 and SR2 and two spare columns SC1 and SC2, there is the instance of all the defective memory cells being repaired or not depending on which sequence the spare row and spare column replaces the normal memory cell row or normal memory cell column corresponding to the defective memory cell.

For example, in the case where defective memory cell DBM1 (row address RF1, column address CF1) is replaced with spare row memory cell SRM1, defective memory cells DBM2–DBM4 (row address:both RF2; column address: CF2, CF3, CF4, respectively) are replaced with the second spare row memory cell SRM2, defective memory cells DBM5–DBM7 (column address: both CF5; row address: RF3, RF4, RF5, respectively) are replaced with the first spare column memory cell SCM1, and defective memory cell DBM8 (row address: RF8; column address: CF8) is replaced with the second spare column memory cell SCM2, all the defective memory cells DBM1-DBM8 can be replaced with the two spare rows SR1 and SR2 and the two spare columns SC1 and SC2.

However, when replacement is carried out in the order of replacing defective memory cell DBM1 with first spare column memory cell SCM1, defective memory cell DBM2 with second spare column memory cell SCM2, and then the third defective memory cell DBM3 with the first spare row memory cell SRM1, and the fifth defective memory cell DBM5 with the second spare row memory cell SRM2, not all the defective memory cells can be repaired by replacement with the two spare rows and two spare columns.

Thus, in the process where a defective memory cell is sequentially detected and replaced with a spare row or spare column, repair is allowed or not allowed depending upon the sequence of the replacement process of the spare row and spare column, as well as the distribution of the defective memory cells in the normal memory array.

In the case of two spare rows and two spare columns, there are the following sixth types of combinations of the sequence in which the sequentially detected defective memory cell is replaced with a spare row and a spare column depending upon the order of the step that carries out replacement with a spare row or a spare column out of the four steps of respective replacements.

In the following, R represents the case where replacement is carried out with a spare row and C represents the case where replacement with a spare column is carried out.

Case 1: R→R→C→C
Case 2: R→C→R→C
Case 3: R→C→C→R
Case 4: C→R→R→C
Case 5: C→R→C→R
Case 6: C→C→R→R Such combinations can be determined if the step out of the four steps that is to be carried out for replacement with a spare row is defined. The total number of such combinations corresponds to the number of combinations of $_{(2+2)}C_2=4!/(2!\cdot 2!)=6$ when two are to be output from a total of 4 (2 spare rows+2 spare columns). Here, k! represents the factorial of a natural number k.

More generally, when there are m spare rows and n spare columns, the number of such combinations corresponds to $_{(m+n)}C_n=_{(m+n)}C_m=(m+n)!/(m!\times n!)$ types.

When all the defective memory cells can be eventually replaced and repaired by two spare rows and two spare columns, there is inevitably a replacement process sequence of a spare row and spare column out of the above sixth types of sequence that allows all the defective memory cells to be repaired.

Figure 3:
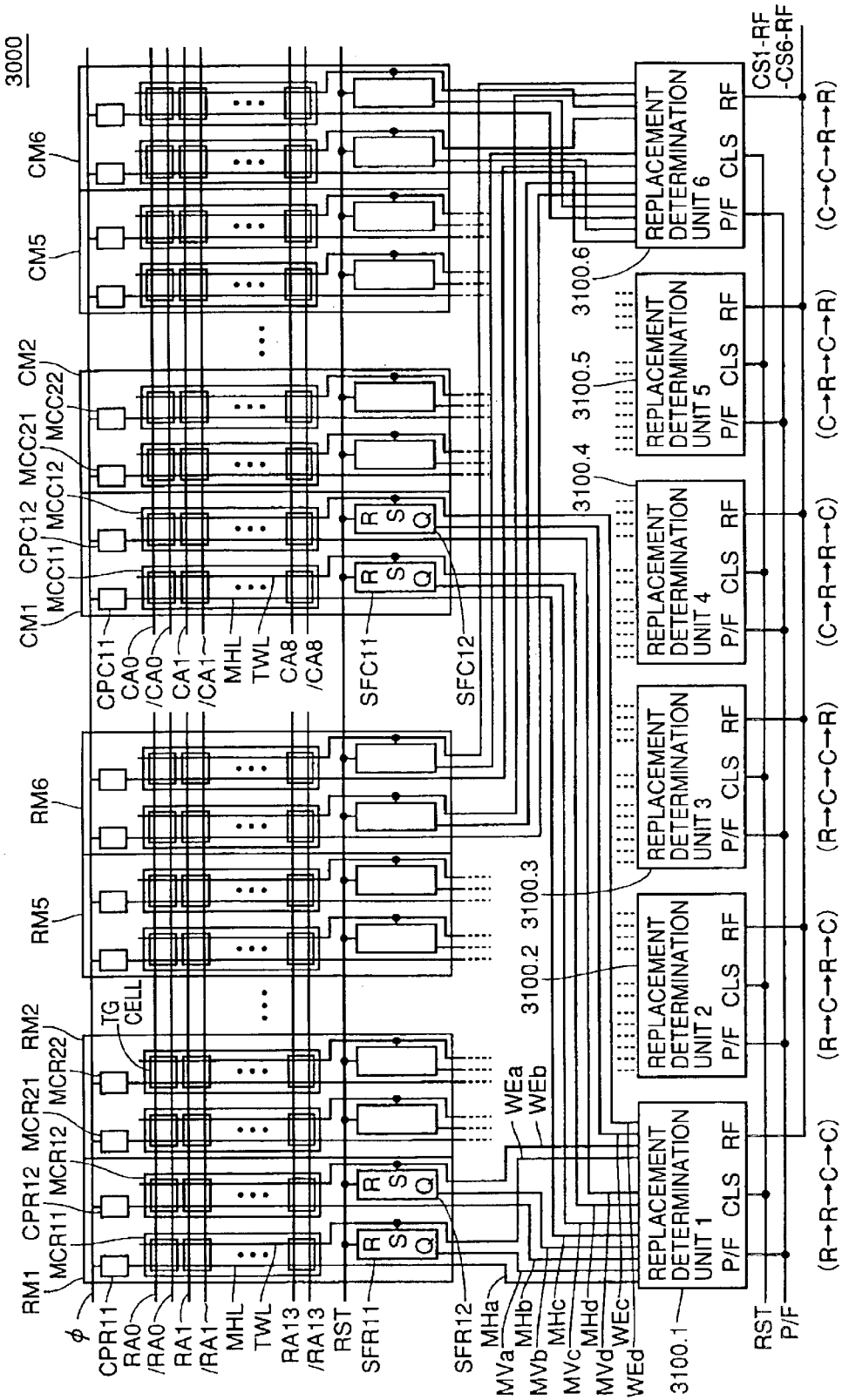
FIG. 3 is a schematic block diagram to describe a structure of an address replacement determinator 3000 of FIG. 2.

In address replacement determinator 3000 of FIG. 3, a structure of processing in parallel the sixth types is implemented to allow each of the above sixth types to be determined in parallel.

Referring to FIG. 3, address replacement determinator 3000 includes first to sixth replacement determination units 3100.1–3100.6 to determine whether repair is possible or not by replacement of the defective address when the defective address replacement process is carried out corresponding to each of the above cases 1–6.

Address replacement determination unit 3000 further includes row address storage units RM1–RM6 each storing the row address to be replaced with two spare row addresses, and column address storage units CM1–CM6 storing the column address to be replaced with two column addresses, corresponding to first replacement determination unit 3100.1 to sixth replacement determination unit 3100.6.

A row address storage unit RM1 and a column address storage unit CM1 are provided corresponding to first replacement determination unit 3100.1 that corresponds to the above case 1, i.e. the process of carrying out replacement with a spare row two times continuously, and then carrying out replacement with a spare column two times continuously.

Row address storage unit RM1 includes a storage cell train CMR11 to store the address of the row to be replaced with the first spare row SR1, and a storage cell train MCR12 to store the address of the row to be replaced with the second spare row SR2.

Column address storage unit CM1 includes a storage cell train MCC11 to store the address of the column to be replaced with the first spare column SC1, and a storage cell train MCC1 to store the address of the column to be replaced with the second spare column SC2.

Since first replacement determination unit 3100.1 corresponds to the above case 1, determination is made whether the current internal address signal is to be written into the storage cell train at every activation of pass/fail signal P/F in the sequence of storage cell train MCR11, storage cell train MCR12, storage cell train MCC11, and storage cell train MCC12 in corresponding row address storage unit RM1 and column address storage unit CM1.

Charge circuits CPR1, CPR12, CPC11, CPC12 are provided corresponding to memory cell columns MCR11, MCR12, MCC11, MCC12. Each of precharge circuits CPR11–CPC12 precharge to an H level a match determination line MHL provided corresponding to storage cell trains MCR11–MCC12 according to a signal $\phi$.

Memory cell columns MCR11 and MCR12 include a TG cell provided corresponding to the 14 sets of internal row address signals RA0, /RA0 to internal row address signals RA13, /RA13 to store the level of these signals.

Similarly, storage cell trains MCC11 and MCC12 include a TG cell provided corresponding to the sets of internal column address signals CA0, /CA0 to internal column address signals CA8, /CA8 to store the signal level of these signals.

The TG cell in row address storage unit RM1 and column address storage unit CM1 stores the level of a corresponding internal row address signal or internal column address signal in response to write activation line TWL attaining an active level (H level) according to designation from a corresponding first replacement determination unit 3100.1.

Match determination line MHL precharged to the H level maintains the H level when the level of the address signal already stored in the storage cell train matches the current level of internal address signals RA0, /RA0–RA13, /RA13 or internal column address signals CA0, /CA0–CA8, /CA8 applied to address replacement determinator 3000. When the levels of the address signals do not match, match determination line MHL is driven to an L level.

Also, flip-flop circuits SFR11, SFR12, SFC11, and SFC12 are provided corresponding to storage cell trains MCR11, MCR12, MCC11 and MCC12, respectively. Flip-flop circuits SFR11–SFC12 have their levels reset by a reset signal RST prior initiation of a test operation, and set in response to write select line TWL of the corresponding storage cell train attaining an active state (H level).

Second replacement determination unit 3100.2 are provided with a row address storage unit RM2 and a column address storage unit CM2 corresponding to the process of alternately carrying out replacement with a spare row and replacement with a spare column. Second replacement determination unit 3100.2 determines whether to write in the current internal address signal into the storage cell train at every activation of pass/fail signal P/F in the sequence of storage cell train MCR21, storage cell train MCC21, storage cell train MCR22 and storage cell train MCC22 in corresponding row address storage unit RM2 and column address storage unit CM2. The remaining structure is similar to that of first replacement determination unit 3100.1.

The same applies for the third to sixth replacement determination units 3100.3–3100.6, provided that the corresponding storage cell train and the sequence of writing into the storage cell train differ. The remaining structure is similar to that of replacement determination unit 3100.1, and description thereof will not be repeated.

According to the above structure, replacement determination unit 3100.1 operates as set forth in the following.

When pass/fail signal P/F is rendered active, first replacement determination unit 3100.1 renders write select line TWL of storage cell train MCR11 active. In response, the level of flip-flop circuit SFR11 corresponding to storage cell train MCR11 is set, and data is stored indicating that an address signal has been already written into this storage cell train MCR11.

When pass/fail signal P/F is rendered active again, respective TG cells carry out comparison between the internal row address signal stored in storage cell train MCR11 and the level of the current internal row address signal. The level of match detection line MHL of storage cell train MCR11 is driven according to the comparison result. When the internal row address stored in storage cell train MCR11 matches the internal row address corresponding to the newly detected defective memory cell, first replacement determination unit 3100.1 does not render storage cell train MCR12 active.

When the internal row address already stored in storage cell train MCR11 does not match the internal row address corresponding to the newly detected defective memory cell, first replacement determination unit 3100.1 renders active write select line TWL of storage cell train MCR12 that is to be the second activated storage cell train.

The internal row address corresponding to the newly detected defective memory cell is written into the second storage cell train MCR12, and the level of flip-flop circuit SFR12 corresponding to storage cell train MCR12 attains a set state.

In a similar manner, the internal row address or internal column address already stored in the storage cell train is compared with the internal row address or internal column address corresponding to the defective memory cell, every time a defective memory cell is newly detected. When the internal row addresses do not match, the corresponding storage cell train is rendered active according to the sequence of case 1 corresponding to first replacement determination unit 3100.1.

In contrast, when the internal row or column address already stored in the storage cell train matches the internal row or column address corresponding to the newly detected defective memory cell, first replacement determination unit 3100.1 does not render active the storage cell train corresponding to the next sequence.

Eventually, determination is made that all the defective memory cells can be replaced and repaired by replacing the defective memory cell with a spare row or a spare column in the sequence corresponding to first replacement determination unit 3100.1 when the internal row address and internal column address of all the defective memory cells that are sequentially detected match the internal row address or internal column address already stored in row address storage unit MR1 and column address storage unit CM1 during the check of the normal memory cell in the built-in test. The determination result is applied to address replacement determinator 3000 to BIST control unit 2010 as a repair fail signal RF.

A similar structure corresponding to first replacement determination unit 3100.1 and associated row and column address storage units RM1 and CM1 is provided corresponding to second replacement determination unit 3100.2 to sixth replacement determination unit 3100.6. Each replacement determination unit activates the storage cell train in the row address storage unit and the storage cell train in the column address storage unit along a corresponding sequence due to the correspondence of second replacement determination unit 3100.2—sixth replacement determination unit 3100.6 with cases 2–6, respectively.

If the defective memory cells in normal memory cell array 100R can be repaired by two spare rows and two spare columns as shown in FIG. 1, the repair fail signal RF from at least one of first replacement determination unit 3100.1 to sixth replacement determination unit 3100.6 maintains an inactive state (L level) even at the time when the last defective memory cell is detected.

Accordingly, BIST control unit 2010 reads out the internal row address signal and the internal column address signal stored in the row address storage unit and the column address storage unit corresponding to the replacement determination unit providing an inactive repair fail signal RF. According to the read out internal row address signal and internal column address signal, the row address and the column address to be repaired can be programmed with respect to spare row decoder 42 and spare column decoder 52.

Thus, there are 2×6=12 storage cell trains for row address units RM1–RM6. There are 2×6=12 storage cell trains for column address storage units CM1–RM6. Therefore, there is a total of 24 storage cell trains.

Figure 4:
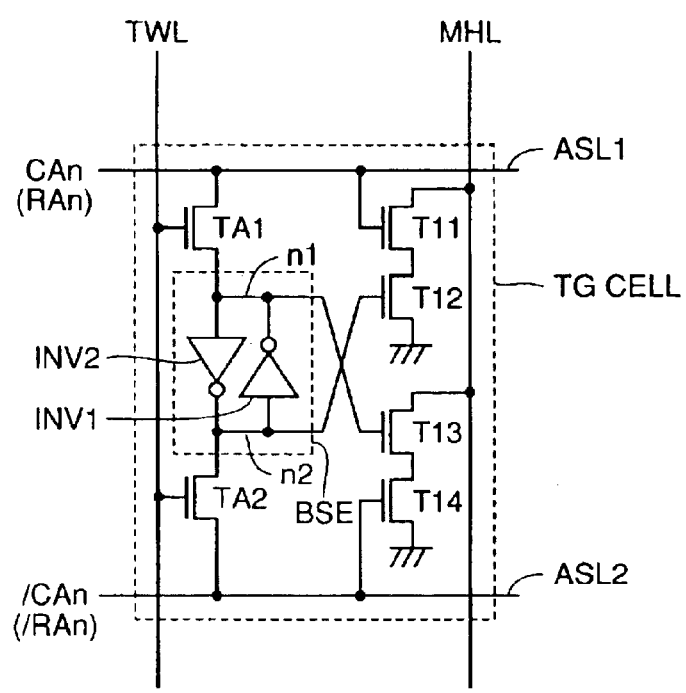
FIG. 4 is a circuit diagram showing a structure of a TG cell of FIG. 3.

FIG. 4 is a circuit diagram showing a structure of the TG cell of FIG. 3.

TG cell includes an address signal line ASL1 to transmit an internal column address signal CAn or an internal row address signal RAn (n: natural number; n=0–13 for RAn and n=0–8 for CAn), a storage element BSE formed of two inverters INV1 and INV2, an N channel type access transistor TA1 for connecting a storage node n1 of storage element BSE with address signal line ASL1 according to the level of signal line TWL, an address signal line ASL2 for transmitting an internal address signal /CAn or/RAn complementary to address signals CAn or RAn, an N channel type access transistor TA2 for connecting a storage node n2 of storage element BSE with address signal line ASL2 according to the level of signal line TWL, N channel transistors T11 and T12 connected in series between match detection line MHL and the ground potential, and transistors T13 and T14 connected in series between match detection line MHL and the ground potential.

Transistor T11 has its gate connected to address signal line ASL1. Transistor T12 has its gate connected to storage node n2 of storage element BSE.

Transistor T13 has its gate connected to storage node n1 of storage element BSE. Transistor T14 has its gate connected to address signal line ASL2.

More specifically, storage element BSE is connected to address signal lines ASL1 and ASL2 according to activation of write select line TWL. When the data stored in storage element BSE does not match the internal address signal on address signal lines ASL1 and ASL2, match detection line MHL is connected to the ground potential to be discharged via the path of transistors T11 and T12 or the path of transistors 13 and T14.

Figure 5:
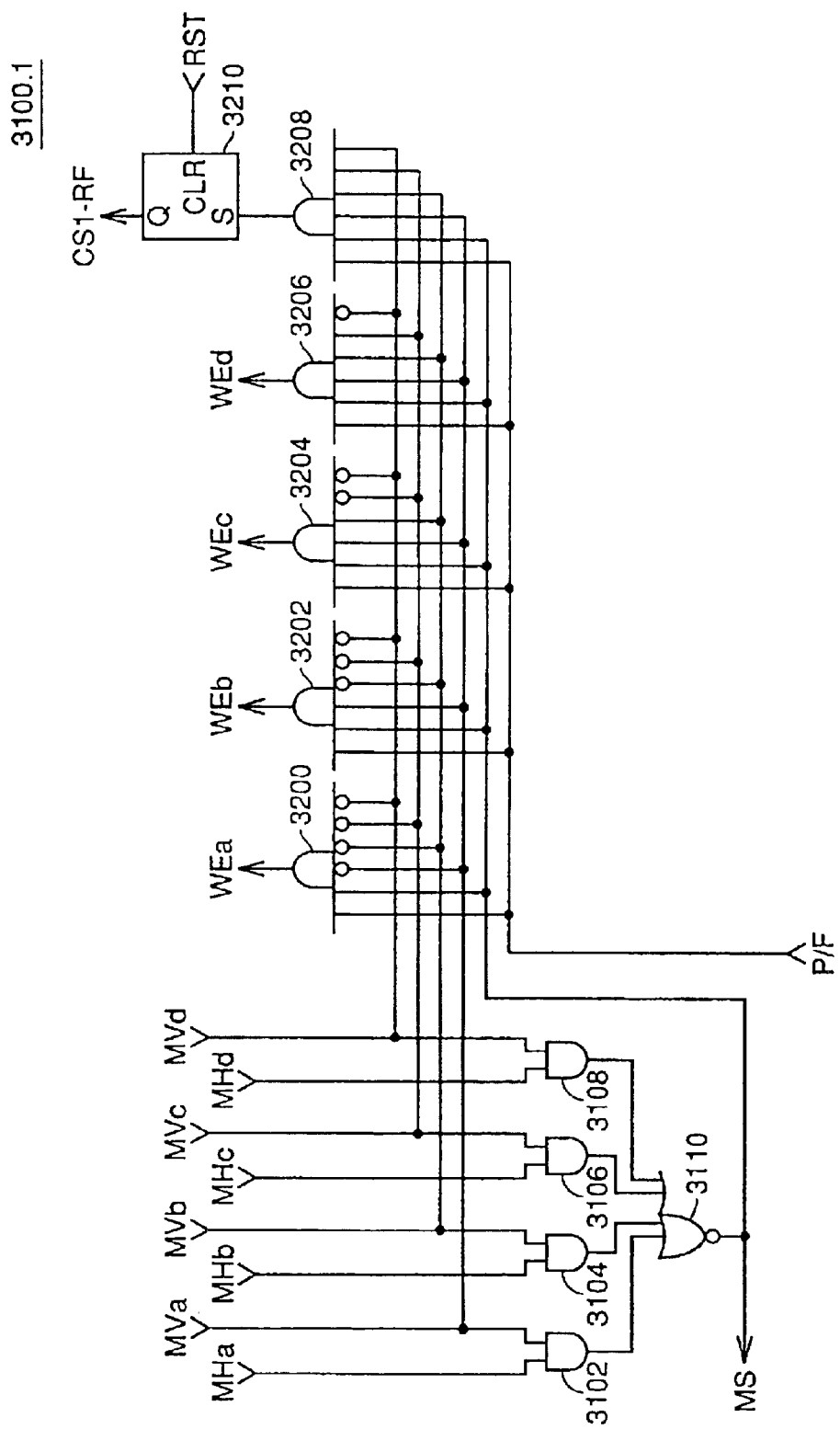
FIG. 5 is a schematic block diagram to describe a structure of a first redundancy determination unit 3100.1 of FIG. 3.

FIG. 5 is a schematic block diagram for describing a structure of first replacement determination unit 3100.1 of FIG. 3.

The structures of second replacement determination unit 3100.2 to sixth replacement determination unit 3100.6 are basically similar, provided that the connected storage cell train differs.

First replacement determination unit 3100.1 includes an AND circuit 3102 having the input node connected with match detection line MHL of storage cell train MCR11 and the output of flip-flop circuit SFR11, an AND circuit 3104 having the input node connected with match detection line MHL of storage cell train MCR12 and the output of flip-flop circuit SFR12, an AND circuit 3106 having the input node connected with match detection line MHL of storage cell train MCC11 and the output of flip-flop circuit SFC11, an AND circuit 3108 having the input node connected with match detection line MHL of storage cell train MCC12 and the output of flip-flop circuit SFC12, and a 4-input NOR circuit 3110 receiving the outputs of AND circuits 3102–3108 to output a signal MS.

As to the input nodes of AND circuits 3102–3108 of first replacement determination unit 3100.1, the input nodes connected with match detection line MHL are represented as nodes MHa, MHb, MHc, MHd, and the input nodes connected with the output of flip-flop circuits SFR11–SFC12 are represented as nodes MVa, MVb, MVc, MVd.

First replacement determination unit 3100.1 further includes a logic gate 3200 receiving an inverted signal of the level of node MVa, the inverted signal of the level of node MVb, the inverted signal of the level of node MVc, the inverted signal of the level of node MVd, signal MS, and pass/fail signal P/F to output the logical product of these signals as a write select signal WEa that is applied to write select line TWL of storage cell train MCR11, a logic gate 3202 receiving a signal of the level of node Mva, the inverted signal of the level of node MVb, the inverted signal of the level of node Mvc, the inverted signal of the level of node MVd, signal MS, and pass/fail signal P/F to output the logical product of these signals as a write select signal WEc that is applied to write select line TWL of storage cell train MCR12, a logic gate 3204 receiving the signal of the level of node MVa, the signal of the level of node MVb, the inverted signal of the level of node MVc, the inverted signal of the level of node MVd, signal MS, and pass/fail signal P/F to output the logical product of these signals as a write select signal WEc that is applied to write select line TWL of storage cell train MCC11, and a logic gate 3206 receiving the signal of the level of node MVa, a signal of the level of node MVb, a signal of the level of node MVc, an inverted signal of the level of node MVd, signal MS, and pass/fail signal P/F to output a logical product of these signals as a write select signal WEd that is applied to write select line TWL of storage cell train MCC12.

First replacement determination unit 3100.1 further includes a 6 input AND circuit 3208 receiving a signal of the level of node MVa, a signal of the level of node MVb, a signal of the level of node MVc, a signal of the level of node MVd, signal MS, and pass/fail signal P/F to output a logical product of these signals, and a flip-flop circuit 3210 reset according to reset signal RST and set according to the output of AND circuit 3208 to provide a repair fail signal CS1–RF for case 1.

The operation of address replacement determinator 3000 of FIG. 3 will be described in further detail.

Figure 6:
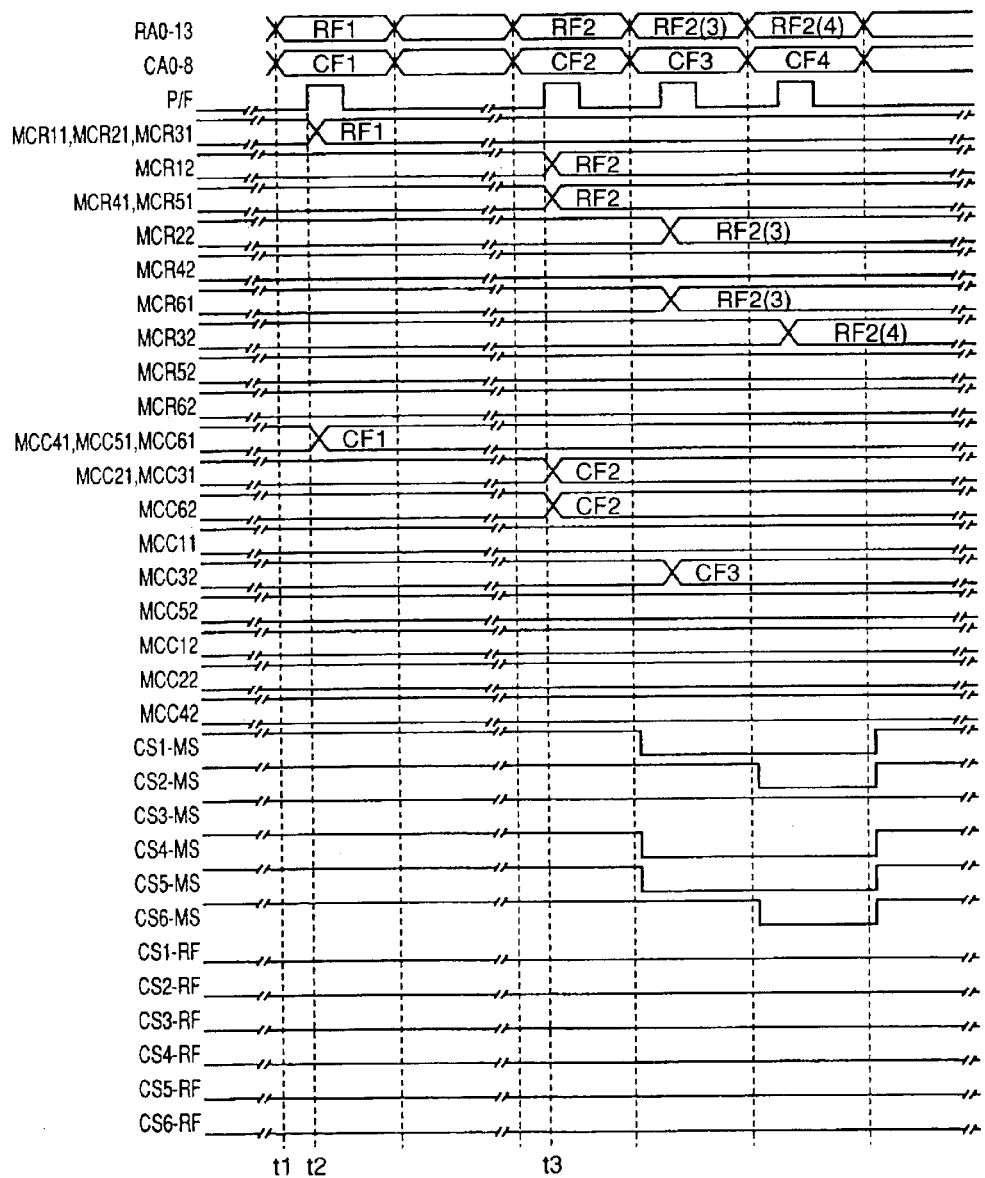
FIGS. 6 and 7 are first and second timing charts, respectively, to describe an operation of address replacement determinator 3000.
Figure 7:
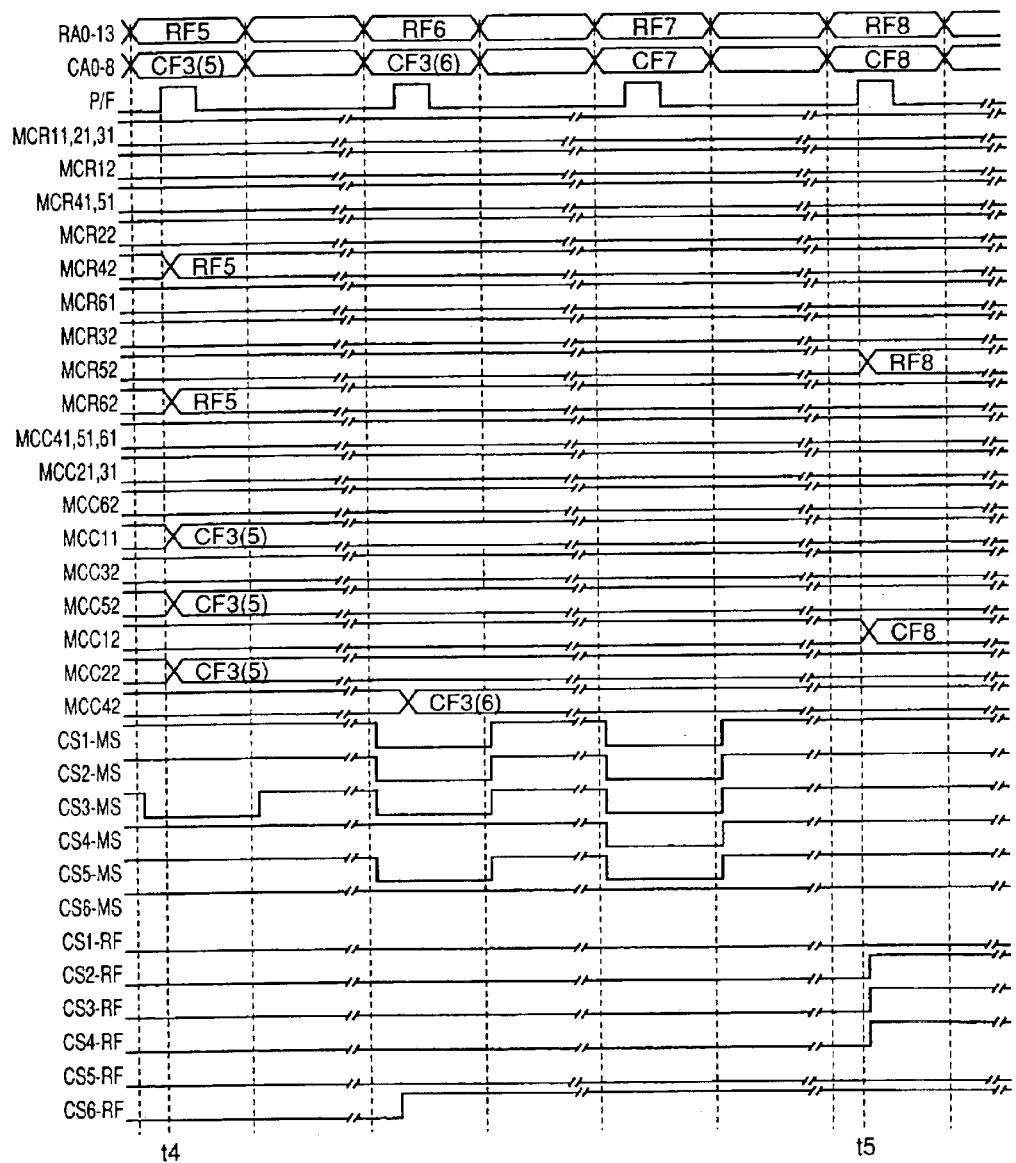

FIGS. 6 and 7 are timing charts for describing an operation of address replacement determinator 3000.

The following description corresponds to the case where a defective memory cell is defected in the sequence of defective memory cells DBM1-DBM8 shown in FIG. 39.

Although not shown in FIG. 6, reset signal RST is rendered active to effect a clear operation for all the flip-flops prior to testing. Also, match determination line MHL is precharged to the H level according to signal $\phi$ prior to each match determination operation.

The operation of first replacement determination unit 3100.1 and the operation of storage cell trains MCR11, MCR12, MCC11 and MCC12 connected thereto will be described here.

As mentioned before, first replacement determination unit 3100.1 corresponds to the process of replacing a detected defective memory cell according to the sequence of spare row→spare row→spare column→spare column.

Referring to FIG. 6, the MS node (corresponds to signal CS1–MS in FIG. 6) of first replacement determination unit 3100.1 is at an H level since nodes MVa, MVb, MVc and MVd all are at an L level, i.e. all the values of storage cell trains MCR11, MCR12, MCC11 and MCC12 are not yet written at time t1.

At time t2 when a defective memory cell DBM1 is detected and signal P/F is rendered active (H level), write select signal WEa for storage cell train MCR11 attains an H level, whereby row address RF1 of defective memory cell DBM1 is written into storage cell train MCR11.

At the next detection of defective memory cell DBM2, node MVa is at an H level according to the signal from flip-flop circuit SFR11 corresponding to storage cell train MCR11. However, node MHa does not attain an H level since the value stored in storage cell train MCR11 does not match the row address of defective memory cell DBM2. In response to the MS node of first replacement determination unit 3100.1 attaining an H level and signal P/F attaining an H level at time t3, write select signal WEb corresponding to storage cell train MCR12 is driven to an H level, whereby row address RF2 of defective memory cell DBM2 is written into storage cell train MCR12.

At the next detection of defective memory cell DBM3, the MS node of first replacement determination unit 3100.1 attains an L level since the row address already stored in storage cell train MCR12 matches the row address of defective memory cell DBM3. Therefore, writing into storage cell train MCC11 is not carried out since write select line WEc corresponding to storage cell train MCC11 remains at the L level.

Similarly in the detection of defective memory cell DBM4, the internal address will not be written into storage cell train MCC11 since the MS node is at an L level.

At time t4 where defective memory cell DBM5 is detected as represented in FIG. 7, none of the internal row address and internal column address already stored in the storage cell train match the internal address of defective memory cell DBM5. Therefore, the internal column address of defective memory cell DBM5 is written into storage cell train MCC11.

At respective detections of defective memory cells DBM6 and DBM7, the column address already stored in storage cell train MCC11 matches the column address of defective memory cells DBM6 and DBM7. Therefore, write select signal WEd towards storage cell train MCC12 is not rendered active, and the internal address is not written into storage cell train MCC12.

At time t5 when defective memory cell DBM8 is detected, the column address of defective memory cell DBM8 does not match the internal address already stored in memory cell columns MCR11, MCR12, MCC11. Therefore, column address CF8 of defective memory cell DBM8 is written into storage cell train MCC12.

Even when all the defective memory cells in the memory array have been detected (at the time of test completion), the output level of flip-flop circuit 3210 of first replacement determination unit 3100.1 is not set by the above operation.

The operations of second replacement determination unit 3100.2—sixth replacement determination unit 3100.6 are similar to that of first replacement determination unit 3100.1, provided that the connected storage cell train and the sequence of row or column determination differ from those of first replacement determination unit 3100.1.

Also, it is to be noted that the address written into each memory cell column and whether the output of flip-flop circuit 3210 is set or not at the time of detecting the eighth defective memory cell DMB8 differ according to each replacement determination unit.

When the test ends, BIST control unit 2010 reads out repair fail signal RF corresponding to the value of flip-flop circuit 3210 in first replacement determination unit 3100.1 to sixth replacement determination unit 3100.6. The value stored in the storage cell train connected to any of first to sixth replacement determination units 3100.1–3100.6 having a repair fail signal RF of an L level and that holds a valid value, i.e. the storage cell train corresponding to any of nodes MVa, MVb, MVc, and MVd having an H level, represents the address to be replaced. In the above example, a replacement process by a spare row and a spare column is to be carried out according to the address stored in the storage cell train corresponding to first replacement determination unit 3100.1 or the value stored in the storage cell train connected to fifth replacement determination unit 3100.5.

In the above-described structure of BIST circuit 2000, the circuit scale can be suppressed at a low level even if the memory capacity of the under-measurement semiconductor memory device is increased. Thus, there is the advantage that incorporation into a semiconductor memory device is facilitated.

The above description is provided corresponding to two spare rows and two spare columns. However, the number of spare rows and spare columns is not limited to 2. When the number of the spare rows and spare columns is increased, a replacement determination unit corresponding to the number of the increased combinations is to be provided. Also, a row address storage unit and a column address storage unit corresponding thereto are to be provided.

The first embodiment is described corresponding to a structure in which BIST circuit 2000 is provided in a semiconductor memory device. The present invention is not limited to this application. For example, in the case where a semiconductor memory device is integrated together with, for example, a logic circuit on one chip, a structure can be implemented in which BIST circuit 2000 is provided to test this semiconductor memory device.

[A Structure of Reading Out Data of a Plurality of Bits Per Memory Cell Array]

Figure 8:
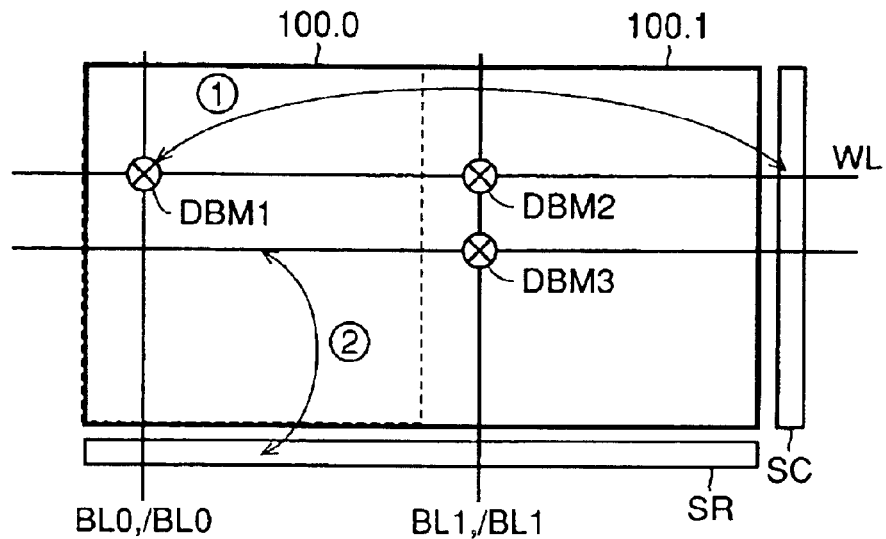
FIG. 8 is a diagram to describe the concept of a replacement operation by a redundant memory cell array when memory cell array 100 is divided into two sub memory arrays.

Problems Encountered in a Structure Where Data of a Plurality of Bits is Read Out Per Memory Cell Array FIG. 8 is a diagram to describe the concept of a replacement operation by a redundant memory cell array when a memory cell array 100 is divided into two sub memory cell arrays 100.0 and 100.1.

The example of FIG. 8 corresponds to the case where data are read out simultaneously from bit lines BL0, /BL0 of sub memory cell array 100.1 and bit lines BL1, /BL1 of sub memory cell array 100.1 upon activation of word line WL.

When replacement by a redundant memory cell array is to be carried out in the above-described structure, problems set forth in the following will be encountered.

When replacement by a redundant memory cell is carried out in the order of redundant memory cell column→redundant memory cell row, and memory cells DBM1 and DMB2 belonging to the same memory cell row are both defective memory cells, defective memory cell DBM1 thereof can be replaced by redundant memory cell column SC.

However, two memory cell columns cannot be replaced simultaneously according to the structure of semiconductor memory device 1000 described with reference to FIG. 1. In the case where a memory cell column including defective memory cell DBM1 is replaced by a redundant memory cell column SC, and then a defective memory cell DBM3 belonging to a memory cell row differing from that of defective memory cell DBM1 is detected, the memory cell row that includes defective memory cell DBM3 is replaced by redundant memory cell row SR.

However, this replacement process is disadvantageous in that defective memory cell DBM2 cannot be repaired. Furthermore, BIST circuit 2000 will erroneously determine that memory cells DBM1 and DBM2 have been both repaired although defective memory cell DBM2 is not actually repaired since defective memory cell DBM1 designated by the same row address and same column address has been repaired.

Figure 9:
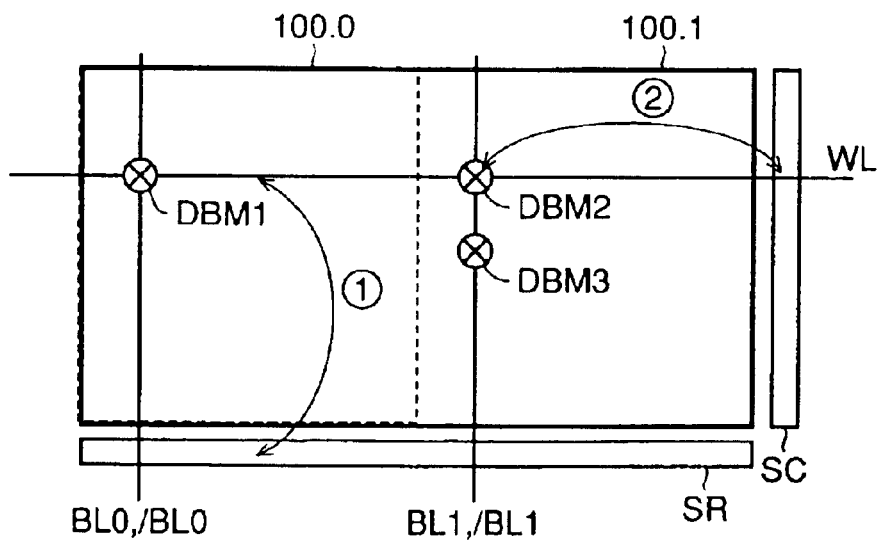
FIG. 9 is a diagram showing the concept of a process of replacement with a redundant memory cell row SR, followed by replacement with a redundant memory cell column SC.

FIG. 9 is a diagram showing a concept of the case where replacement by redundant memory cell column SC is carried out after replacement by redundant memory cell row SR.

In this case, defective memory cells DBM1 and DBM2 are repaired simultaneously by replacement with redundant memory cell row SR. Therefore, defective memory cells DBM1–DBM3 are all repaired by replacing the memory cell column where defective memory cell DBM3 belongs to with redundant memory cell column SC at the time point when defective memory cell DBM3 belonging to a memory cell row differing from that of defective memory cell DBM1 is detected.

Since BIST circuit 2000 determines that all memory cell columns have been repaired, signal CS1–RF in circuit 3100.1 shown in FIG. 5, for example, indicates a repairable status.

Thus, in the case where data is read out simultaneously from a plurality of memory cells (for example, two memory cells) according to activation of one word line WL when memory cell array 100 is divided into two sub memory cell arrays 100.0 and 100.1, there is a possibility that the determination of whether repair has been carried out by a redundant memory cell array or not cannot be made properly according to the structure of BIST circuit 2000 described with reference to FIGS. 1-5.

A Structure Where Data of 2 Bits is Read Out Per Sub Memory Cell Array

Figure 10:
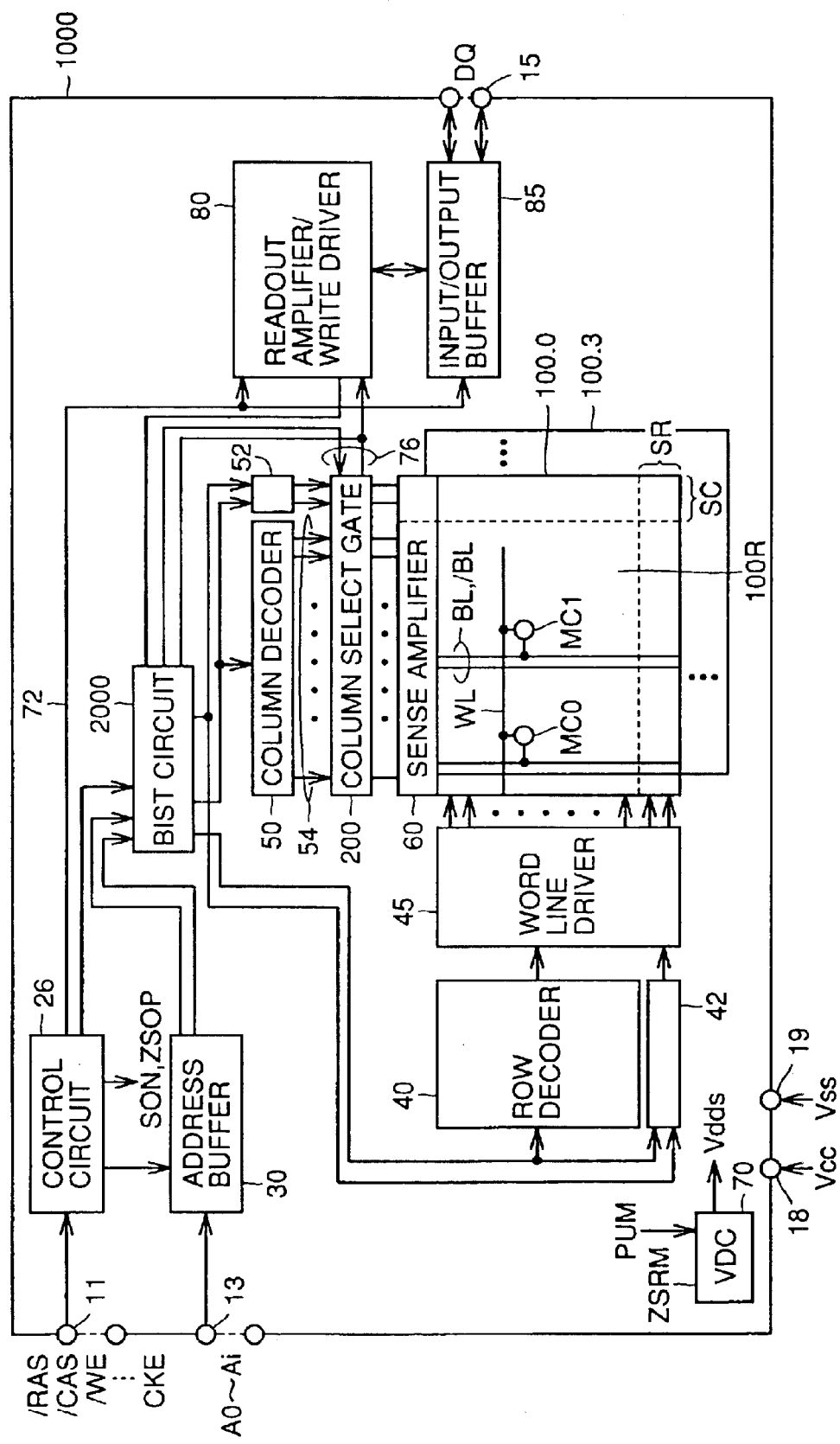
FIG. 10 is a schematic block diagram showing a structure of a semiconductor memory device 1000 when memory cell array 100 is divided into a plurality of sub memory cell arrays.

FIG. 10 is a schematic block diagram showing a structure of a semiconductor memory device 1000 when memory cell array 100 is divided into a plurality of sub memory cell arrays, as shown in FIG. 8.

Semiconductor memory device 1000 of FIG. 10 differs from semiconductor memory device 1000 of FIG. 1 in that memory cell array 100 is divided into, for example, four sub memory cell arrays 100.0–100.3 and data is read out from or written into two memory cells MC0 and MC1 in response to activation of one word line WL in each of sub memory cell arrays 100.0–100.3.

The remaining elements are similar to those of the structure of semiconductor memory device 1000 shown in FIG. 1. Corresponding components have the same reference characters allotted, and description thereof will not be repeated.

Figure 11:
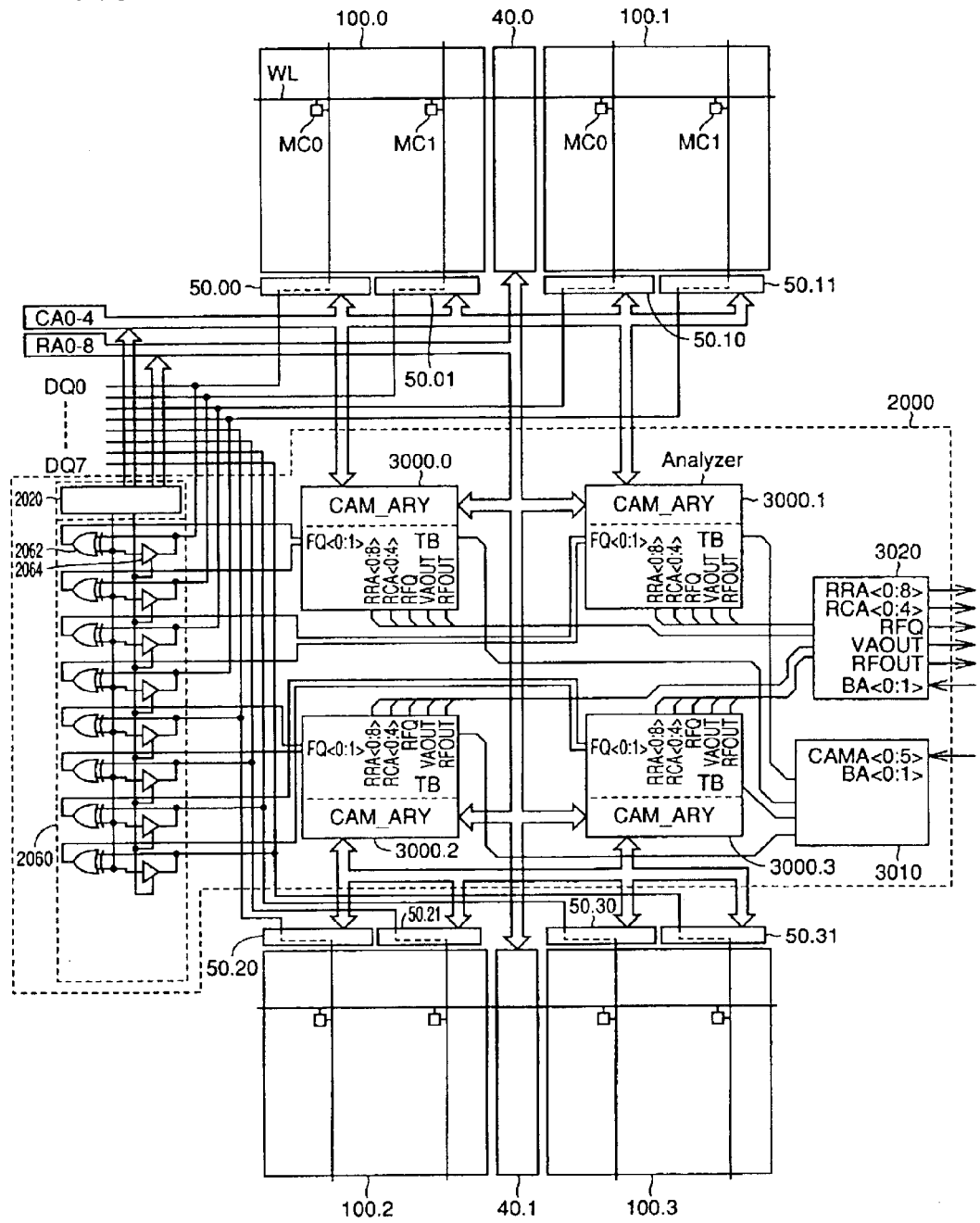
FIG. 11 is a schematic block diagram of an extraction of the memory cell array portion and BIST circuit 2000 portion.

FIG. 11 is a schematic block diagram showing an extraction of the memory cell array portion and BIST circuit 2000 portion from the structure of semiconductor memory device 1000 of FIG. 10.

Referring to FIG. 11, four sub arrays 100.0–100.3 are provided. Two memory cells MC0 and MC1 are selected simultaneously corresponding to row addresses RA0–8 and column address signals CA0–4 for each of sub arrays 100.0–100.3.

Correspondingly, data DQ0 and DQ1 are transferred with respect to sub array 100.0, data DQ2 and DQ3 are transferred with respect to sub array 100.1, data DQ4 and DQ5 are transferred with respect to sub array 100.2, and data DQ6 and DQ7 are transferred with respect to sub array 100.3.

In FIG. 11, row address signals RA0–RA8 and column address signals CA0–CA4 are output from a test signal generator 2020 during a test mode period.

In a test operation mode, data DQ0–DQ7 written into the memory cells may be applied from test signal generator 2020, as in the case shown in FIG. 2, or from an external source of semiconductor memory device 1000. In the case where semiconductor memory device 1000 is integrated on a chip identical to that of the logic circuit, the data to be written may be applied from the logic circuit. In the following, it is assumed that data DQ0–DQ7 written into the memory cells are applied from test signal generator 2020 in a test operation mode.

Comparator 2060 includes a set of an exclusive OR gate 2062 and a drive circuit 2064 corresponding to data DQ0–DQ7, respectively. For example, an exclusive OR gate 2062 receiving data DQ0 at one input node and the output from test signal generator 2020 at the other input node, and a drive circuit 2064 activated by a signal from test signal generator 2020 to apply the output from test signal generator 2020 to a corresponding sub memory cell array 100.1 are provided corresponding to data DQ0. The same applies for other data DQ1–DQ7.

Thereof, in writing data in a test mode, data is applied to each of sub memory cell arrays 100.1–100.3 via drive circuit 2064. In a readout operation of the test operation mode, the data read out from each memory cell array is compared with data output from test signal generator 2020 by an exclusive OR operation circuit 2062, and a comparison result thereof is output.

BIST circuit 2000 further includes address replacement determinators 3000.0–3000.3 corresponding to sub memory cell arrays 100.0–100.3, respectively.

Address replacement determinator 3000.0 includes an associated memory cell array CAM_ARY to store the row address and column address of the memory cell to be replaced, and a test block TB to control the write and read operations with respect to associated memory cell array CAM_ARY. The same applies to the other address replacement determinators 3000.1–3000.3.

BIST circuit 2000 further includes a decode circuit 3010 to decode and provide to address replacement determinators 3000.0–3000.3 the applied bank address BA<0:1> and associated memory cell address signal CAMA<0:5> in order to read out data from an associated memory cell array CAM_ARY out of address replacement determinators 3000.0–3000.3 specified by externally applied bank address BA<0:1> and associated memory cell array address CAMA<0:5> applied from outside BIST circuit 2000, and a read write driver circuit 3020 to output the data read out from each of address replacement determinators 3000.0–3000.3 outside BIST circuit 2000.

Read write driver circuit 3020 outputs defective row addresses RRA<0:8> and RCA<0:4>, data RFQ designating which of memory cell MC0 or MC1 the detected defective address corresponds to, a signal VAOUT indicating whether writing is carried out or not with respect to any of word lines WLS<0>–WLS<4> of associated memory cell array CAM_ARY, as will be described afterwards, and a signal RFOUT indicating whether replacement has succeeded or not, from the designated address replacement determinators 3000.0–3000.3.

Figure 12:
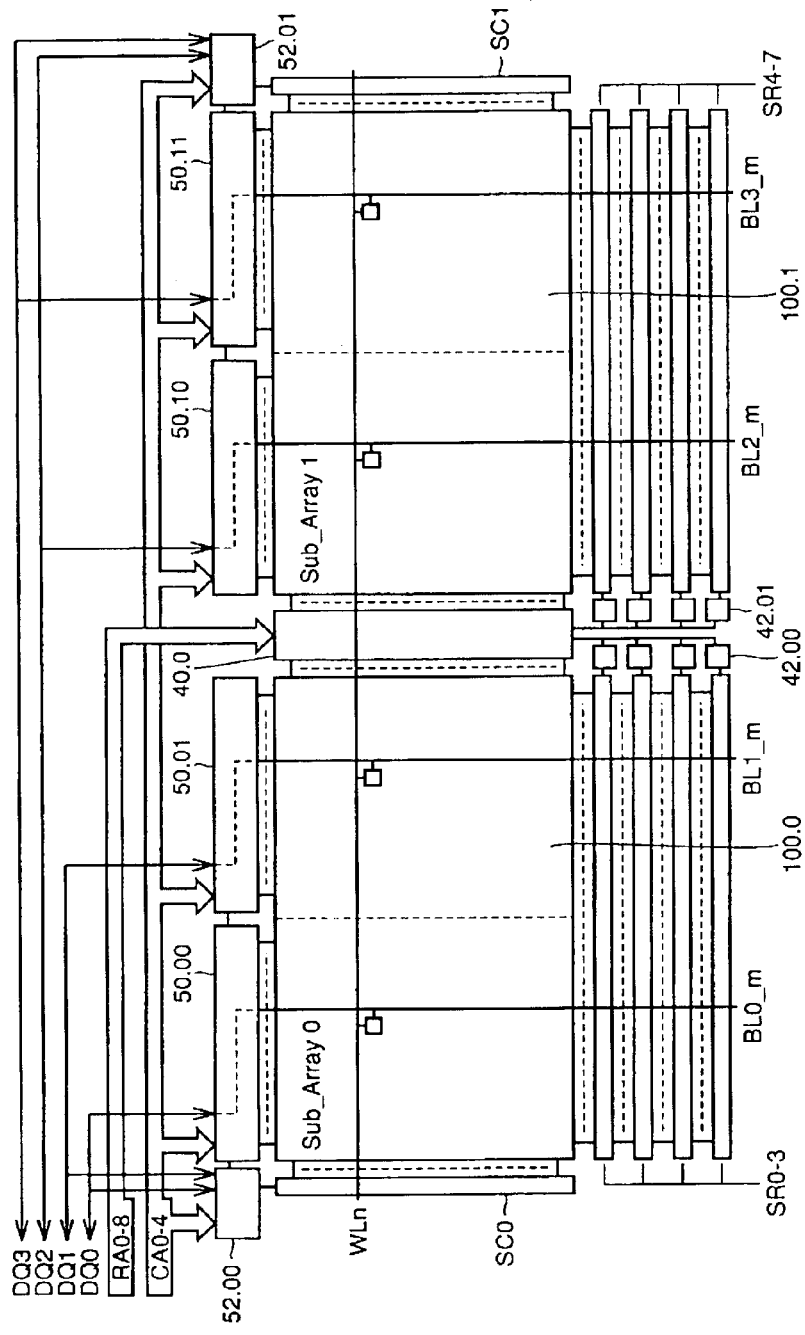
FIG. 12 is a schematic block diagram showing in enlargement the portion of sub memory cell arrays 100.0 and 100.1.

FIG. 12 is a schematic block diagram showing a further enlargement of the portion of sub memory cell arrays 100.0 and 100.1 from the structure of FIG. 11.

A spare column SC0 which is one redundant column and spare rows SR0–SR3 which are four redundant rows are provided corresponding to sub memory cell array 100.0.

Similarly, one spare column SC1 and four spare rows SR4–SR7 are provided with respect to sub memory cell array 100.1.

A spare column decoder 52.00 is provided corresponding to spare column SC0 whereas a spare column decoder 52.01 is provided corresponding to spare column SC1. Similarly, a spare row decoder 42.00 is provided corresponding to spare rows SR0–SR3 whereas a spare row decoder 42.01 is provided corresponding to spare rows SR4–SR7.

A row decoder 40.0 to render word line WLn active according to row address signals RA0–RA8 is provided with respect to sub memory cell arrays 100.0 and 100.1. With respect to sub memory array 100.0, a column decoder 50.00 to render active a bit line BL0_m to which memory cell MC0 is connected according to column address signals CA0–CA4, and a column decoder 50.01 to select a bit line BL1_m to which memory cell MC1 is connected are provided.

The same applies for sub memory cell array 101.

By such a structure, data DQ0 and DQ1 are transferred with respect to sub memory cell array 100.1 whereas data DQ2 and DQ3 are transferred with respect to sub memory cell array 100.1.

A similar structure is provided with respect to the remaining sub memory cell arrays 100.2 and 100.3.

Differing from the structure described with reference to FIG. 1, a structure where one redundant column and four redundant rows are provided per one sub memory array is implemented.

Figure 13:
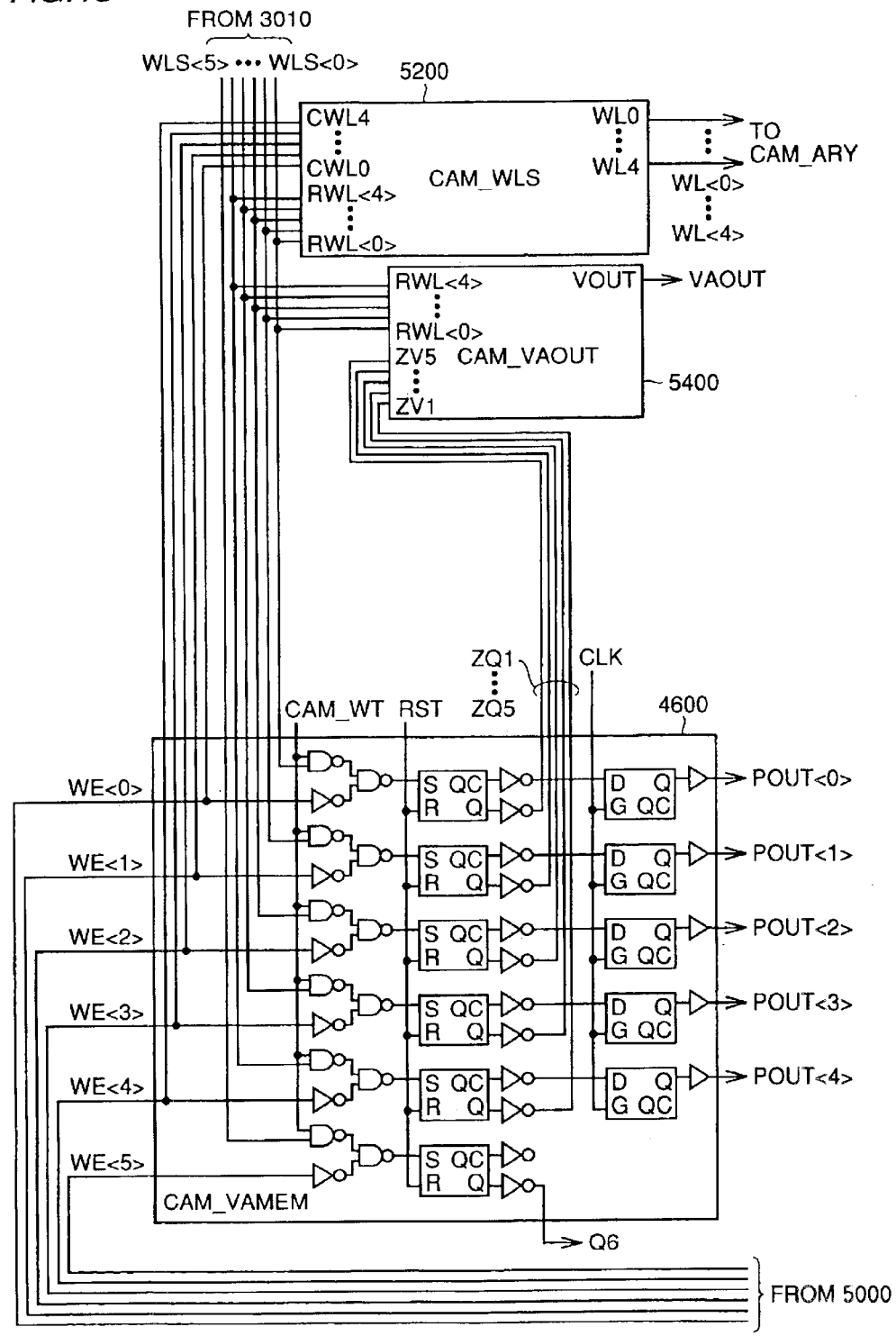
FIGS. 13 and 14 are first and second schematic block diagrams, respectively, of an extraction of a part of the structure of an address determinator 3000.0.
Figure 14:
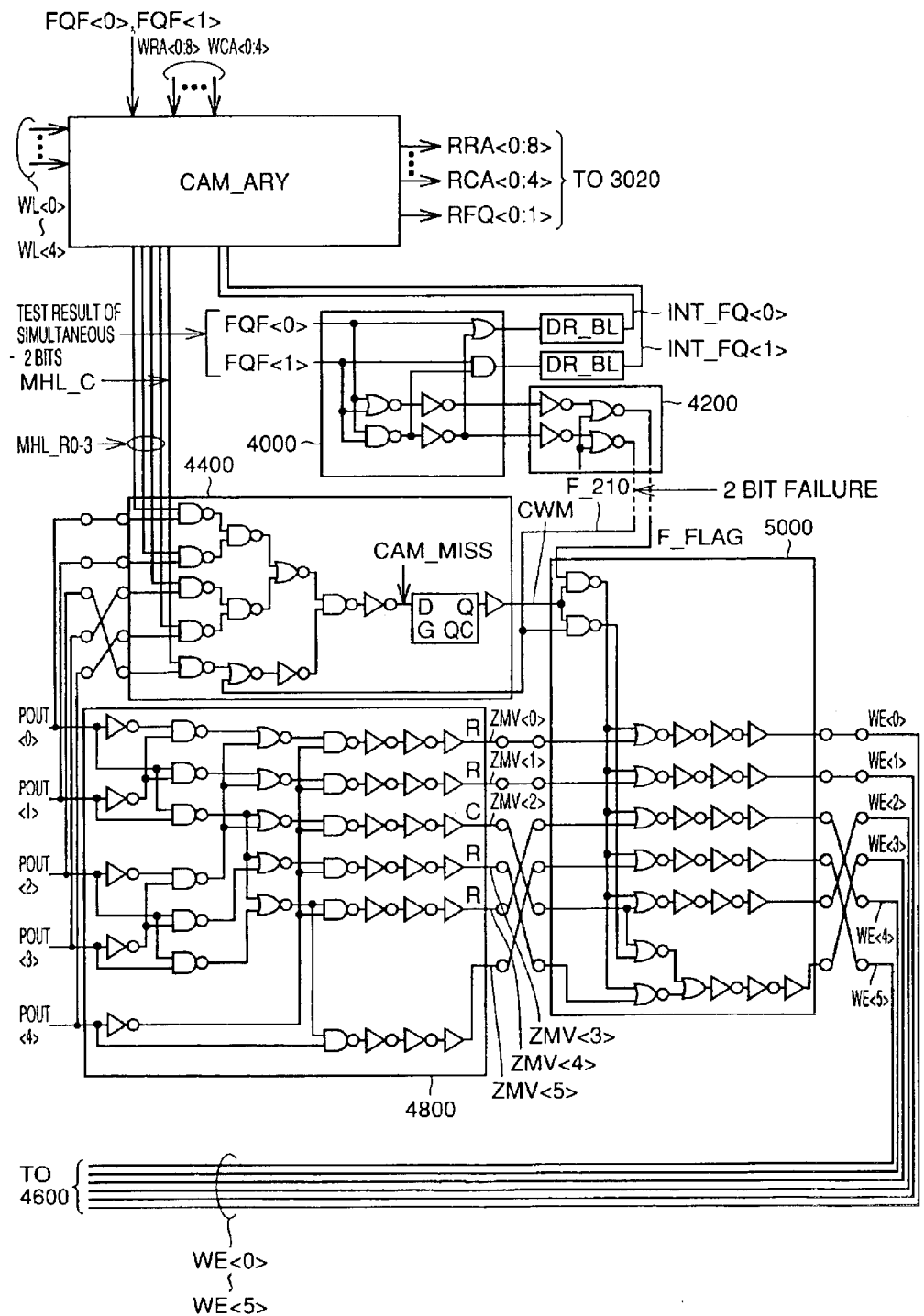

FIGS. 13 and 14 are schematic block diagrams showing an extraction of the portion of the structure of address determinator 3000.0 from the structure of FIG. 11.

As described with reference to FIG. 12, one redundant memory cell column and four redundant memory cell rows are provided corresponding to one sub memory array 100.0. Therefore, there are five ways as to the order of which of the redundant memory cell column and redundant memory cell rows is to be used for the replacement process depending upon where replacement of the redundant memory cell column is carried out of the 5 steps of respective replacements.

In the following, the five ways are represented as set forth in the following according to the sequence in which replacement is carried out, where R represents replacement by a redundant memory cell row and C represents replacement by a redundant memory cell column.

i) RRRRC ii) RRRCR iii) RRCRR iv) RCRRR v) CRRRR

FIGS. 13 and 14 correspond to the case of the above replacement sequence of "RRCRR" in the structure of test block TB.

Referring to FIGS. 13 and 14, address replacement determinator 3000.0 includes an associated memory cell array CAM_ARY, and a flag generation circuit 4000 receiving a test result FQF<0> corresponding to memory cell MC0 from comparator 2060 and a test result FQF<1> corresponding to memory cell MC1 to generate signals INT_FQ<0> and INT_FQ<1> to be applied to associated memory cell array CAM_ARY, a flag signal F_2IO rendered active (H level) when memory cells MC0 and MC1 of two bits are both defective memory cells, and a flag signal F_FLAG attaining an active state (H level) when one of memory cells MC0 and MC1 is a defective memory cell.

Signal INT_FQ<0> output from flag generation circuit 4000 attains an active state (H level) when signal FQF<0> indicating the test result of the first memory cell MC0 in a 2-bit simultaneous test is at an H level, or when signal FQF<0> and test result signal FQF<1> of the second memory cell MC1 in the 2-bit simultaneous test are both at an H level. Signal INT_FQ<1> attains an active state (H level) when signal FQF<0> is at an L level and signal FQF<1> is at an H level.

Signals INT_FQ<0> and INT_FQ<1> are delayed by a delay circuit DRBL, and then applied to associated memory cell array CAM_ARY.

Flag signals F_2IO and F_FLAG output from flag generation circuit 4000 are applied to mode generator 4200, and applied to determination circuit 4400 and write enable signal generation circuit 5000 at a predetermined operation timing.

Associated memory cell array CAM_ARY is applied with row address signals RA0–8 and column address signals CA0–4 to select the memory cell corresponding to test result signals FQF<0> and FQF<1>. The result of comparison with the row address signal and column address signal already stored in associated memory cell array CAM_ARY is output as signals MHL_R0–3 and signal MHL_C.

More specifically, signals MHL_R0–MHL_R3 attain an H level or an L level when the row address already stored in associated memory cell array CAM_ARY matches row address RA0–8 or not, respectively. Signal MHL_C attains an H level or an L level when the column address signal retained in associated memory cell array CAM_ARY matches the applied column address signal CA0–4 or not, respectively.

Determination circuit 4400 outputs a signal CWM of an active state (H level) upon determining that the address of the currently detected defective memory is to be written into associated memory cell array CAM_ARY when a row address or a column address corresponding to detection of a defective memory cell array is written into associated memory cell array CAM_ARY according to the replacement sequence of "RRCRR" of signals MHL_R0–3 and signal MHL_C. More specifically, signal CWM attains an active state (H level) when an address signal is not yet written into associated memory cell array CAM_ARY, or when a defective memory address not matching the address signal already written has been detected, or when the two bits of memory cells from which data are to be read out simultaneously from sub memory cell array 100.0 are both defective memory cells.

Write enable signal generation circuit 5000 receives signal CWM and flag signals F_2IO and F_FLAG and sequentially renders active write enable signals WE<0>–WE<4> corresponding to the sequence of "RRCRR" in order to activate data writing into associated memory cell array CAM_ARY according to the predetermined sequence of "RRCRR".

However, in the case where two bits of defective memory cells are detected simultaneously when the next subject to be replaced is a redundant memory cell column (C), write enable signal generation circuit 5000 simultaneously renders active signal WE<4> in order to store the row addresses corresponding to detection of 2-bits of defective memory cells at the same time as the defective memory cell row to be stored next, in addition to write enable signal WE<3> to write the column address of the defective memory cell into associated memory cell array CAM ARY.

More specifically, in the case where memory cells DBM1 and DBM2 subjected to simultaneous readout are both defective memory cells when the next subject of replacement is a redundant memory cell column SC as described with reference to FIG. 8, the column address of defective memory cell DBM1 and also the row address of defective memory cell DBM2 are stored in associated memory cell array CAM_ARY.

The output of write enable signal generation circuit 5000 is applied to word line select circuit 5200. During the test mode period, signals WE<0>–WE<4> are applied to word lines WL<0>–WL<4> of associated memory cell array CAM_ARY in order to selectively render active a word line of associated memory cell array CAM_ARY.

In a data readout mode from associated memory cell array CAM_ARY, word line select circuit 5200 receives signals WLS<0>.–WLS<4> applied via decode circuit 3010 and provides the received signals to word lines WL<0>–WL<4>, respectively, of associated memory cell array CAM_ARY.

In associated memory cell array CAM_ARY in a test operation mode, a row address or a column address is written with respect to the associated memory cell connected to the corresponding word line according to activation signals WE<0>–WE<4> output from write enable signal generation circuit 5000.

Output signals WE<0>–WE<5> from write enable signal generation circuit 5000 are also applied to write history retain circuit 4600.

Write history retain circuit 4600 renders output signals POUT<0> POUT<4> sequentially active (H level) every time a defective memory cell having a row address or column address that has not yet been detected is detected and that defective row address or column address is written into associated memory cell array CAM_ARY according to the sequence of "RRCRR". Here, in the case where write enable signals WE<0>–WE<4> correspond to signals POUT<0>–POUT<4>, respectively, and write enable signal WE<5> has been rendered active after activation of the total of 5 write enable signals, the repair fail signal, i.e. the readout signal Q6 of the flag of repair failure, is rendered active on the assumption that all the defective memory cells cannot be repaired by the redundancy replacement in the sequence of "RRCRR". Readout signal Q6 is output from circuit 3020 as signal RFOUT.

Write sequence circuit 4800 receives output signals POUT<0>–POUT<4> from write history retain circuit 4600 and applies to write enable signal generation circuit 5000 signals ZMV<0>–ZMV<5> to designate which of signals WE<0>–WE<5> the write enable signal to be rendered active next is.

Therefore, write sequence circuit 4800 and write enable signal generation circuit 5000 correspond to respective logic circuits 3200–3208 shown in FIG. 5.

Although only the structure corresponding to the replacement sequence "RRCRR" is shown in FIGS. 13 and 14, a similar structure is provided corresponding to the other four replacement sequences.

Figure 15:
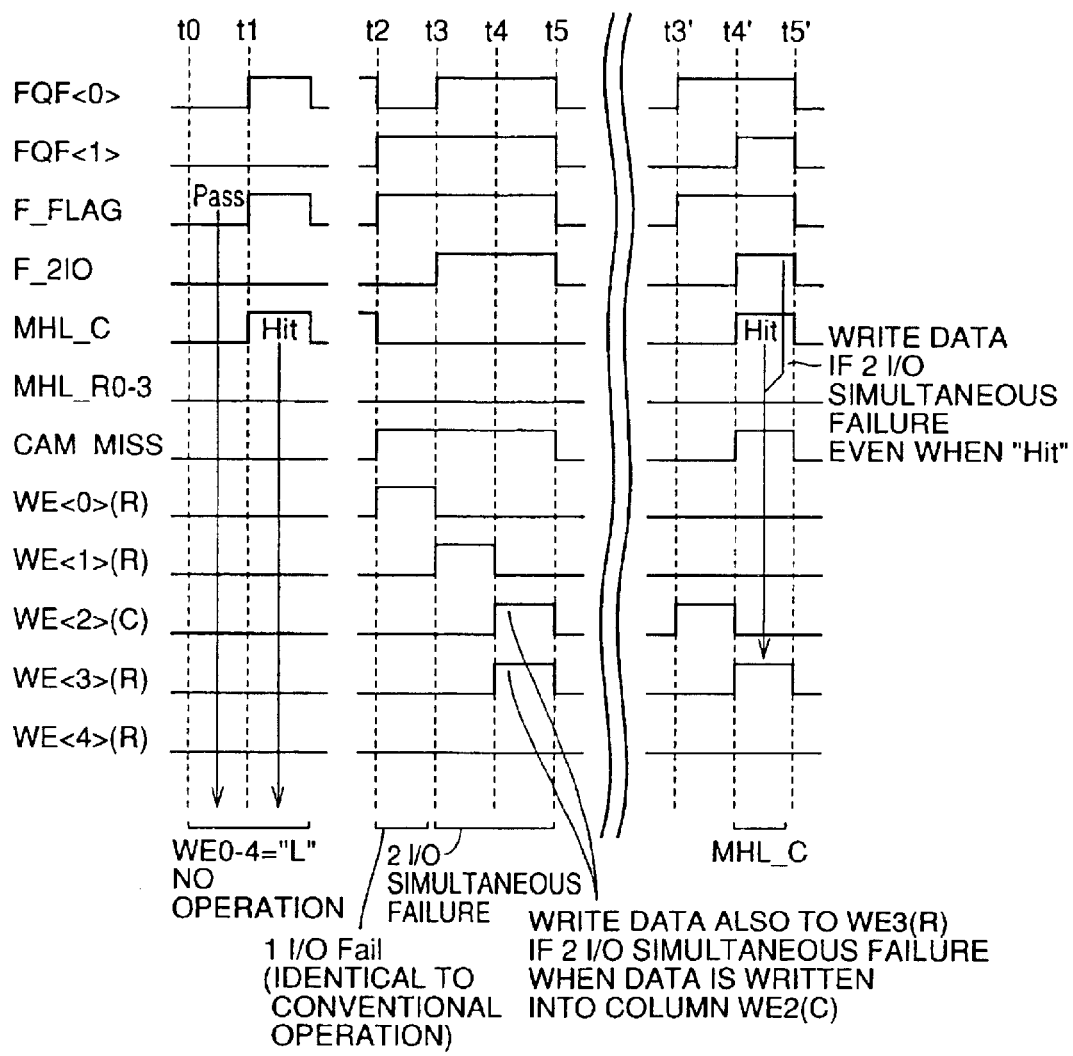
FIG. 15 is a timing chart to describe an operation of address replacement determinator 3000.0.

FIG. 15 is a timing chart to describe an operation of address replacement determinator 3000.0 of FIG. 13.

During the period of time t0 to t1, signals FQF<0> and FQF<1> indicating the test result are both at an L level indicating that both bits have passed the test, so that write enable signals WE<0>–<4> are at an inactive state (L level). Therefore, a write operation towards associated memory cell array CAM_ARY is not carried out.

In the case where the stored column address matches the address corresponding to the detected defective cell (failure) and only one bit thereof fails during the period of time t1 to time t2, a write operation with respect to associated memory cell array CAM_ARY is not carried out.

In the case where a defective memory cell is detected, all the stored addresses do not match this defective address, and failure of one bit is exhibited in the term from time t2 to t3, signal WE<0> is rendered active in order to write a row address into associated memory cell array CAM_ARY.

In the case where the address to be stored next is a row address and the detected defective memory cells correspond to the failure of two bits at the same time in the period from time t3 to time t4, write enable signal WE<1> is rendered active in order to store that row address.

In the case where the address to be stored next is a column address and failure of 2 bits is exhibited in the period of time t4 to time t5, write enable signal WE<2> to store that column address and also write enable signal WE<3> to store into associated memory cell array CAM_ARY corresponding to the row address that is to be stored next are rendered active.

In the case where there is failure of one bit when the address to be stored next is a column address in the period from time t3' to time t4', signal WE<2> to store that column address into associated memory cell array CAM_ARY is rendered active. Then, when failure of two bits simultaneously is detected at time t4' to time t5', signal WE<3> is rendered active in order to store the row address next even in the case where the column address already stored in associated memory cell array CAM_ARY matches the column address of the detected defective memory cell to result in a signal MHL_C of an active state (H level).

More specifically, in address replacement determinator 3000.0 shown in FIGS. 13 and 14, two bits are tested at the same time from sub memory cell array 100.0, and the result thereof is sent from comparator 2060 as signals FQF<0> and FQF<1> (H level when defective).

Here, when only one of signals FQF<0> and FQF<1> is at an H level, flag generation circuit 4000 renders a corresponding one of signals INT_FQ<0> and INT_FQ<1> to an H level. These signals are sent to associated memory cell array CAM_ARY to determine whether that defect has already been replaced or not.

In the case where signals FQF<0> and FQF<1> both are at an H level and the address to be stored next is a defective column address, only signal INT_FQ<0> attains an H level. Therefore, the defect of signal FQF<0> is replaced with a redundant column. In other words, it is assumed that the defect of signal FQF<0> has been detected first. As to signal FQF<1>, replacement with a redundant row is carried out.

Thus, when a plurality of memory cells are tested simultaneously per one sub memory cell array and the tested results are obtained at the same time, a process can be carried out on the assumption that the tested results have been obtained one by one in a predetermined order. Therefore, the redundancy replacement can be analyzed to obtain the row address and the column address to be replaced.

In other words, if the defective memory cell corresponding to signal FQF<0> has been previously replaced with the spare row, a further process is not needed since the defective memory cell corresponding to signal FQF<1> has been replaced already. If the defective memory cell corresponding to signal FQF<0> has been replaced first with the spare column, replacement by a redundant row is carried out since the defective memory cell corresponding to signal FQF<1> has not been replaced. Thus, a process similar to that where the defect of two bits are sequentially detected one bit at a time is allowed.

[Details of Circuitry of Address Replacement Determinator 3000.0]

Figure 16:
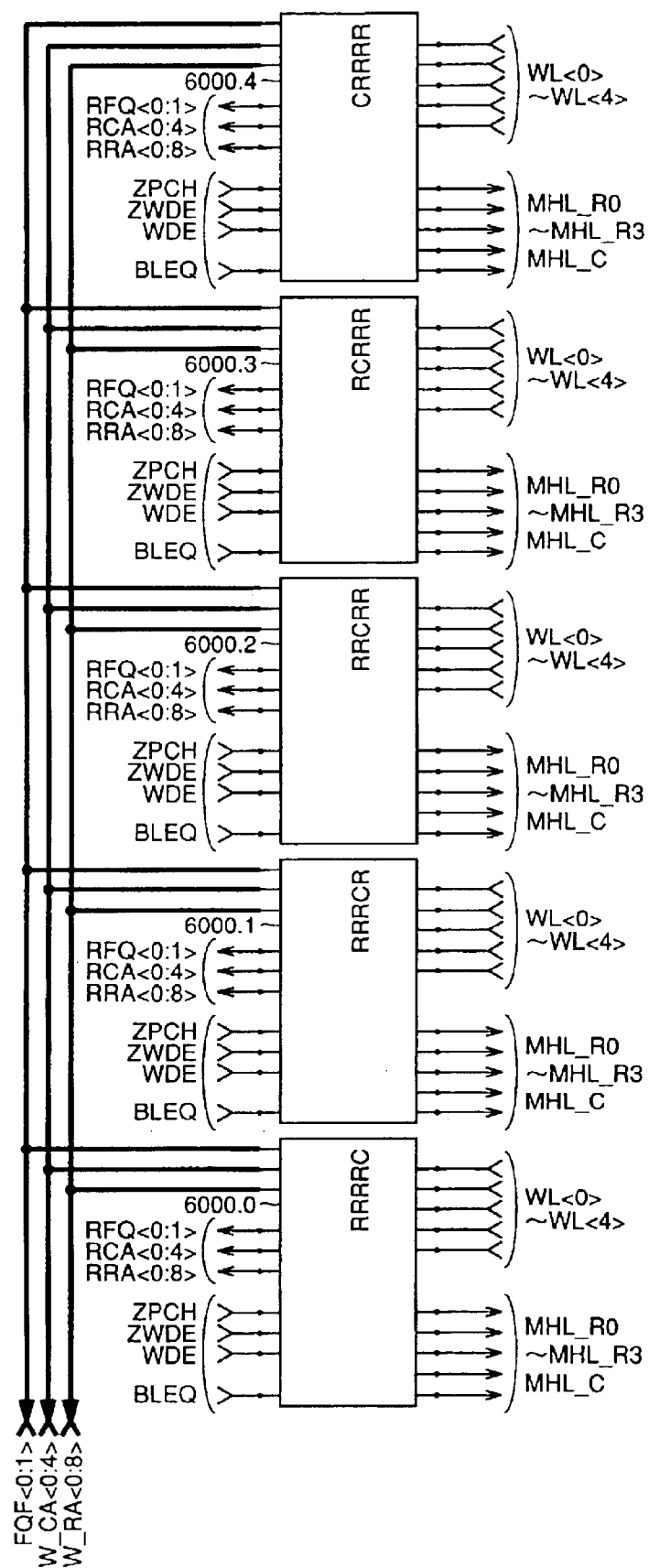
FIG. 16 is a schematic block diagram showing a structure of an associated memory cell array CM_ARY.

FIG. 16 is a schematic block diagram showing a structure of associated memory cell array CAM_ARY shown in FIGS. 13 and 14.

Associated memory cell array CAM_ARY includes associated storage units 6000.0–6000.4 provided corresponding to the replacement sequences of "RRRRC", "RRRCR", "RRCRR", "RCRRR", "CRRRR", respectively. Associated storage units 6000.0–6000.4 have a structure basically similar provided that the order of storing the row address and column address of the defective memory cells differs.

For example, associated storage unit 6000.2 corresponding to the replacement sequence of "RRCRR" shown in FIGS. 13 and 14 receives signals WL<0>–WL<4> from word line select circuit 5200, row address signal WRA<0:8> and column address signal WCA<0:4> representing the row and column of the memory cells that are tested, and test resultant signal FQF<0:1> to write row address signal WRA<0:8>, column address signal WCA<0:4> and test resultant signal FQF<0:1> to the associated memory cell connected to the selected word line according to equalize signal BLEQ, write timing signals WDE, ZWDE and precharge signal ZPCH from BIST control unit 2010.

Associated storage unit 6000.2 outputs match determination signals MHL_R0–MHL_R3, MHL_C according to the comparison result between the stored address signal and the applied address signal.

In reading out data from associated storage unit 6000.2, associated storage unit 6000.2 responds to word line select signals WL<0>–WL<4> applied from word line select unit 5200 to output the readout signals as readout address signal RRA<0:8>, readout column address signal RCA<0:4> and readout test resultant signal RFQ<0:1>.

The other associated storage units 6000.0–6000.1 and 6000.3–6000.4 have a similar structure.

Figure 17:
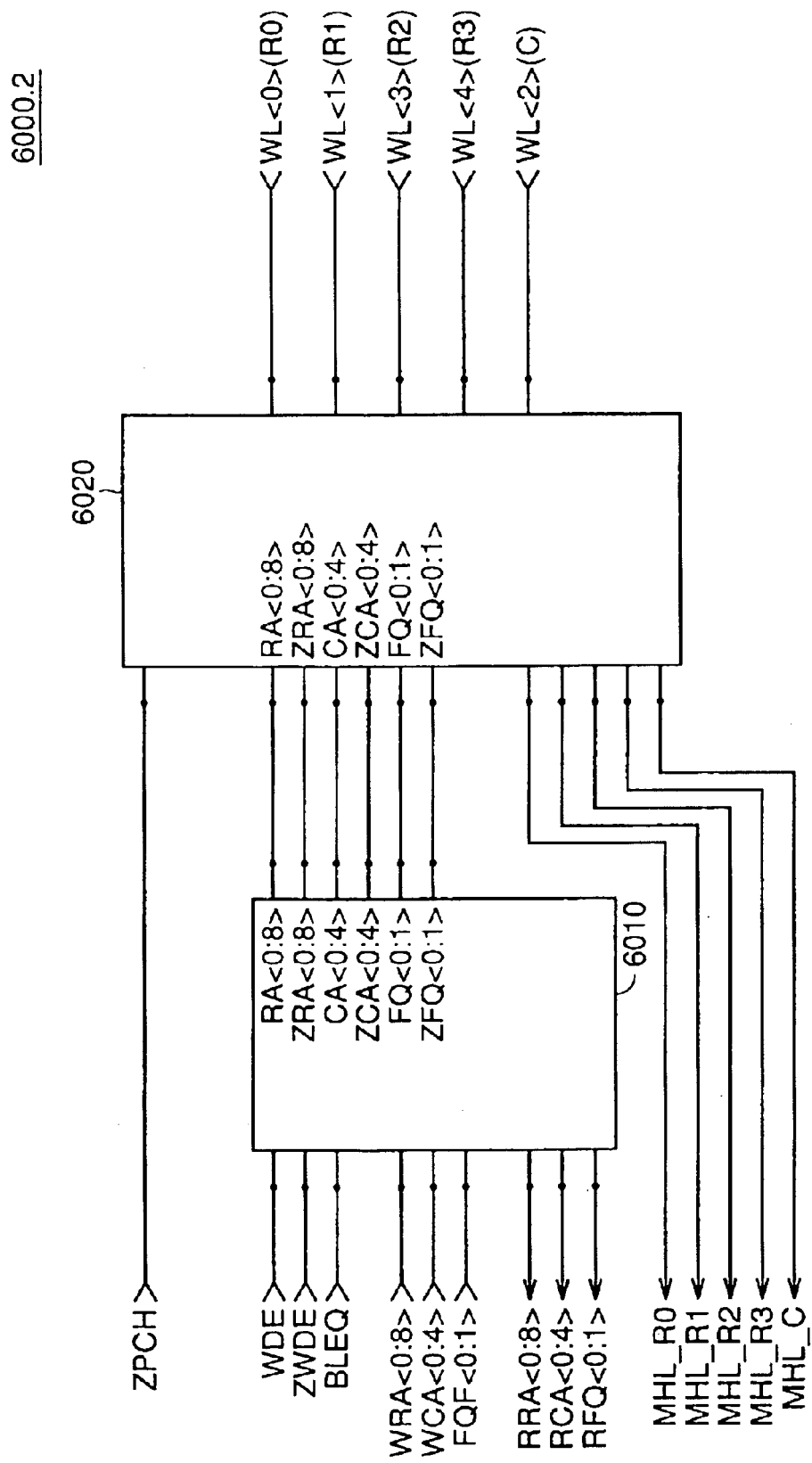
FIG. 17 is a schematic block diagram showing a structure of an associated storage unit 6000.2 of FIG. 16.

FIG. 17 is a schematic block diagram showing a structure of associated storage unit 6000.2 of FIG. 16.

Associated storage unit 6000.2 includes a data conversion circuit 6010 under control of control signals WDE, ZWDE and signal BLEQ applied from BIST circuit 2010 to convert to-be-stored row address signal WRA<0:8>, column address signal WCA<0:4> and test resultant signal FQF<0:1> into complementary signals RA<0:8> and ZRA<0:8>, CA<0:4> and ZCA<0:4> and FQ<0:1> and ZFQ<0:1> to be applied to the associated memory cell, and an associated memory cell train group 6020.

Data conversion circuit 6010 also converts complementary row address signals RA<0:8>, ZRA<0:8> read out from associated memory cell train group 6020, complementary column address signals CA<0:4>, ZCA<0:4> and complementary test resultant signals FQ<0:1>, ZFQ<0:1> into readout row address signal RA<0:8>, readout column address signal RCA<0:4> and readout test resultant signal RFQ<0:1>.

Associated memory cell train group 6020 receives word line select signals WL<0>–WL<4> to write or read out the test resultant signal and the address signal. During the test operation period, match determination signals MHL_R0–3 and MHL_C are output according to the comparison result between the address signal already stored and the applied address signal. When the prestored address signal matches the applied address signal, match determination signals MHL_R0–3 and MHL_C maintain the H level. When the address signals do not match, the determination signals attain an L level.

Figure 18:
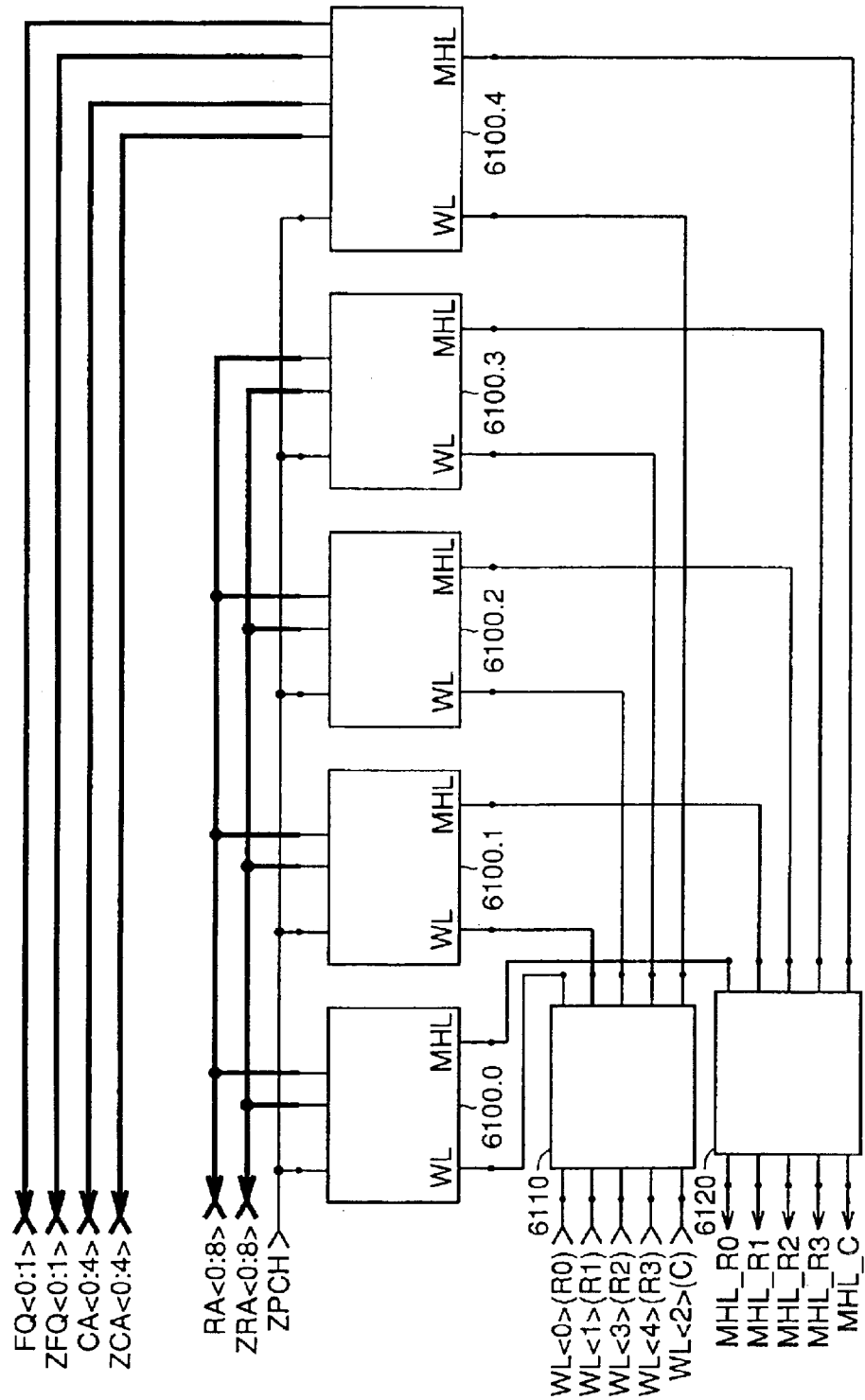
FIG. 18 is a schematic block diagram showing a structure of an associated memory cell column group 6020 of FIG. 17.

FIG. 18 is a schematic block diagram showing a structure of an associated memory cell train group 6020 shown in FIG. 17.

Memory cell train group 6020 includes associated memory cell trains 6100.0–6100.3 to store the row address of a defective memory cell, an associated memory cell train 6100.4 to store the column address of the defective memory cell and the test resultant signal, a timing adjustment circuit 6110 receiving word line select signals WL<0>–WL<4> and applies the same to associated memory cell trains 6100.0–6100.4, respectively, after the timing is adjusted, and a timing adjustment circuit 6120 receiving match determination signals MHL_R0–3 and MHL_C output from associated memory cell trains 6100.0–6100.4 to output the same after the timing is adjusted.

Figure 19:
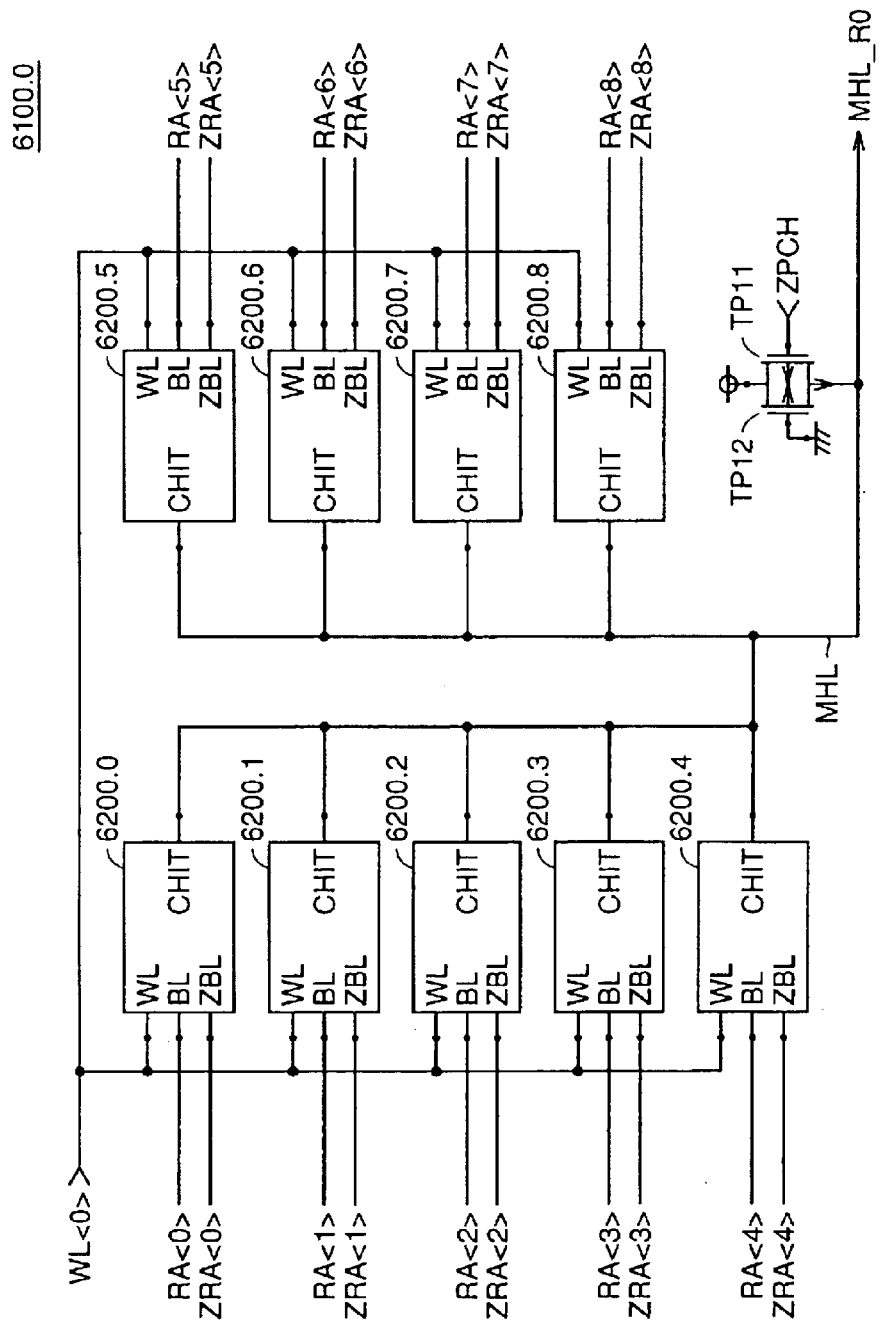
FIG. 19 is a schematic block diagram to describe a structure of an associated memory cell train 6100.1 to store a row address.

FIG. 19 is a schematic block diagram to describe a structure of associated memory cell train 6100.0 to store a row address out from the associated memory cell trains shown in FIG. 18.

The other associated memory cell trains 6100.1–6100.3 to replace a defective row address have a similar structure.

Associated memory cell train 6100.0 includes associated memory cells 6200.0–6200.8 receiving complementary bit signals RA<0>, ZRA<0> RA<8>, ZRA<8> of a row address signal. Associated memory cell 6200.0 is selected by a corresponding word line select signal WL<0>. Associated memory cell 6200.0 storing address signals RA<0> and ZRA<0> outputs the comparison result between address signals RA<0> and ZRA<0> and the prestored data to match detection line MHL. Here, the node receiving signal RA<0> is referred to as node BL. The node receiving signal ZRA<0> is referred to as node ZBL. The node coupling with match detection line MHL is referred to as node CHIT.

A P channel MOS transistor TP11 rendered conductive according to a precharge signal ZPCH is provided between match detection line MHL and power supply potential Vcc. A P channel MOS transistor TP12 constantly conductive is also provided, parallel to transistor TP11, and having a size sufficiently smaller than that of transistor TP11. Even in the case where transistor TP11 is rendered conductive to cause match detection line MHL to be driven to an H level, whereby the precharge operation ends and transistor TP11 is cut off, the H level of transistor TP12 is maintained. It is assumed that the size of transistor TP12 is adjusted so that the potential level of match detection line MHL attains an L level when the potential level of match detection line MHL is driven to an L level by any of associated memory cells 6200.0–6200.8.

More specifically, when the data stored in associated memory cells 6200.0 0 6200.8 all match the applied address signals RA<0>, ZRA<0>RA<8>, ZRA<8>, match detection line MHL maintains the H level even after the precharge operation. However, when the data stored in any of associated memory cells 6200.0–6200.8 differs, match detection line MHL is driven to an L level.

Figure 20:
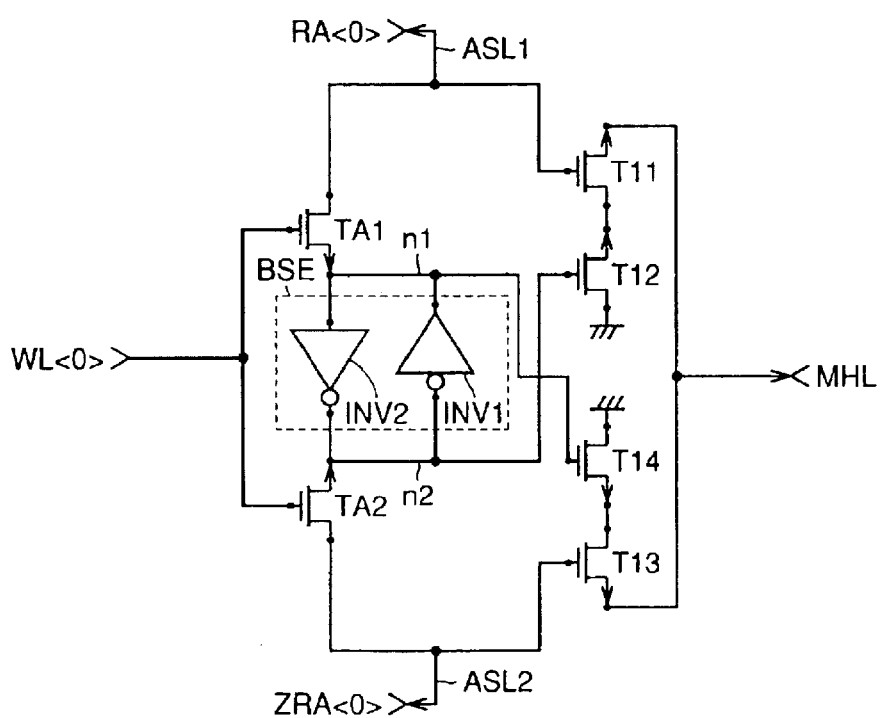
FIG. 20 is a circuit diagram showing a structure of an associated memory cell 6200.0.

FIG. 20 is a circuit diagram showing a structure of associated memory cell 6200.0 shown in FIG. 19. The other associated memory cells 6200.1–6200.8 basically have a similar structure.

Associated memory cell 6200.0 includes an address signal line ASL1 to transmit a row address signal RA<0>, a storage element BSE formed of two inverters INV1 and INV2, an N channel type access transistor TA1 to connect a storage node N1 of storage element BSE and address signal line ASL1 according to the level of word line WL<0>, an address signal line ASL2 to transmit a complementary row address signal ZRA<0>, an N channel type access transistor TA2 to connect a storage node n2 of storage element BSE and address signal line ASL2 according to the level of word line WL<0>, N channel transistors T11 and T12 connected in series between match detection line MHL and ground potential, and transistors T13 and T14 connected in series between match detection line MHL and ground potential.

Transistor T11 has its gate connected to address signal line ASL1. Transistor T12 has its gate connected to storage node N2 of storage element BSE.

Transistor T13 has its gate connected to storage node n1 of storage element BSE. Transistor T14 has its gate connected to address signal line ASL2.

More specifically, in response activation of word line WL<0>, storage element BSE is connected to address signal lines ASL1 and ASL2. When the data stored in storage element BSE does not match the address signals on address signal lines ASL1 and ASL2, match detection line MHL is connected to the ground potential to be discharged via the path of transistors T11 and T12 or the path of transistors T13 and T14.

Figure 21:
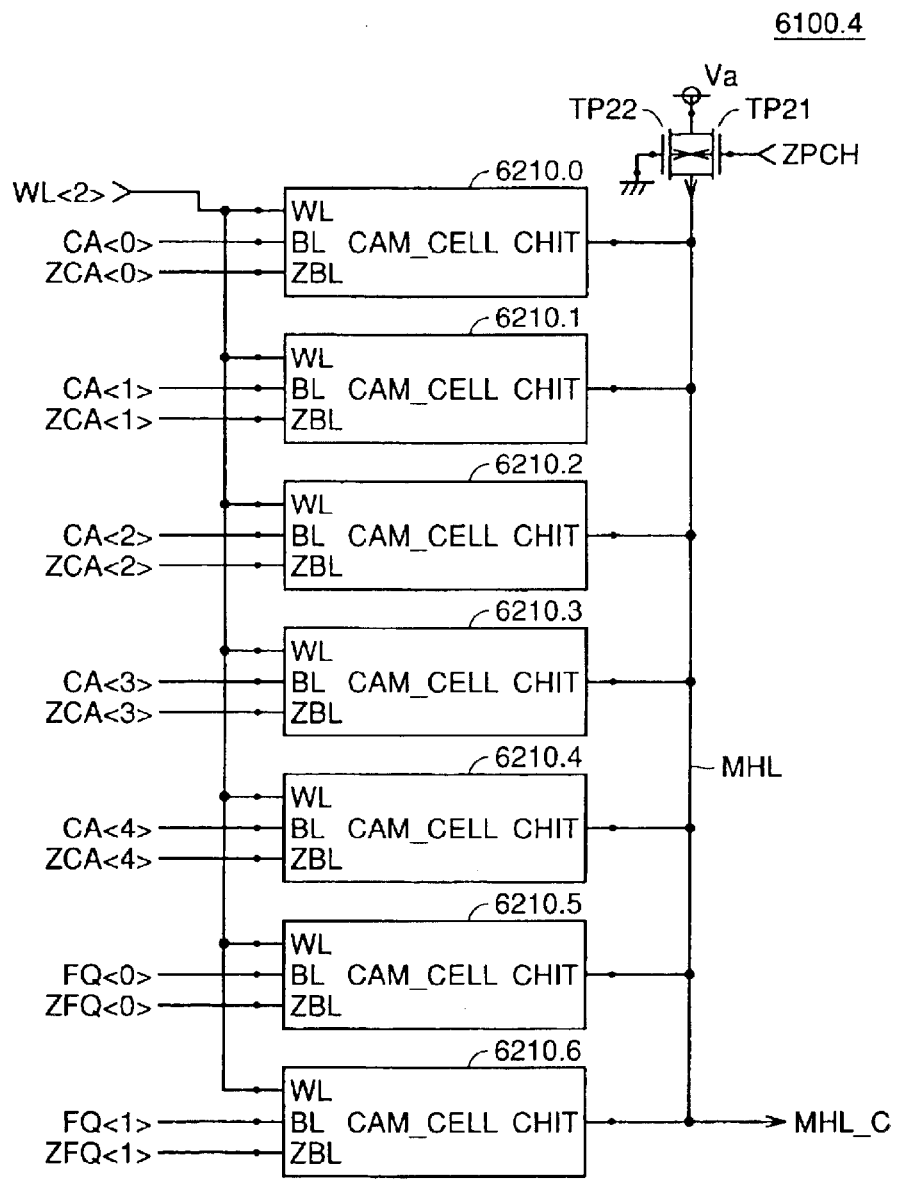
FIG. 21 is a schematic block diagram to describe a structure of an associated memory cell train 6100.4.

FIG. 21 is a schematic block diagram to describe a structure of associated memory cell train 6100.4 to store the row address of the defective memory cell and test resultant signal FQF<0:1> from the structure of FIG. 18.

Associated memory cell train 6100.4 includes associated memory cells 6210.0–6210.4 receiving complementary bit signals CA<0>, ZCA<0> to CA<4>, ZCA<4> of the column address signal, and associated memory cells 6210.5 and 6210.6 storing complementary signals FQ<0>, ZFQ<0> and FQ<1>, ZFQ<1> corresponding to test resultant signals FQF<0> and FQF<1>, respectively. The structure of other associate memory cells 6210.0–6210.6 are basically similar to the structure shown in FIG. 20.

Associated memory cells 6210.0–6210.6 are coupled to match detection line MHL to transmit match signal MHL__C.

Between match detection line MHL and power supply potential Vcc are connected in parallel a P channel MOS transistor TP21 rendered conductive by signal ZPCH and a P channel MOS transistor TP22 always conductive.

Figure 22:
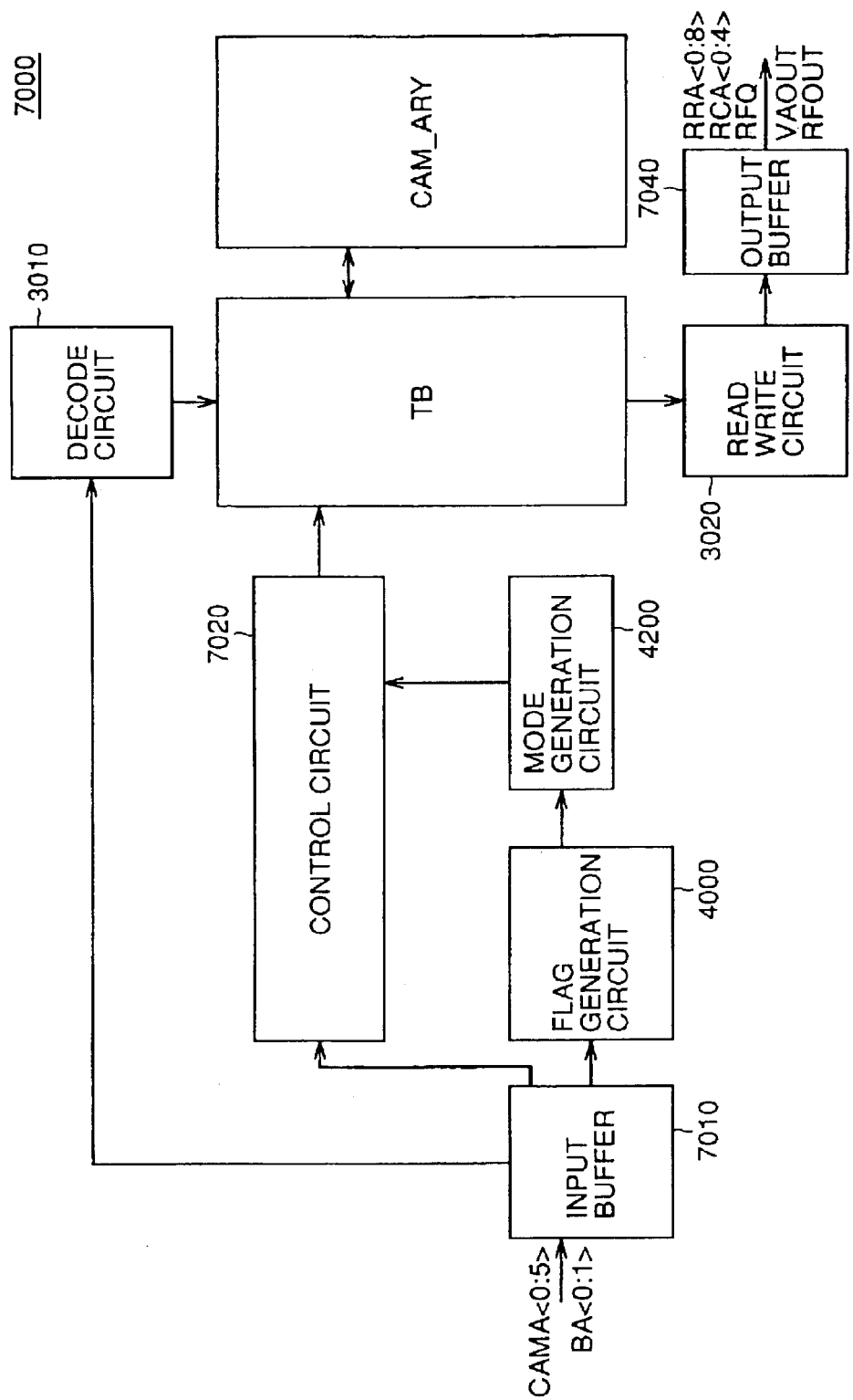
FIG. 22 is a schematic block diagram to describe a structure of a test block TB, a decode circuit 3010 and a read write circuit 3020.

FIG. 22 is a schematic block diagram to describe the structure of test block TB shown in FIG. 11, a circuit controlling test block TB, decode circuit 3010, and read write circuit 3020.

Referring to FIG. 22, input buffer 7010 receives bank address signal BA<0:1> applied with respect to test block TB, row address signal WRA<0:8>, column address signal WCA<0:4> and signal FQF<0:1> applied from comparator 2060. Input buffer 7010 also receives a signal CAMA<0:5> to designate the data to be read out and an external control signal in reading out data from associated storage cell array CAM__ARY. Decode control circuit 3010 designates the readout of data retained in the associated memory cell array specified by externally applied bank address signal BA<0:1> and signal CAMA<0:5> and the register in control block TB5 with respect to test block TB.

Control circuit 7020 controls the operation of test block TB according to the control signal applied from input buffer 7010.

As described with reference to FIGS. 13 and 14, flag generation circuit 4000 generates flag signals F__2IO and F__FLAG according to test resultant flag signals FQF<0> and FQF<1>. Mode generation circuit 4200 applies to test block TB flag signals F__2IO and F__FLAG at a predetermined timing via control circuit 7020.

Test block TB controls the write operation of an address signal to associated memory cell array CAM__ARY and the data readout operation from associated memory cell array CAM__ARY. Read write circuit 3020 outputs row address signal RRA<0:8> of the memory cell to be replaced obtained via test block TB, column address signal RCA<0:4> of the memory cell to be replaced, a signal RFQ indicating whether the memory cell with a defect is MC0 or MC1, a signal VAOUT indicating the current order in the replacement sequence the writing of the address into the associated memory cell has been carried out, and a signal FROUT indicating whether redundancy repair has succeeded or not. Output buffer 7040 receives the outputs from read write circuit 3020 to provide the same outside.

Figure 23:
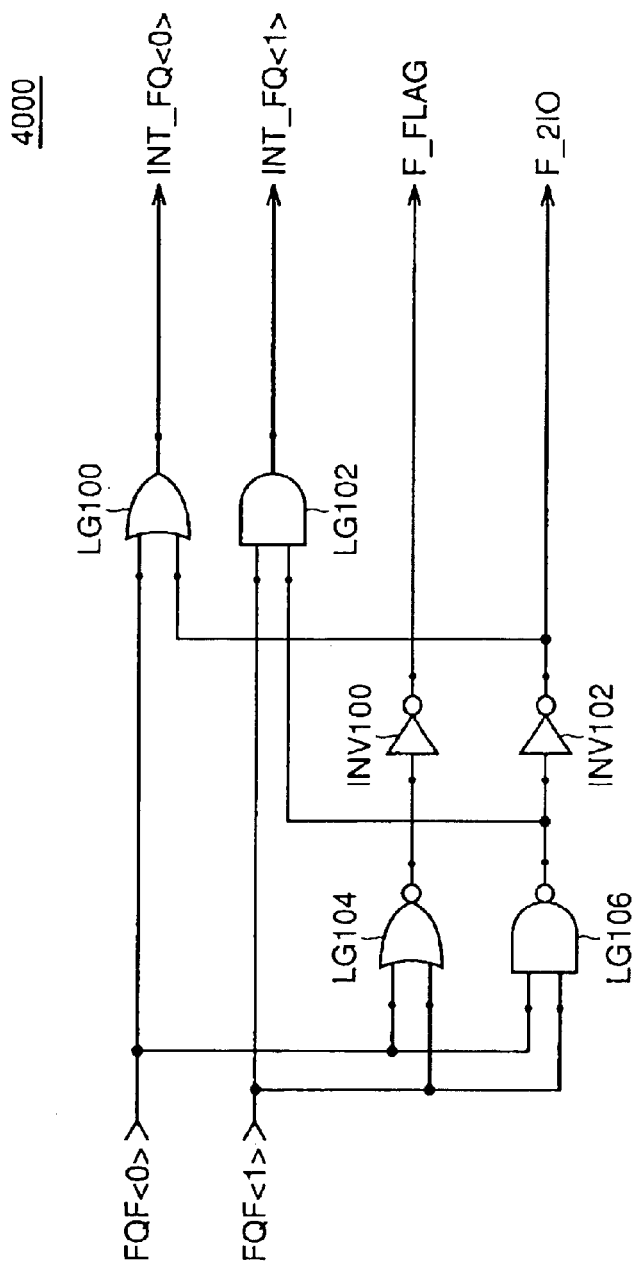
FIG. 23 is a schematic block diagram showing a structure of a flag generation circuit 4000.

FIG. 23 is a schematic block diagram showing a structure of flag generation circuit 4000 from the circuit shown in FIG. 22.

Flag generation circuit 4000 includes a NOR circuit LG104 receiving signal FQF<0> at one input node and signal FQF<1> at the other input node, an inverter INV100 receiving and inverting the output of NOR circuit LG104 to output flag signal F__FLAG, a NAND circuit LG106 receiving signal FQF<0> at one input node and signal FQF<1> at the other input node, an inverter INV102 receiving and inverting the output of NAND circuit LG106 to output a flag signal F__2IO, an OR circuit LG100 receiving signal FQF<0> at one input node and the output of inverter INV102 at the other input node to output a signal INT__FQ<0>, and an AND circuit LG102 receiving signal FQF<1> at one input node and the output of NAND circuit LG106 at the other input node to output signal INT__FQ<1>.

Thereof, flag generation circuit 4000 provides signal INT__FQ<0> of an H level and signal INT__FQ<1> of an L level when signals FQF<0> and FQF<1> are both at an H level and failure of two bits are indicated. At the same time, flag signal F__2IO attains an H level.

In the case where one of signals FQF<0> and FQF<1> is at an H level, one of corresponding signals INT__FQ<0> and INT__FQ<1> attains an H level.

Figure 24:
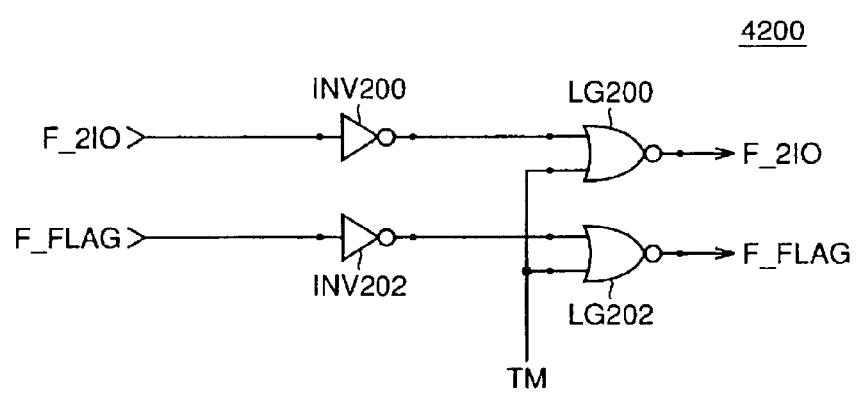
FIG. 24 is a schematic block diagram to describe a structure of a mode generation circuit 4200.

FIG. 24 is a schematic block diagram to describe a structure of mode generation circuit 4200.

Mode generation circuit 4200 includes an inverter INV200 receiving and inverting flag signal F__2IO, an inverter INV202 receiving and inverting flag signal F__FLAG, a NOR circuit LG2000 receiving the output of inverter INV200 and a timing signal TM from control circuit 7020 to output flag signal F__2IO at a predetermined timing, and a NOR circuit LG202 receiving the output of inverter INV202 and signal TM to output signal F__FLAG at a predetermined timing.

Figure 25:
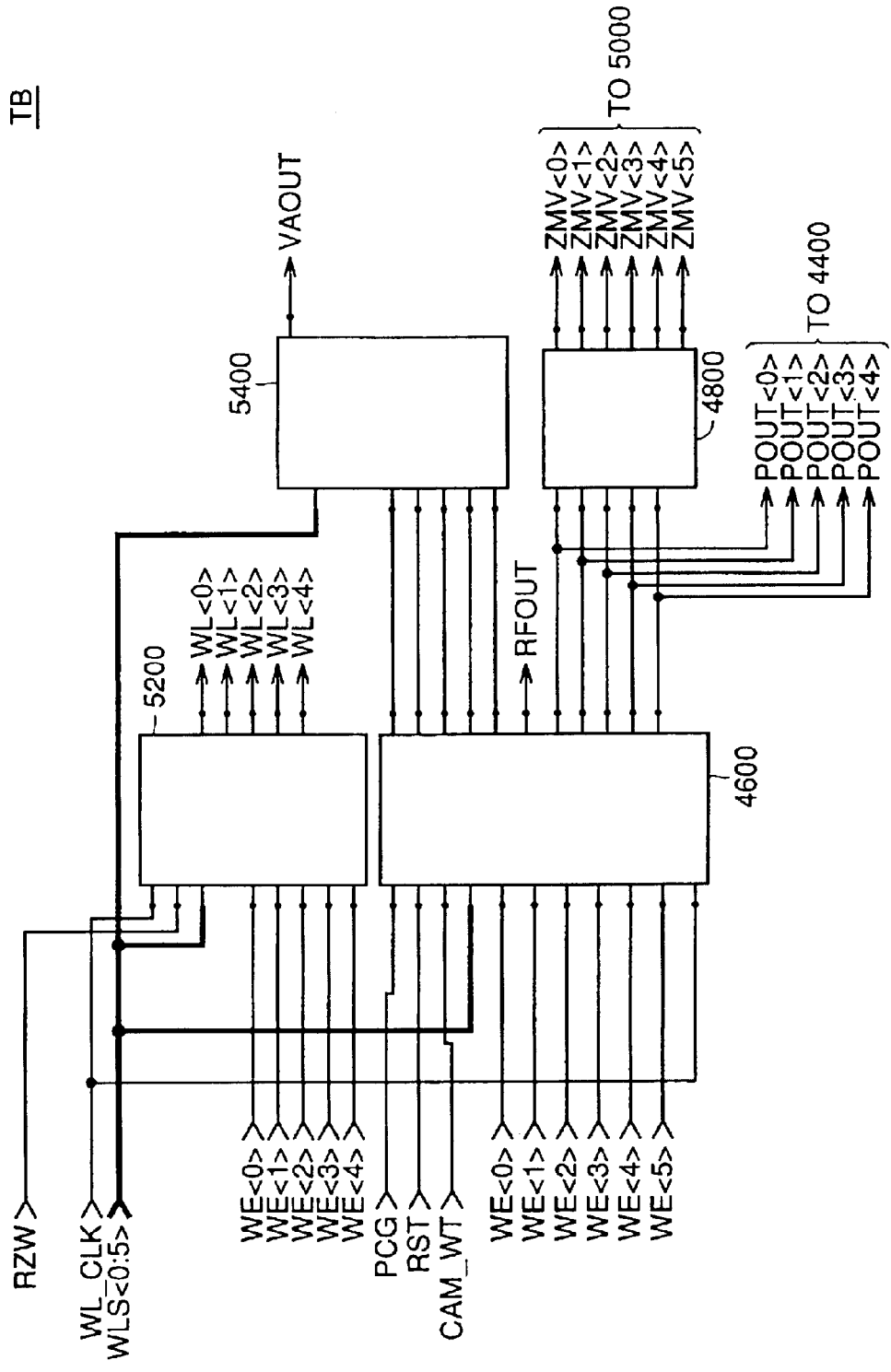
FIG. 25 is a schematic block diagram to describe a structure of test block TB with a portion thereof extracted.

FIG. 25 is an extraction of test block TB to describe the structure thereof.

Test block TB includes a word line select circuit 5200 shown in FIGS. 13 and 14, write history retain circuit 4600, write history output circuit 5400 providing a signal VAOUT indicating the row of the associated memory cells which is currently written, and a write sequence circuit 4800. Although not shown in FIG. 25, test block TB further includes write enable signal generation circuit 5000 and determination circuit 4400.

Write history retain circuit 4600 receives write enable signals WE<0>–WE<5> to retain the history of activation thereof. When replacement was not successful by four redundant rows and one redundant column, signal Q6 attains an active state, and a signal RFOUT is output indicating that the defective memory cell cannot be repaired by the corresponding replacement sequence, for example the sequence of "RRCRR".

Word line select signal 5200 receives signals WE<0>–WE<4> and externally applied word line set signal WL<0:5> to provide to word lines WL<0>–WL<4> signals WE<0>–WE<4> and signals WLS<0>–WLS<5> in a test operation mode and a readout operation mode, respectively.

Write sequence circuit 4800 receives signals POUT<0>–POUT<4> representing the write history output from write history retain circuit 4600 to output signals ZMV<0>–ZMV<5> indicating the write enable signal that is to be rendered active next.

Signals POUT<0>–POUT<4> correspond to write enable signals WE<0>–WE<4>, respectively, to maintain an active level (H level) when the corresponding write enable signal is rendered active.

Determination circuit 4400 receives signals POUT<0>–POUT<4> and match detection signals MHL_R0–3 and MHL_C to output a signal CWM indicating whether to render the write enable signal active or not.

Write enable signal generation circuit 5000 receives signals CWM and signals ZMV<0>–ZMV<5> from write sequence circuit 4800 to render active any one of write enable signals WE<0>–WE<5> that is to be rendered active next.

Figure 26:
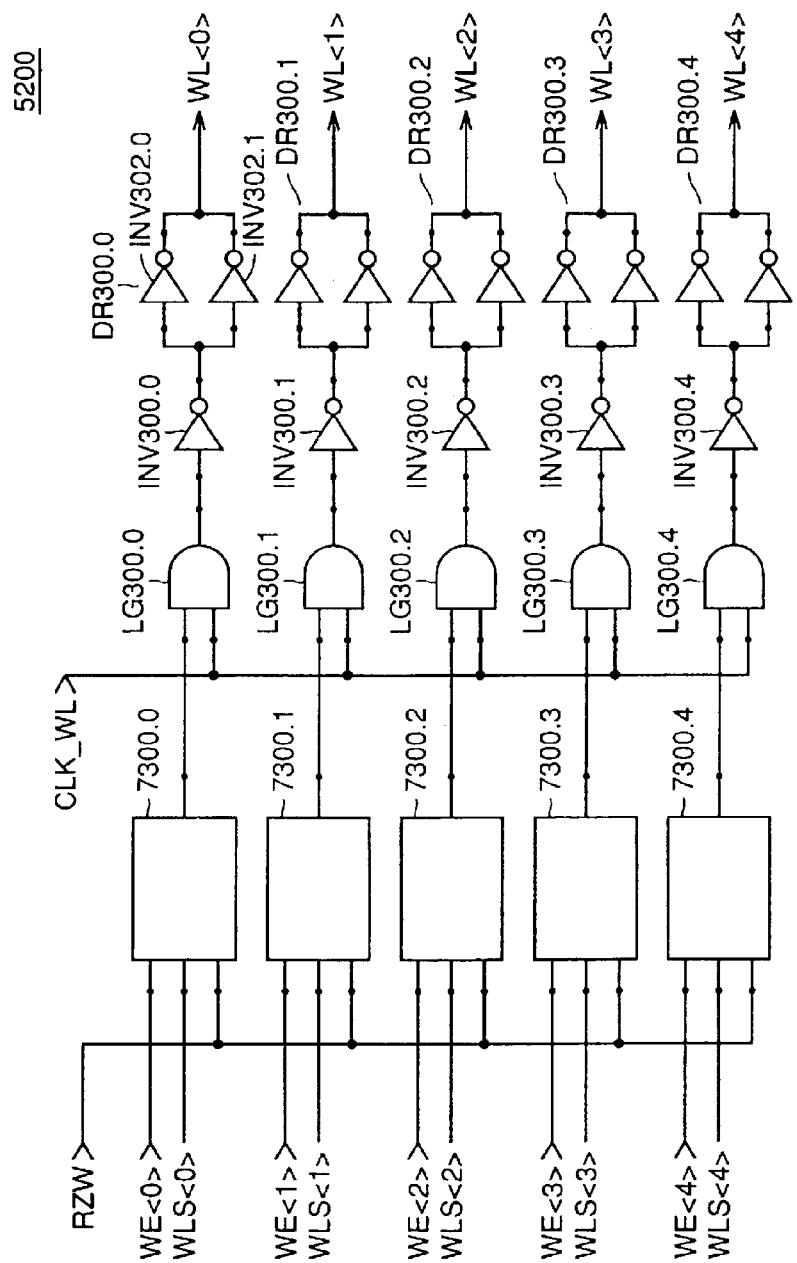
FIG. 26 is a schematic block diagram to describe a structure of a word line select circuit 5200 of FIG. 25.

FIG. 26 is a schematic block diagram to describe a structure of word line select circuit 5200 of FIG. 25.

Word line select circuit 5200 includes select circuits 7300.0–7300.4 receiving write enable signals WE<0>–WE<4> and externally applied word line select signals WLS<0>–WLS<4> to select and output either thereof according to control signal RZW from control circuit 7020, AND circuits LG300.0–LG300.4 receiving the outputs of select circuits 7300.0–7300.4 at respective one input nodes and clock signal CLK_WL from control circuit 7020 at respective output nodes, inverters INV300.0–300.4 receiving the outputs of AND circuits LG300.0–LG300.4, respectively, and drive circuits DR300.0–DR300.4 receiving the outputs of inverters INV300.0–300.4, respectively, to output word line select signals WL<0>–WL<4>.

Drive circuit DR300.0 includes two inverters INV302.0 and INV302.1 receiving the output of inverter INV300.0. The same applies to the other drive circuits DR300.1–DR300.5.

Figure 27:
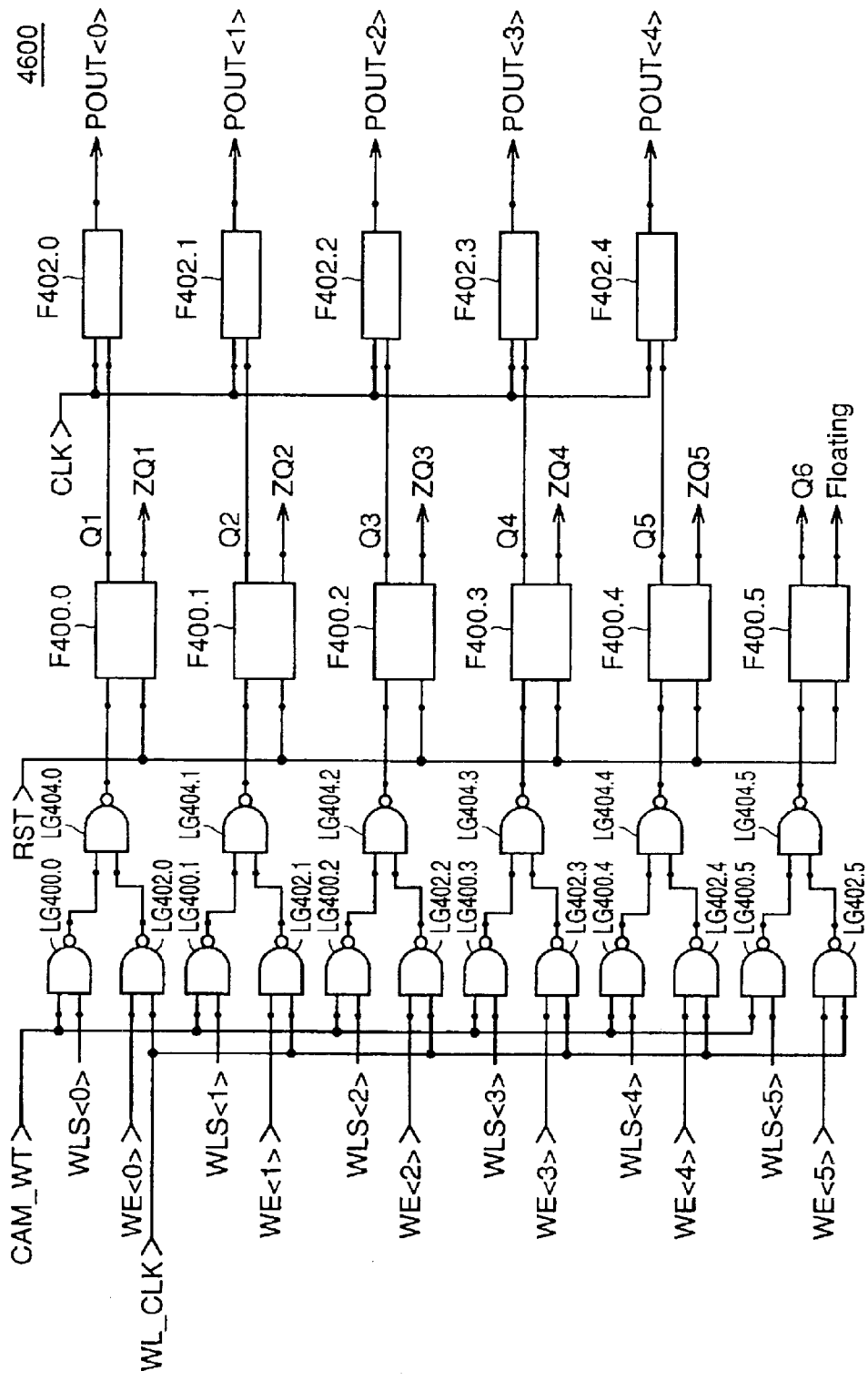
FIG. 27 is a schematic block diagram showing a structure of a write history retain circuit 4600 of FIG. 25.

FIG. 27 is a schematic block diagram showing a structure of write history retain circuit 4600 of FIG. 25.

Write history retain circuit 4600 includes a NAND circuit LG400.0 receiving a write control signal CAM_WT from control circuit 7020 at one input node and externally applied word line select signal WLS<0> at the other input node, a NAND circuit LG402.0 receiving clock signal WL_CLK from control circuit 7020 and write enable signal WE<0>, a NAND circuit LG404.0 receiving the outputs of NAND circuit LG400.0 and LG402.0, a flip flop circuit F400.0 reset in response to a reset signal RST from control circuit 7020 and set by an output of NAND circuit LG404.0 to output complementary signals Q1 and ZQ1, and a flip flop circuit F402.0 receiving clock signal CLK from control circuit 7020 and output signal Q1 from flip flop circuit F400.0 to output a signal POUT<0> according to activation of clock signal CLK.

Write history retain circuit 4600 has a structure similar to that of the set of word line select signal WLS<1> and write enable signal.WE<1> corresponding to the set of word line select signal WLS<1> and write enable signal WE<1>, the set of word line select signal WLS<2> and write enable signal WE<2>, the set of word line select signal WLS<3> and write enable signal WE<3>, and the set of word line select signal WLS<4> and write enable signal WE<4>.

Write history retain circuit 4600 further includes a NAND circuit LG400.5 receiving write control signal CAM_WT at one input node and externally applied word line select signal WLS<5> at the other input node, a NAND circuit LG402.0 receiving clock signal WL_CLK and write enable signal WE<5>, a NAND circuit LG404.5 receiving outputs of NAND circuits LG400.5 and LG402.5, and a flip flop circuit F400.5 reset according to reset signal RST and set according to an output from NAND circuit LG404.0 to output signal Q6. Signal Q6 is output from test block TB as flag RFOUT.

In a test operation mode, write history retain circuit 4600 has any of corresponding flip flop circuits F400.0–F400.5 set in response to any of signals WE<0>–WE<5> rendered active when signal WL_CLK is at an active state (H level). In response to activation of clock signal CLK, the outputs of flip flop circuits F400.0–F400.4 are provided as signals POUT<0>–POUT<4> from flip flop circuits F402.0–DF402.4.

Figure 28:
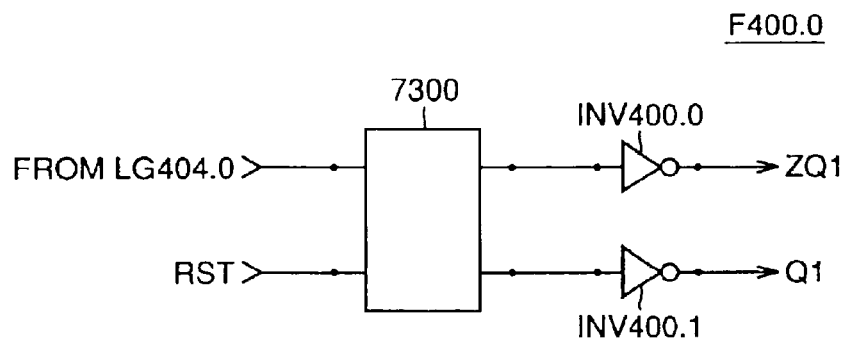
FIG. 28 is a schematic block diagram to describe a structure of a flip flop circuit F400.0 of FIG. 27.

FIG. 28 is a schematic block diagram to describe a structure of flip flop circuit F400.0 of FIG. 27. Flip flop circuit 400.0 includes an SR flip flop circuit 7300 receiving a set signal and a reset signal RST from corresponding NAND circuit LG404.0, an inverter INV400.0 receiving and inverting output signal Q of SR flip flop circuit 7300 to output the inverted signal as signal ZQ1, and an inverter INV400.1 receiving the output of QC of SR flip flop circuit 7300 to output the inverted signal as signal Q1.

Figure 29:
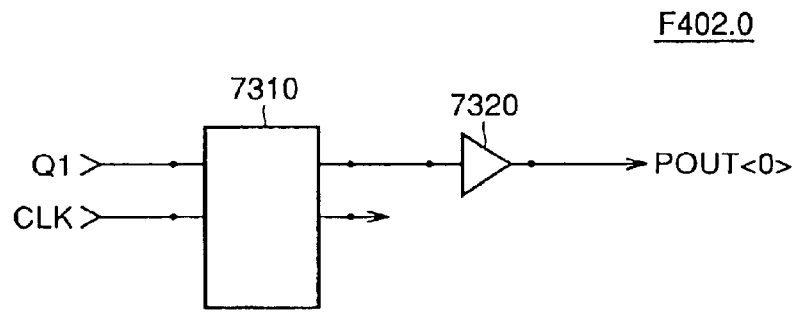
FIG. 29 is a schematic block diagram to describe a structure of a flip flop circuit F402.0 of FIG. 27.

FIG. 29 is a schematic block diagram to describe a structure of flip flop circuit F402.0 of FIG. 27.

Flip flop circuit F402.0 includes a D flip flop circuit 7310 receiving signal CLK as a clock signal output signal Q1 from SR flip flop circuit F400.0, and a drive circuit 7320 to receive and amplify the output of D-flip flop circuit 7310. The same applies for the other flip flop circuits F402.1–F402.4.

Figure 30:
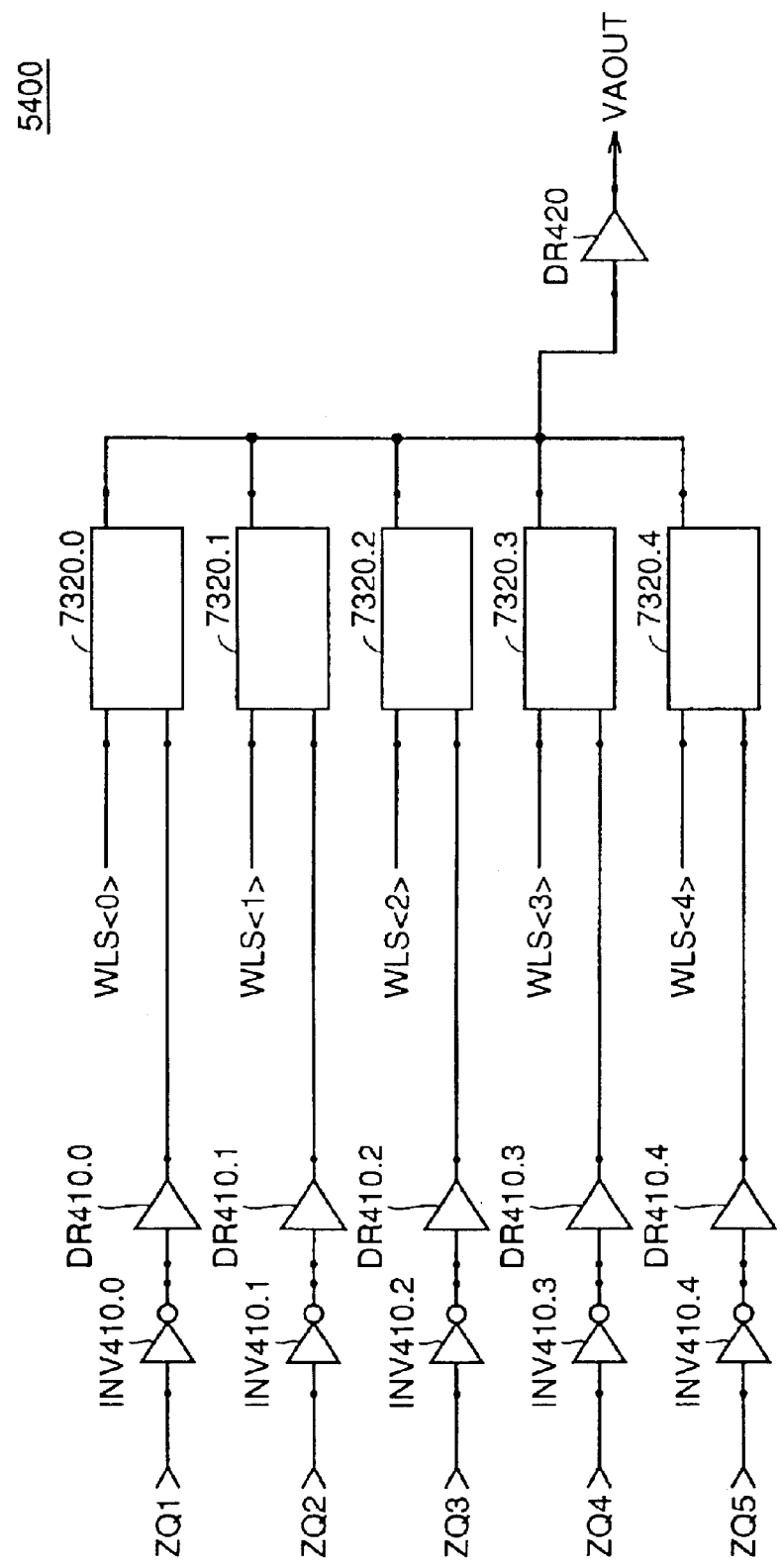
FIG. 30 is a schematic block diagram to describe a structure of a write history output circuit 5400 of FIG. 25.

FIG. 30 is a schematic block diagram to describe a structure of write history output circuit 5400 of FIG. 25.

Write history output circuit 5400 includes inverters INV410.0–INV410.4 receiving output signals ZQ1–ZQ5, respectively, from write history retain circuit 4600, drive circuits DR410.0–DR410.4 receiving the outputs of inverters INV410.0–INV410.4 to drive, select circuits 7320.0–7320.4 receiving the outputs of drive circuits DR410.0–DR410.4, respectively, to provide the outputs of drive circuits DR410.0–DR410.4, respectively, according to activation of word line select signals WLS<0>–WLS<4> from decode circuit 3010, and a drive circuit DR420 receiving the outputs of select circuits DR7310.0–DR7310.4 to provide a signal VAOUT.

By reading out signal VAOUT according to externally applied word line select signals WLS<0>–WLS<5> from write history output circuit 5400, confirmation can be made of which of write enable signals WE<0>–WE<4> has been rendered active during the test period.

Figure 31:
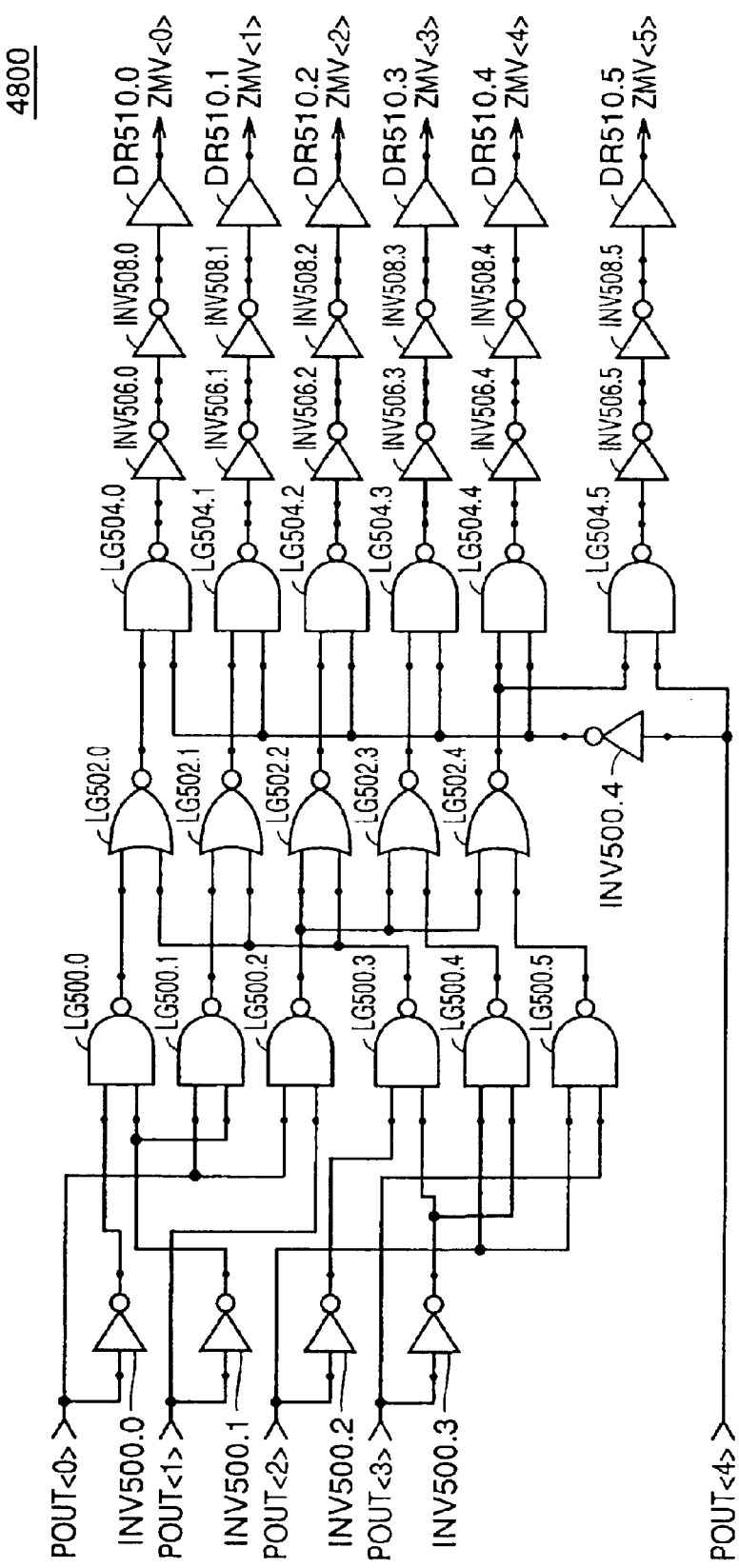
FIG. 31 is a circuit diagram showing a structure of a write sequence circuit 4800 of FIG. 25.

FIG. 31 is a circuit diagram showing a structure of write sequence circuit 4800 of FIG. 25.

Write sequence circuit 4800 receives inverters INV500.0–INV500.4 receiving signals POUT<0>–POUT<4> from write history retain circuit 4600, a NAND circuit LG500.0 receiving the outputs of inverters INV500.0 and INV500.1, a NAND circuit LG500.1 receiving signal POUT<0> and the output of inverter INV500.1, a NAND circuit LG500.2 receiving signal POUT<0> and signal POUT<1>, a NAND circuit LG500.3 receiving the outputs of inverters INV500.2 and INV500.3, a NAND circuit LG500.4 receiving signal POUT<2> and the output of inverter INV500.3, a NAND circuit LG500.5 receiving signals POUT<3> and POUT<2>, a NOR circuit LG502.0 receiving the outputs of NAND circuits LG500.0 and LG500.3, a NAND circuit LG502.1 receiving the outputs of NAND circuit LG500.1 and LG500.3, a NOR circuit LG502.2 receiving the outputs of NAND circuit LG500.2 and LG500.3, a NOR circuit LG502.3 receiving the outputs of NAND circuits LG500.2 and LG500.4, and a NOR circuit LG502.4 receiving the outputs of NAND circuits LG500.2 and LG500.5.

Write sequence circuit 4800 further includes a NAND circuit LG504.0 receiving the output of NOR circuit LG502.0 and the output of inverter INV500.4, an inverter INV50G.0 receiving the output of NAND circuit LG504.0, an inverter INV508.0 receiving the output of inverter INV506.0, and a drive circuit DR510.0 receiving the output of inverter INV508.0 to output a signal ZMV<0>.

Write sequence circuit 4800 also includes a NAND circuit LG504.1 receiving the outputs of NOR circuit LG502.1 and inverter INV500.4, an inverter INV506.1 receiving the output of NAND circuit LG504.1, an inverter INV508.1 receiving the output of inverter INV506.1, and a drive circuit DR510.1 receiving the output of inverter INV508.1 to output a signal ZMV<1>.

Write sequence circuit 4800 further includes a NAND circuit LG504.2 receiving the outputs of NOR circuit LG502.2 and inverter INV500.4, an inverter INV506.2 receiving the output of NAND circuit LG504.2, an inverter INV508.2 receiving the output of inverter INV506.2, and a drive circuit DR510.2 receiving the output of inverter INV508.2 to output a signal ZMV<2>.

Write sequence circuit 4800 further includes a NAND circuit LG504.3 receiving the outputs of NOR circuit LG502.3 and inverter INV500.4, an inverter INV506.3 receiving the output of NAND circuit LG504.3, an inverter INV508.3 receiving the output of inverter INV506.3, and a drive circuit DR510.3 receiving the output of inverter INV508.3 to output a signal ZMV<3>.

Write sequence circuit 4800 further includes a NAND circuit LG504.4 receiving the outputs of NOR circuit LG502.4 and inverter INV500.4, an inverter INV506.4 receiving the output of NAND circuit LG504.4, an inverter INV508.4 receiving the output of inverter INV506.4, and a drive circuit DR510.4 receiving the output of inverter INV508.4 to output a signal ZMV<4>.

Write sequence circuit 4800 further includes a NAND circuit LG504.5 receiving the output of NOR circuit LG502.4 and signal POUT<4>, an inverter INV506.5 receiving the output of NAND circuit LG504.5, an inverter INV508.5 receiving the output of inverter INV506.5, and a drive circuit DR510.5 receiving the output of inverter INV508.5 to output a signal ZMV<5>.

Figure 32:
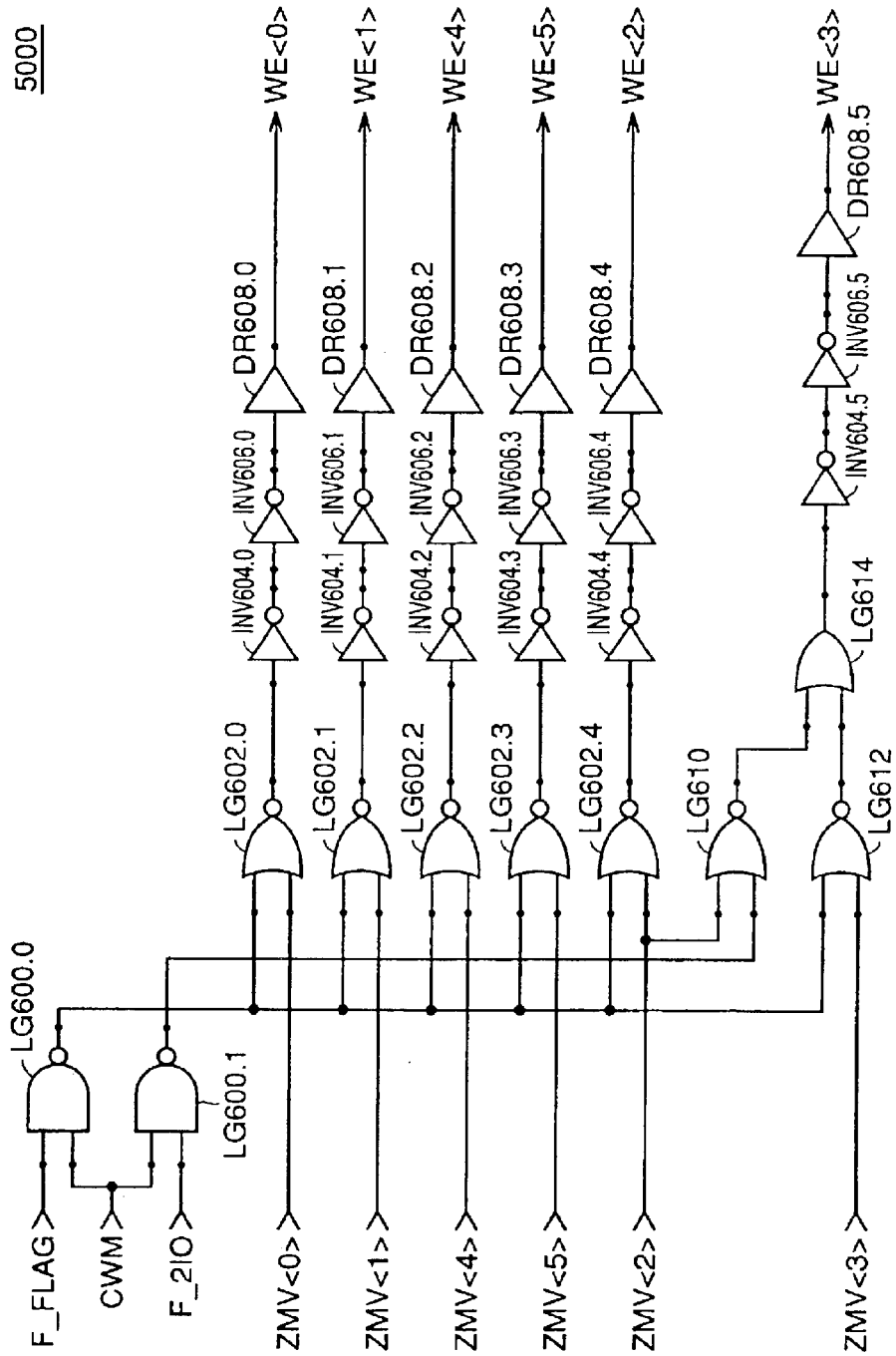
FIG. 32 is a schematic block diagram showing a structure of a write enable signal generation circuit 5000 of FIG. 25.

FIG. 32 is a schematic block diagram showing a structure of write enable signal generation circuit 5000 of FIG. 25.

Write enable signal generation circuit 5000 includes a NAND circuit LG600.0 receiving a flag signal F_FLAG from mode generation circuit 4200 and signal CWM from determination circuit 4400, a NAND circuit LG600.1 receiving flag signal F_2IO from mode generation circuit 4200 and signal CWM, a NOR circuit LG602.0 receiving the output of NAND circuit LG600.0 and signal ZMV<0>, an inverter INV604.0 receiving and inverting the output of NOR circuit 602.0, an inverter INV606.0 receiving and inverting the output of inverter INV604.0, and a drive circuit DR608.0 receiving the output of inverter INV606.0 to output a signal WE<0> designating a writing operation to an associated memory cell array CAM_ARY of the row address that is to be first replaced out of the redundant rows.

Write enable signal generation circuit 5000 further includes a NOR circuit LG602.1 receiving the output of NAND circuit LG600.0 and signal ZMV<1>, an inverter INV604.1 receiving and inverting the output of NOR circuit 602.1, an inverter INV606.1 receiving and inverting the output of the inverter INV604.1, and a drive circuit DR608.1 receiving the output of inverter INV606.1 to output a signal WE<1> to designate a write operation to an associated memory cell array CAM_ARY of the row address that is to be replaced corresponding to the second replacement out of the redundant rows.

Write enable signal generation circuit 5000 further includes a NOR circuit LG602.2 receiving the output of NAND circuit LG600.0 and signal ZMV<4>, an inverter INV604.2 receiving and inverting the output of NOR circuit 602.2, an inverter INV606.2 receiving and inverting the output of inverter INV604.2, and a drive circuit DR608.2 receiving the output of inverter INV606.2 to output a signal WE<4> to designate a write operation to associated memory cell array CAM_ARY of the row address that is to be replaced corresponding to the third replacement out of the redundant rows.

Write enable signal generation circuit 5000 further includes a NOR circuit LG602.3 receiving the output of NAND circuit LG600.0 and signal ZMV<5>, an inverter INV604.3 receiving and inverting the output of NOR circuit 602.3, an inverter INV606.3 receiving and inverting the output of the inverter INV604.3, and a drive circuit DR608.3 receiving the output of inverter INV606.3 to output a signal WE<5> to designate the presence of a defective row to be replaced, exceeding the combination of the corresponding replacement sequence.

Write enable signal generation circuit 5000 further includes a NOR circuit LG602.4 receiving the output of NAND circuit LG600.0 and signal ZMV<2>, an inverter INV604.4 receiving and inverting the output of NOR circuit 602.4, an inverter INV606.4 receiving and inverting the output of inverter INV604.4, and a drive circuit DR608.4 receiving the output of inverter INV606.4 to output a signal WE<2> to designate a write operation to associated memory cell array CAM_ARY of the column address that is to be replaced with a redundant column.

Write enable signal generation circuit 5000 further includes a NOR circuit LG610 receiving the output of NAND circuit LG600.1 and signal ZMV<2>, a NOR circuit LG612 receiving signal ZMV<3> and the output of NAND circuit LG600.0, an OR circuit LG614 receiving the outputs of NOR circuits LG610 and LG612, an inverter INV604.5 receiving and inverting the output of OR circuit LG614, an inverter INV606.5 receiving and inverting the output of inverter INV604.5, and a drive circuit DR608.5 receiving the output of inverter INV606.5 providing a write enable signal WE<3> to designate storage of a defective row address in the next sequence, following write enable signal WE<2> to store a defective column address, rendered active when the address of the defective memory cell to be stored next is a column address according to the replacement sequence.

Figure 33:
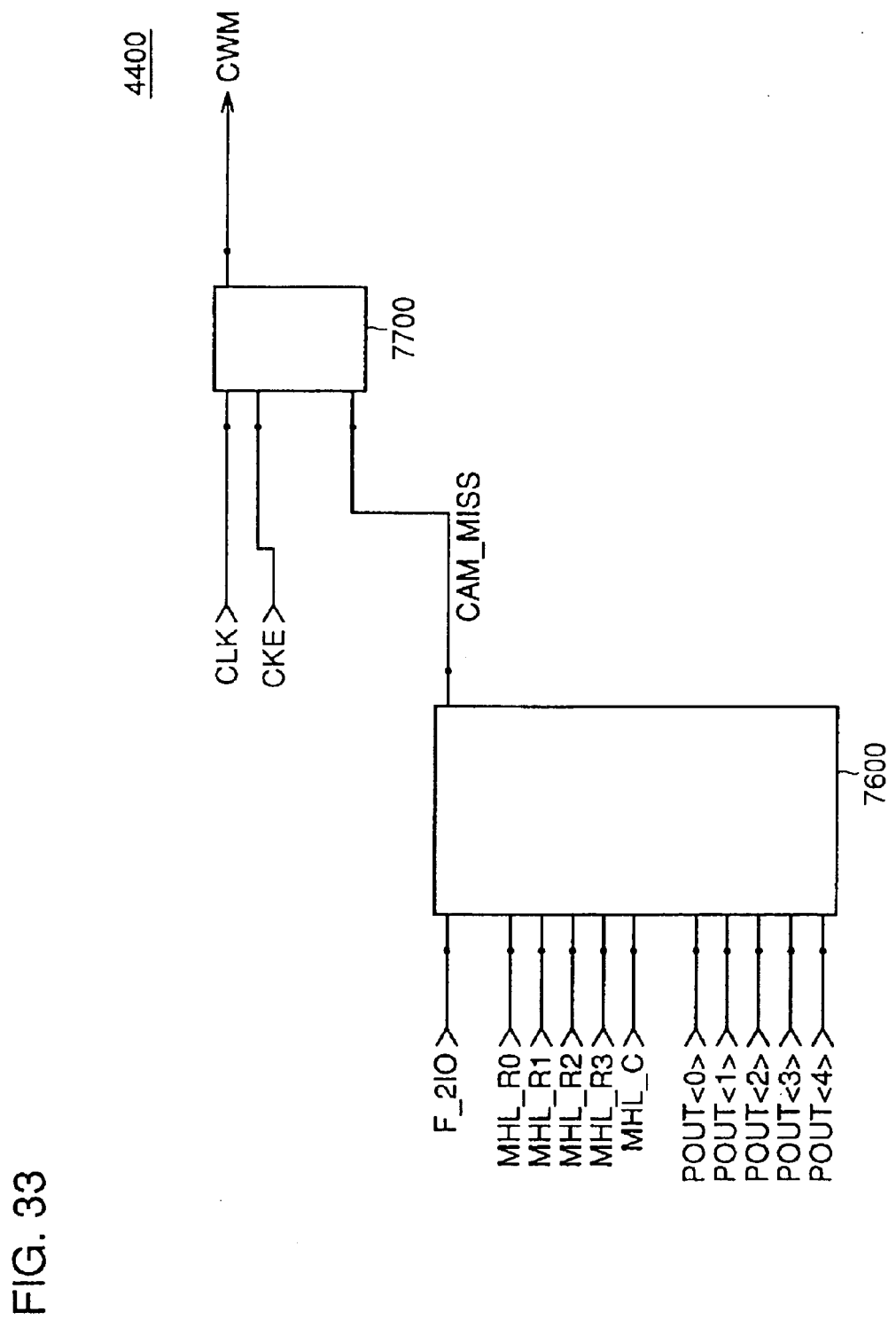
FIG. 33 is a schematic block diagram to describe a structure of a determination circuit 4400.

FIG. 33 is a schematic block diagram to describe a structure of a determination circuit 4400.

Determination circuit 4400 includes a determination unit 7600 receiving match detection signals MHL_R0–3 and MHL_C from associated memory cell array CAM_ARY, flag signal F_2IO, and signals POUT<0>–POUT<4> from write history retain circuit 4600 to output a mismatch determination signal CAM_MISS, and an output unit 770 receiving output from determination unit 7600 to output a signal CWM according to signals CLK and CKE from control circuit 7020.

Figure 34:
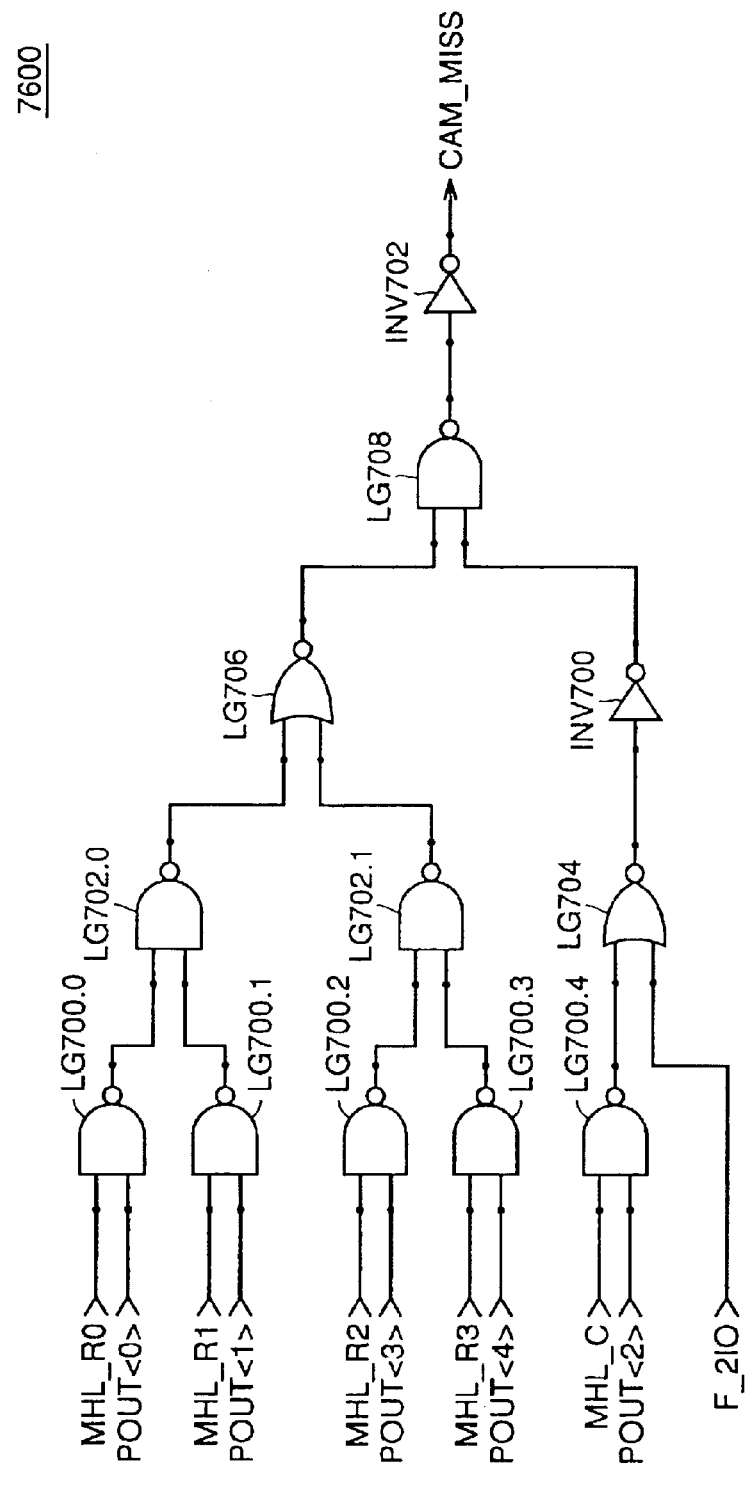
FIG. 34 is a circuit diagram showing a structure of a determination unit 7600 of FIG. 33.

FIG. 34 is a circuit diagram showing a structure of determination unit 7600 of FIG. 33.

Determination unit 7600 includes a NAND circuit LG700.0 receiving a signal POUT<0> from write history retain circuit 4600 corresponding to a write enable signal to activate the writing of a defective row address that is to be stored first, for example signal WE<0> in FIG. 13, and also match determination signal MHL_R0 from associated memory cell array CAM_ARY, a NAND circuit LG700.1 receiving signals POUT<0> and MHL_R1, a NAND circuit LG700.2 receiving signals POUT<3> and MHL_R2, a NAND circuit LG700.3 receiving signal POUT<4> and signal MHL_R3, a NAND circuit LG700.4 receiving signal POUT<2> and signal MHL_C, a NAND circuit LG702.0 receiving the outputs of NAND circuits LG700.0 and LG700.1, a NAND circuit LG702.1 receiving the outputs of NAND circuits LG700.3 and LG700.4, a NOR circuit LG704 receiving the output of NAND circuit LG700.4 and flag signal F_2IO, a NOR circuit LG706 receiving the outputs of NAND circuits LG702.0 and LG702.1, an inverter INV700 receiving the output of NOR circuit LG704, a NAND circuit LG708 receiving the outputs of NOR circuit LG706 and inverter INV700, and an inverter INV702 receiving and inverting the output of NAND circuit LG708 to output a signal CAM_MISS.

Figure 35:
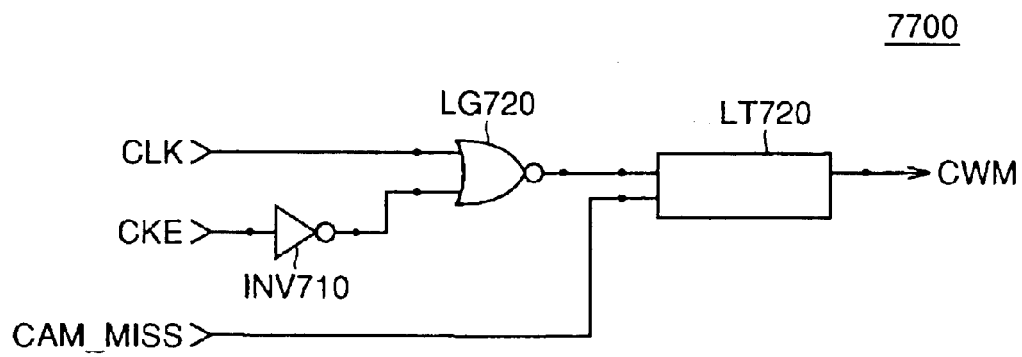
FIG. 35 is a schematic block diagram showing a structure of an output unit 7700 of FIG. 33.

FIG. 35 is a schematic block diagram showing a structure of output unit 7700 of FIG. 33.

Output unit 7700 includes an inverter INV710 receiving signal CKE from control circuit 7020, a NOR circuit LG720 receiving the output of inverter INV710 and signal CLK from control circuit 7020, and a latch circuit LT720 receiving the output from determination unit 7600 to output a signal CWM in response to activation of the output level of NAND circuit LG720.

Figure 36:
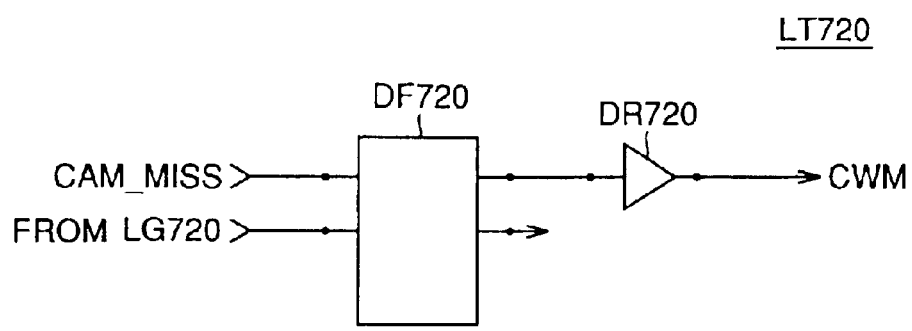
FIG. 36 is a schematic block diagram showing a structure of a latch circuit LT720.

FIG. 36 is a schematic block diagram showing a structure of latch circuit LT720 of FIG. 35.

Latch circuit LT720 includes a D flip flop circuit DF720 receiving the output of NOR circuit LG720 as a clock signal and output signal CAM_MISS from determination unit 7600 to output the signal at the timing of the clock signal, and a drive circuit DR720 receiving the output of D flip flop circuit DF720 to output a signal CWM.

By the above structure, detection and redundancy analysis of a defective memory cell can be carried out by a relatively small circuit complexity when a plurality of memory cells are selected simultaneously for each sub memory cell array. A tester circuit having such a redundancy analysis feature can be incorporated in the semiconductor integrated circuit device per se.

Second Embodiment

Figure 37:
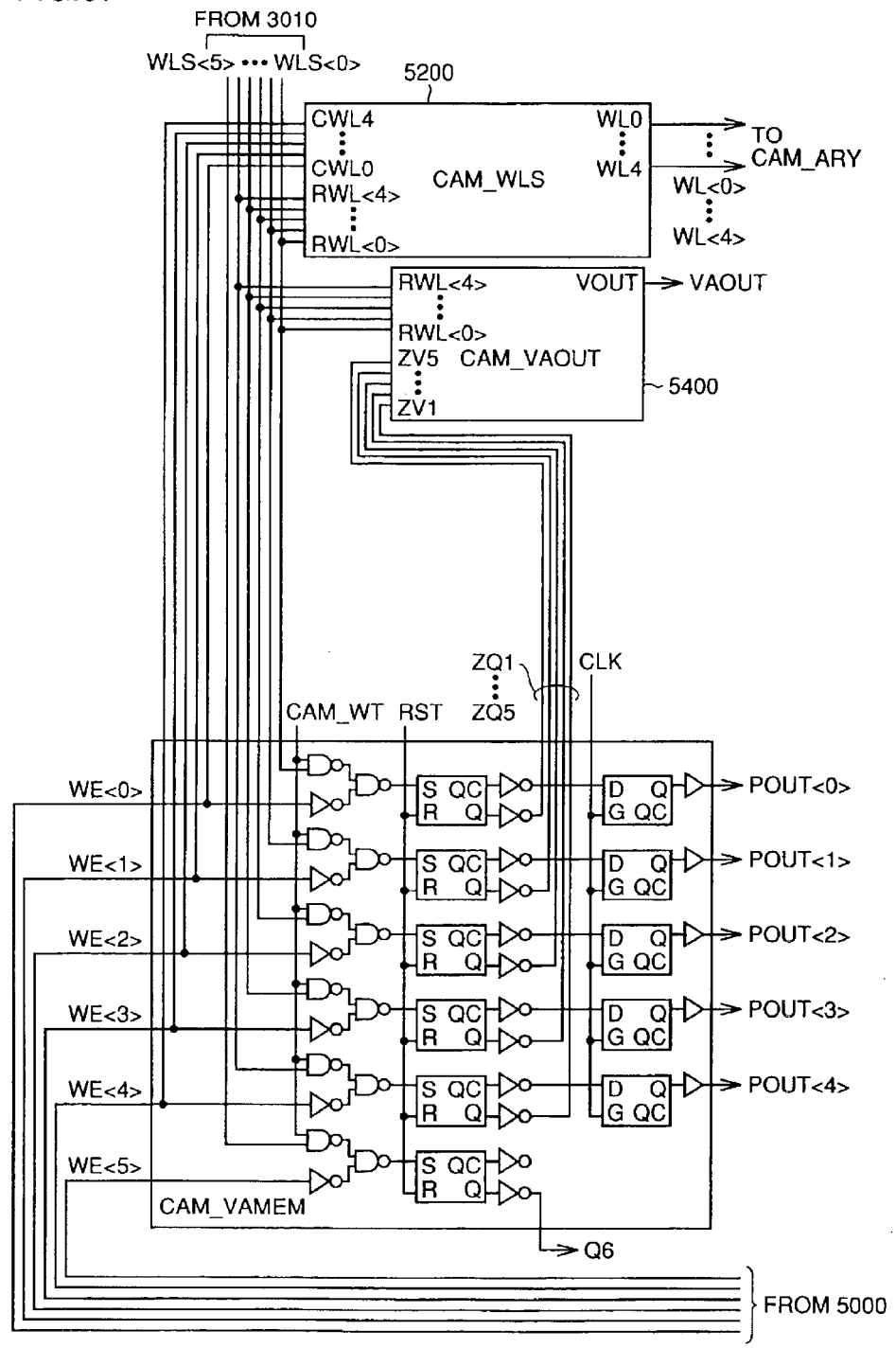
FIGS. 37 and 38 are first and second schematic block diagrams, respectively, to describe a structure of a tester circuit in a semiconductor memory device 1000 according to a second embodiment of the present invention.
Figure 38:
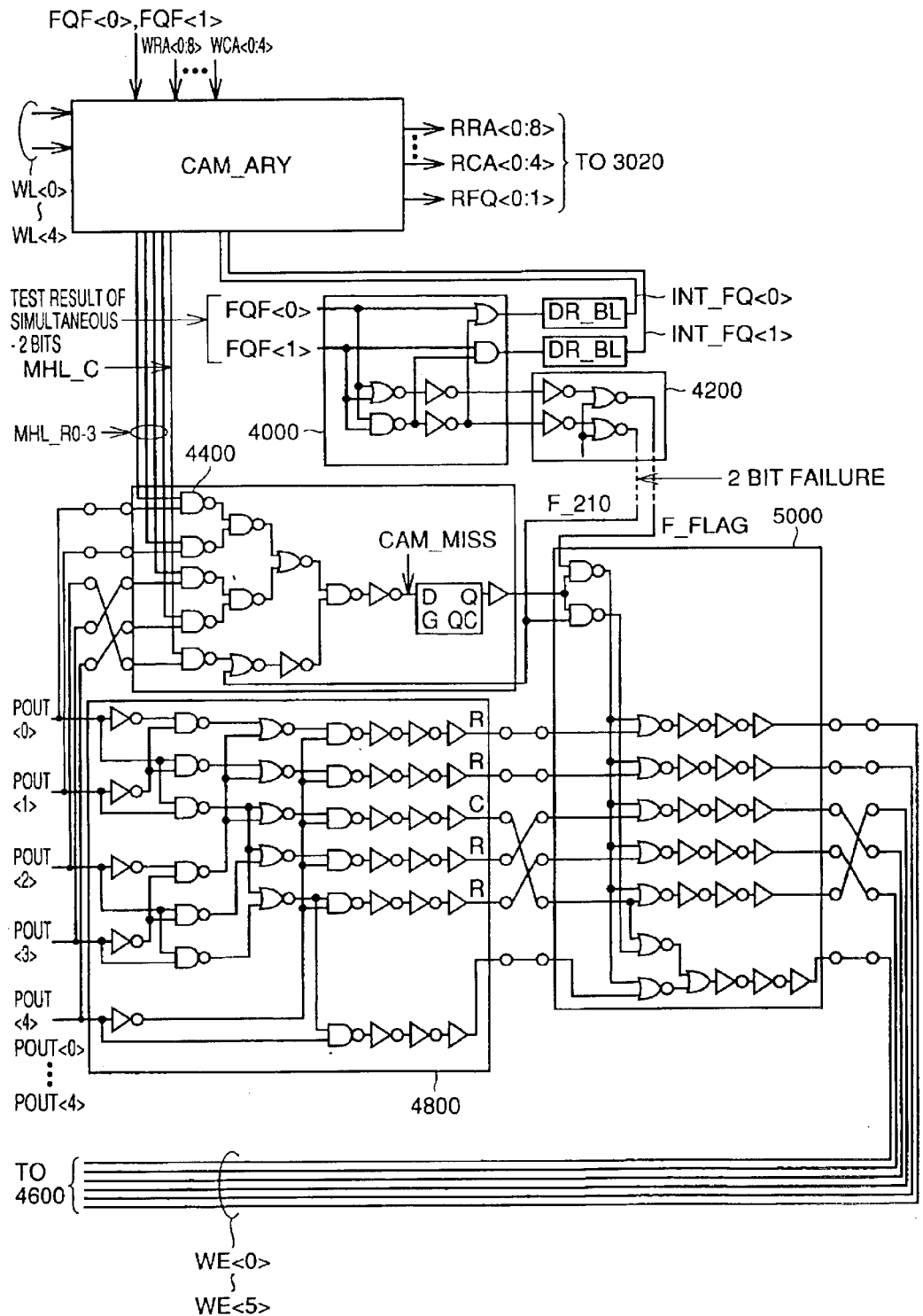

FIGS. 37 and 38 are schematic block diagrams to describe a structure of a tester circuit in a semiconductor memory device 1000 according to a second embodiment of the present invention, and are comparable with the structure of the BIST circuit of the first embodiment shown in FIGS. 13 and 14, respectively. Components corresponding to those of the first embodiment of the same reference characters allotted, and description thereof will not be repeated.

As described before, there are one redundant column and four redundant rows to repair a defective memory cell in the present invention.

Therefore, the previous first embodiment has a structure in which the column address and also the row address of the detected defective memory cell are stored simultaneously when failure of two bits are detected in the case where the address to be stored next is, for example, a defective column address.

However, the 2-bit simultaneous failure is completely remediable by carrying out replacement with a redundant row as to the replacement sequence corresponding to replacement of the redundant row at the time point where the 2-bit simultaneous failure is detected out of the five replacement sequences.

Therefore, the connection of write sequence circuit 4800 and write enable signal generation circuit 5000 is modified in the second embodiment, as shown in FIGS. 37 and 38. If 2-bit simultaneous failure is detected in the case where a column address is to be stored at the detection of the next failure, the repair disable flag is set (H level) with write enable signal WE<5> representing repair disable at an H level together with write enable signal WE<2>, for example.

Since this flag signal is not reset other than by reset signal RST, the repair disable result is maintained irrespective of the subsequent operation.

It is possible to omit this replacement sequence "RRCRR" from the redundancy repair candidates by referring to this flag. Thus, the redundancy analysis process can be simplified.

The present invention is not limited to the above-described case in which replacement of a redundant column has precedence over a redundant row in replacing a plurality of defective memory cells read out simultaneously in the sequence of carrying out replacement with a redundant column. Replacement of a redundant row may be given precedence over a redundant column in replacing a plurality of defective memory cells read out simultaneously in the order of carrying out replacement with a redundant row.

Furthermore, the present invention is not limited to the above-described case in which data of 2 bits are read out simultaneously from a sub memory cell array. The present invention is applicable to the case where data of more bits can be read out simultaneously from the sub memory cell array. More specifically, when there are a plurality of defective memory cells out of a plurality of memory cells selected simultaneously in a sub memory cell array, the sequence of a redundant row and a redundant column used for replacement of the plurality of defective memory cells is defined in advance, wherein determination is made of a defect at that defined sequence for each of these defective memory cells. According to such a procedure, redundancy analysis similar to the above-described embodiment can be carried out even in the case where data of more bits are read out simultaneously from the sub memory cell array.

By providing a tester circuit similar to the BIST circuit of the present invention in an external tester instead of in the semiconductor integrated circuit device, a semiconductor memory device that reads out simultaneously data of more bits from a sub memory cell array or a semiconductor integrated circuit device incorporating such a semiconductor memory device can be tested by the external tester.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    a memory cell array having a plurality of memory cells arranged in a matrix, each retaining stored data, said memory cell array being divided into a plurality of sub memory cell arrays,
    each said sub memory cell array including
    a normal memory cell array including a plurality of nonnal memory cells, and
    a spare memory cell array including a plurality of spare memory cells;
    a memory cell select circuit to select a plurality of said memory cells at once for each said sub memory cell array according to an address signal;

a data transmission circuit to transfer data with respect to a selected said memory cell; and a plurality of tester circuits provided for each said sub memory cell array, detecting a defective memory cell in said normal memory cell array and determining which said spare memory cell is to be used for replacement, each said tester circuit including a defective address detection circuit controlling said memory cell select circuit to sequentially select said memory cell while writing test data in a test write operation, and detecting a defective address corresponding to a defective memory cell according to a comparison result between data read out from said memory cell and expected value data in a test readout operation, an address storage circuit to store said defective address, and a determination circuit determining which of said spare memory cell is to be used for replacement according to said defective address retained in said address storage circuit, said address storage circuit selectively storing a defective address differing from a defective address already stored out of sequentially detected defective addresses under control of said determination circuit.

2. The semiconductor integrated circuit device according to claim 1, further comprising a signal generation circuit generating said address signal to sequentially select said memory cell, and generating test data to be written into a selected memory cell in a test write operation, and generating expected value data to be read out from said memory cell in a test readout operation, wherein said defective address detection circuit comprises a comparison circuit comparing stored data from said selected memory cell and said expected value data.

3. The semiconductor integrated circuit device according to claim 1, wherein said address storage circuit comprises a defective row address storage circuit storing a row address out of said defective address, and a defective column address storage circuit storing a column address out of said defective address, wherein said address storage circuit selectively stores a defective address differing in both row and column addresses from a defective row address and defective column address already stored out of sequentially detected defective addresses under control of said determination circuit.

4. The semiconductor integrated circuit device according to claim 1, wherein said spare memory cell arrays comprises m (m: natural number) spare memory cell rows, and n (n: natural number) spare memory cell columns, wherein said address storage circuit comprises a defective row address storage circuit storing a row address out of said defective addresses, and a defective column address storage circuit storing a column address out of said defective addresses, wherein each said determination circuit comprises a plurality of replacement determination units provided corresponding to each of a plurality of combinations of sequences allowed to sequentially replace a normal memory cell row or normal memory cell column including said defective memory cell with m spare memory cell rows and said n spare memory cell columns, wherein each said replacement determination unit renders active, when a defective memory cell is newly detected having a row address and column address both differing from said defective row address or said defective column address already stored, one of said defective row address storage circuit and said defective column address storage circuit to store a defective address corresponding to said newly detected defective memory cell according to a corresponding replacement sequence.

5. The semiconductor integrated circuit device according to claim 4, wherein said spare memory cell array comprises at least one spare memory cell row and at least one spare memory cell column, wherein said determination circuit stores in said address storage circuit a defective address to be replaced with a spare memory cell row and a defective address to be replaced with a spare memory cell column according to a predetermined priority when a plurality of memory cells are defective among said plurality of memory cells selected at one time.

6. The semiconductor integrated circuit device according to claim 4, wherein said memory cell select circuit comprises a plurality of row select circuits provided for each said sub memory cell array to select a row of said sub memory cell array according to said address signal, and a plurality of column select circuits provided for each said sub memory cell array to select at one time a plurality of columns in said sub memory cell array according to said address signal, wherein each said replacement determination unit comprises a replacement sequence circuit to designate which of said defective row address storage circuit and said defective column address storage circuit is to be rendered active according to said corresponding replacement sequence, a replacement sequence modify circuit advancing a subject of activation designated by said replacement sequence circuit up to a replacement step with respect to a row in said corresponding replacement sequence, and also rendering said defective row address storage circuit active when said defective column address storage circuit is rendered active to store a defective address corresponding to said newly detected defective memory cell in a case where a plurality of memory cells are defective out of said plurality of memory cells selected at one time, and a repair determination circuit to sense that repair of a detected defective memory cell is allowed before said step of a corresponding replacement sequence is completed.

7. The semiconductor integrated circuit device according to claim 6, wherein said defective row address storage circuit comprises m storage cell trains provided corresponding to said plurality of replacement determination units, respectively, to store m defective row addresses out of said defective addresses, wherein said defective column address storage circuit comprises n storage cell trains provided corresponding to said plurality of replacement determination units, respectively, to store n defective column addresses out of said defective addresses, wherein each of said m storage cell trains includes a plurality of first comparison storage cells receiving each bit data of a row address signal generated by said signal generation circuit and comparing with bit data already stored, a first match detection line transmitting a comparison result of said first comparison storage cell, and a first write select line to designate writing of said bit data to said first comparison storage cell, wherein each of said n storage cell trains includes a plurality of second comparison storage cells receiving each bit data of a column address signal generated by said signal generation circuit and comparing with bit data already stored, a second match detection line transmitting a comparison result of said second comparison storage cell, and a second write select line to designate writing of said bit data to said second comparison storage cell, wherein said replacement determination unit selectively renders active said first and second write select lines according to a sequence of said corresponding step based on a comparison result transmitted by said first and second match detection lines.

8. The semiconductor integrated circuit device according to claim 7, wherein said bit data of said address signal is applied to said first and second comparison storage cells as a complementary signal, wherein each said storage cell train includes a precharge circuit precharging a level of a corresponding match detection line, wherein each of said first and second comparison storage cells comprises a storage element having first and second input nodes to complementarily store corresponding bit data, a first access transistor coupling a first input node of said storage element and one of said complementary signals according to activation of a corresponding one of said first and second write select lines, a second access transistor coupling a second input node of said storage element and the other of said complementary signals according to activation of said corresponding one of said first and second write select lines, a first discharge circuit discharging said corresponding match detection line according to potential levels of one of said complementary signals and said second input node, and a second discharge circuit discharging said corresponding match detection line according to potential levels of the other of said complementary signals and said first input node.

9. The semiconductor integrated circuit device according to claim 4, wherein said memory cell select circuit selects at one time a plurality of memory cells belonging to a selected memory cell row for each said sub memory cell array, wherein said spare memory cell array includes at least one spare memory row and at least one spare memory cell column, wherein each said replacement determination unit determines that replacement of said defective memory cell is not possible when corresponding to a step of replacement with said spare memory cell column by a predetermined priority in a case where there are a plurality of defective memory cells out of said plurality of memory cells selected at one time.

10. The semiconductor integrated circuit device according to claim 4, wherein said memory cell select circuitincludes a plurality of row select circuits provided for each said sub memory cell array to select a row in said sub memory cell array according to said address signal, and a plurality of column select circuits provided for each said sub memory cell array to select a plurality of columns of said sub memory cell array at one time according to said address signal, wherein each said replacement determination unit comprises a replacement sequence circuit designating which of said defective row address storage circuit and said defective column address storage circuit is to be rendered active according to said corresponding replacement sequence, and a repair determination circuit determining that said defective memory cell cannot be repaired when said defective column address storage circuit is to be rendered active in order to store a defective address corresponding to said newly detected defective memory cell when there are a plurality of defective memory cells out of said plurality of memory cells selected at one time.

* * * * *